United States Patent
Hiroki et al.

(10) Patent No.: US 7,671,827 B2
(45) Date of Patent: *Mar. 2, 2010

(54) ELECTRO-OPTICAL DEVICE

(75) Inventors: Masaaki Hiroki, Isehara (JP); Akira Mase, Okazaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 857 days.

This patent is subject to a terminal disclaimer.

(21) Appl. No.: 10/844,393

(22) Filed: May 13, 2004

(65) Prior Publication Data

US 2004/0207777 A1   Oct. 21, 2004

Related U.S. Application Data

(60) Division of application No. 09/961,055, filed on Sep. 24, 2001, which is a division of application No. 08/943,333, filed on Oct. 3, 1997, now abandoned, which is a division of application No. 08/372,899, filed on Jan. 17, 1995, now Pat. No. 7,479,939, which is a continuation of application No. 07/993,391, filed on Dec. 18, 1992, now abandoned, which is a division of application No. 07/837,394, filed on Feb. 18, 1992, now Pat. No. 5,200,846.

(30) Foreign Application Priority Data

| Feb. 16, 1991 | (JP) | .............................. 03-077317 |
| Feb. 16, 1991 | (JP) | .............................. 03-077320 |
| Feb. 16, 1991 | (JP) | .............................. 03-077321 |
| Mar. 27, 1991 | (JP) | .............................. 03-087776 |
| Mar. 27, 1991 | (JP) | .............................. 03-089540 |

(51) Int. Cl.
    *G09G 3/36* (2006.01)
(52) U.S. Cl. .......................... 345/87; 345/89; 345/213; 345/690; 345/691
(58) Field of Classification Search ........... 345/87–103, 345/204–215, 690–699; 349/43, 42, 122, 349/106, 138, 47–48, 143; 257/59, 72, 350; 348/790–791, 793
See application file for complete search history.

(56) References Cited

U.S. PATENT DOCUMENTS 3,798,752 A   3/1974   Fujimoto (Continued)

FOREIGN PATENT DOCUMENTS

EP   0 161 555   11/1985

(Continued)

OTHER PUBLICATIONS

IBM Technical Bulletin, XP000108914, "Driving Method for TFT/LCD Grayscale," pp. 384-385, Nov. 1990, New York, vol. 33, No. 6B.

(Continued)

*Primary Examiner*—Vijay Shankar
(74) *Attorney, Agent, or Firm*—Eric J. Robinson; Robinson Intellectual Property Law Office, P.C.

(57) ABSTRACT

An electro-optical device comprising a display drive system with the display timing related to the unit time t for writing-in a picture element and to the time F for writing-in one picture is disclosed. In the device, a gradated display corresponding to the ratio of the division can be obtained by time-sharing the signal during a write-in of time t without changing the time F.

16 Claims, 45 Drawing Sheets

U.S. PATENT DOCUMENTS

| | | | |
|---|---|---|---|
| 3,838,209 A | 9/1974 | Tsuchiya et al. | |
| 3,955,187 A | 5/1976 | Bigelow | |
| 4,007,294 A | 2/1977 | Woods et al. | |
| 4,021,607 A | 5/1977 | Amano | |
| 4,068,020 A | 1/1978 | Reuschel | |
| 4,103,297 A | 7/1978 | McGreivy et al. | |
| 4,239,346 A | 12/1980 | Lloyd | |
| 4,365,013 A | 12/1982 | Ishioka | |
| 4,378,417 A | 3/1983 | Maruyama et al. | |
| 4,420,870 A | 12/1983 | Kimura | |
| 4,427,978 A | 1/1984 | Williams | |
| 4,466,172 A | 8/1984 | Batra | |
| 4,468,855 A | 9/1984 | Sasaki | |
| 4,470,060 A | 9/1984 | Yamazaki | |
| 4,487,481 A * | 12/1984 | Suzawa | 349/67 |
| 4,528,480 A | 7/1985 | Unagami | |
| 4,581,620 A * | 4/1986 | Yamazaki et al. | 257/53 |
| 4,591,892 A | 5/1986 | Yamazaki | |
| 4,597,160 A | 7/1986 | Ipri | |
| 4,597,637 A | 7/1986 | Ohta | |
| 4,600,274 A | 7/1986 | Morozumi | |
| 4,646,426 A | 3/1987 | Sasaki | |
| 4,648,691 A | 3/1987 | Oguchi et al. | |
| 4,649,432 A | 3/1987 | Watanabe et al. | |
| 4,650,543 A | 3/1987 | Kishita et al. | |
| 4,651,182 A | 3/1987 | Yamazaki | |
| 4,653,862 A | 3/1987 | Morozumi | |
| 4,660,030 A | 4/1987 | Maezawa | |
| 4,680,580 A | 7/1987 | Kawahara | |
| 4,682,407 A | 7/1987 | Wilson et al. | |
| 4,691,995 A | 9/1987 | Yamazaki et al. | |
| 4,704,002 A | 11/1987 | Kikuchi et al. | |
| 4,716,403 A | 12/1987 | Morozumi | |
| 4,727,044 A | 2/1988 | Yamazaki | |
| 4,740,481 A | 4/1988 | Wilson et al. | |
| 4,740,829 A | 4/1988 | Nakagiri et al. | |
| 4,742,346 A | 5/1988 | Gillette et al. | |
| 4,743,096 A | 5/1988 | Wakai et al. | |
| 4,748,510 A | 5/1988 | Umezawa | |
| 4,752,774 A | 6/1988 | Clerc et al. | |
| 4,755,865 A | 7/1988 | Wilson et al. | |
| 4,762,807 A | 8/1988 | Yamazaki | |
| 4,770,502 A | 9/1988 | Kitazima et al. | |
| 4,772,927 A | 9/1988 | Saito et al. | |
| 4,778,258 A | 10/1988 | Parks et al. | |
| 4,818,075 A | 4/1989 | Takao et al. | |
| 4,818,077 A | 4/1989 | Ohwada et al. | |
| 4,818,981 A | 4/1989 | Oki et al. | |
| 4,838,654 A | 6/1989 | Hamaguchi et al. | |
| 4,839,707 A | 6/1989 | Shields | |
| 4,841,294 A | 6/1989 | Clerc | |
| 4,860,069 A | 8/1989 | Yamazaki | |
| 4,862,237 A | 8/1989 | Morozumi | |
| 4,873,516 A | 10/1989 | Castleberry | |
| 4,888,305 A | 12/1989 | Yamazaki et al. | |
| 4,891,330 A | 1/1990 | Guha et al. | |
| 4,897,360 A | 1/1990 | Guckel et al. | |
| 4,897,639 A | 1/1990 | Kanayama | |
| 4,905,066 A | 2/1990 | Dohjo et al. | |
| 4,908,710 A * | 3/1990 | Wakai et al. | 348/793 |
| 4,916,090 A | 4/1990 | Motai et al. | |
| 4,917,471 A | 4/1990 | Takao et al. | |
| 4,924,279 A | 5/1990 | Shimbo | |
| 4,938,565 A | 7/1990 | Ichikawa | |
| 4,943,837 A | 7/1990 | Konishi et al. | |
| 4,949,141 A | 8/1990 | Busta | |
| 4,959,700 A * | 9/1990 | Yamazaki | 257/61 |
| 4,960,719 A | 10/1990 | Tanaka et al. | |
| 4,969,025 A | 11/1990 | Yamamoto et al. | |
| 4,969,031 A | 11/1990 | Kobayashi et al. | |
| 4,973,135 A | 11/1990 | Okada et al. | |
| 4,986,213 A | 1/1991 | Yamazaki et al. | |
| 4,988,643 A | 1/1991 | Tsou | |
| 4,997,785 A | 3/1991 | Pfiester | |
| 5,003,356 A | 3/1991 | Wakai et al. | |
| 5,008,218 A | 4/1991 | Kawachi et al. | |
| 5,012,228 A | 4/1991 | Masuda et al. | |
| 5,016,610 A | 5/1991 | Meguro et al. | |
| 5,017,984 A | 5/1991 | Tanaka et al. | |
| 5,023,679 A | 6/1991 | Shibata | |
| 5,032,883 A | 7/1991 | Wakai et al. | |
| 5,042,920 A | 8/1991 | Yoshino et al. | |
| 5,051,570 A | 9/1991 | Tsujikawa et al. | |
| 5,054,887 A | 10/1991 | Kato et al. | |
| 5,055,899 A | 10/1991 | Wakai et al. | |
| 5,056,895 A | 10/1991 | Kahn | |
| 5,075,674 A | 12/1991 | Katayama et al. | |
| 5,077,223 A | 12/1991 | Yamazaki | |
| 5,083,190 A | 1/1992 | Pfiester | |
| 5,084,905 A | 1/1992 | Sasaki et al. | |
| 5,091,722 A | 2/1992 | Kitajima et al. | |
| 5,093,703 A | 3/1992 | Minami et al. | |
| RE33,882 E | 4/1992 | Morozumi | |
| 5,102,361 A | 4/1992 | Katayama et al. | |
| 5,119,204 A * | 6/1992 | Hashimoto et al. | 348/794 |
| 5,132,754 A | 7/1992 | Serikawa et al. | |
| 5,132,821 A | 7/1992 | Nicholas | |
| 5,142,272 A | 8/1992 | Kondo | |
| 5,142,344 A | 8/1992 | Yamazaki | |
| 5,153,142 A | 10/1992 | Hsieh | |
| 5,159,476 A | 10/1992 | Hayashi | |
| 5,159,477 A | 10/1992 | Shimada et al. | |
| 5,162,901 A | 11/1992 | Shimada et al. | |
| 5,164,805 A | 11/1992 | Lee | |
| 5,166,085 A | 11/1992 | Wakai et al. | |
| 5,166,816 A | 11/1992 | Kaneko et al. | |
| 5,181,132 A | 1/1993 | Shindo et al. | |
| 5,182,620 A * | 1/1993 | Shimada et al. | 257/72 |
| 5,194,136 A | 3/1993 | Jeung et al. | |
| 5,196,839 A | 3/1993 | Johary et al. | |
| 5,200,846 A | 4/1993 | Hiroki et al. | |
| 5,206,635 A | 4/1993 | Inuzuka et al. | |
| 5,235,195 A | 8/1993 | Tran et al. | |
| 5,245,452 A | 9/1993 | Nakamura et al. | |
| 5,250,818 A | 10/1993 | Saraswat et al. | |
| 5,250,931 A * | 10/1993 | Misawa et al. | 345/206 |
| 5,257,105 A * | 10/1993 | Tanaka et al. | 348/607 |
| 5,268,679 A | 12/1993 | Shannon | |
| 5,273,910 A | 12/1993 | Tran et al. | |
| 5,287,205 A | 2/1994 | Yamazaki et al. | |
| 5,289,030 A | 2/1994 | Yamazaki et al. | |
| 5,296,870 A | 3/1994 | Nicholas | |
| 5,300,944 A * | 4/1994 | Shapiro et al. | 345/88 |
| 5,302,845 A | 4/1994 | Kumagai et al. | |
| 5,306,651 A | 4/1994 | Masumo et al. | |
| 5,308,998 A | 5/1994 | Yamazaki et al. | |
| 5,313,075 A | 5/1994 | Zhang et al. | |
| 5,313,077 A | 5/1994 | Yamazaki | |
| 5,315,132 A | 5/1994 | Yamazaki et al. | |
| 5,327,001 A | 7/1994 | Wakai et al. | |
| 5,327,901 A | 7/1994 | Delente | |
| 5,329,390 A | 7/1994 | Fujiwara et al. | |
| 5,340,999 A | 8/1994 | Takeda et al. | |
| 5,341,012 A | 8/1994 | Misawa et al. | |
| 5,358,810 A | 10/1994 | Yoshino | |
| 5,372,958 A | 12/1994 | Miyasaka et al. | |
| 5,408,246 A | 4/1995 | Inaba et al. | |
| 5,414,443 A | 5/1995 | Kanatani et al. | |
| 5,495,353 A | 2/1996 | Yamazaki et al. | |
| 5,521,107 A | 5/1996 | Yamazaki et al. | |
| 5,523,240 A | 6/1996 | Zhang et al. | |
| 5,543,636 A | 8/1996 | Yamazaki | |
| 5,568,288 A | 10/1996 | Yamazaki et al. | |
| 5,572,345 A | 11/1996 | Yamazaki et al. | |

| | | | | | | |
|---|---|---|---|---|---|---|
| 5,591,987 | A | 1/1997 | Yamazaki et al. | JP | 58-118154 | 7/1983 |
| 5,612,799 | A | 3/1997 | Yamazaki et al. | JP | 58-118691 | 7/1983 |
| 5,614,730 | A | 3/1997 | Nakazawa et al. | JP | 58-142566 | 8/1983 |
| 5,744,818 | A | 4/1998 | Yamazaki et al. | JP | 58-164268 | 9/1983 |
| 5,854,879 | A | 12/1998 | Inuzuka et al. | JP | 58-186967 | 11/1983 |
| 5,899,547 | A | 5/1999 | Yamazaki et al. | JP | 58-192379 | 11/1983 |
| 5,905,555 | A | 5/1999 | Yamazaki et al. | JP | 59-021067 | 2/1984 |
| 5,933,205 | A | 8/1999 | Yamazaki et al. | JP | 59-061818 | 4/1984 |
| 5,946,059 | A | 8/1999 | Yamazaki et al. | JP | 59-141271 | 8/1984 |
| 5,956,105 | A | 9/1999 | Yamazaki et al. | JP | 59-211087 | 11/1984 |
| 5,963,278 | A | 10/1999 | Yamazaki et al. | JP | 60-047574 | 3/1985 |
| 5,998,841 | A | 12/1999 | Suzawa | JP | 60-154996 | 10/1985 |
| 6,011,277 | A | 1/2000 | Yamazaki | JP | 60-237403 | 11/1985 |
| 6,013,928 | A | 1/2000 | Yamazaki et al. | JP | 60-245173 | 12/1985 |
| 6,023,075 | A | 2/2000 | Yamazaki | JP | 60-245174 | 12/1985 |
| 6,067,062 | A | 5/2000 | Takasu et al. | JP | 60-247603 | 12/1985 |
| 6,235,563 | B1 | 5/2001 | Oka et al. | JP | 61-018755 | 5/1986 |
| 6,281,520 | B1 | 8/2001 | Yamazaki | JP | 61-136263 | 6/1986 |
| 6,436,815 | B1 | 8/2002 | Yamazaki et al. | JP | 61-141174 | 6/1986 |
| 6,437,367 | B1 | 8/2002 | Yamazaki et al. | JP | 62-031278 | 2/1987 |
| 6,566,711 | B1 | 5/2003 | Yamazaki et al. | JP | 62-073658 | 4/1987 |
| 6,607,947 | B1 | 8/2003 | Zhang et al. | JP | 62-073660 | 4/1987 |
| 6,737,676 | B2 | 5/2004 | Yamazaki | JP | 62-105474 | 5/1987 |
| 6,778,231 | B1 * | 8/2004 | Yamazaki et al. ............. 349/43 | JP | 62-126677 | 6/1987 |
| 6,838,698 | B1 | 1/2005 | Yamazaki et al. | JP | 62-131575 | 6/1987 |
| 7,067,844 | B2 | 6/2006 | Yamazaki | JP | 62-142480 | 6/1987 |
| 7,098,479 | B1 | 8/2006 | Yamazaki | JP | 62-193277 | 8/1987 |
| 7,115,902 | B1 * | 10/2006 | Yamazaki .................... 257/59 | JP | 62-210422 | 9/1987 |
| 7,154,147 | B1 | 12/2006 | Yamazaki et al. | JP | 62-214669 | 9/1987 |
| 7,253,437 | B2 | 8/2007 | Yamazaki et al. | JP | 62-219574 | 9/1987 |
| 7,420,628 | B1 | 9/2008 | Hiroki et al. | JP | 62-226192 | 10/1987 |
| 7,423,290 | B2 | 9/2008 | Yamazaki et al. | JP | 62-247330 | 10/1987 |
| 7,479,939 | B1 | 1/2009 | Hiroki et al. | JP | 62-283664 | 12/1987 |
| 7,489,367 | B1 | 2/2009 | Yamazaki et al. | JP | 63-009978 | 1/1988 |
| 2002/0033906 | A1 | 3/2002 | Hiroki et al. | JP | 63-066969 | 3/1988 |
| 2005/0001965 | A1 | 1/2005 | Hiroki et al. | JP | 63-070832 | 3/1988 |
| 2005/0007329 | A1 | 1/2005 | Hiroki et al. | JP | 63-082177 | 4/1988 |
| 2006/0151792 | A1 | 7/2006 | Yamazaki et al. | JP | 63-096636 | 4/1988 |
| 2007/0252149 | A1 | 11/2007 | Yamazaki et al. | JP | 63-100777 | 5/1988 |
| 2009/0021663 | A1 | 1/2009 | Hiroki et al. | JP | 63-101829 | 5/1988 |
| | | | | JP | 63-119578 | 5/1988 |
| | | FOREIGN PATENT DOCUMENTS | | JP | 63-126277 | 5/1988 |
| | | | | JP | 63-170692 | 7/1988 |
| EP | | 0 271 960 | 6/1988 | JP | 63-178560 | 7/1988 |
| EP | | 0 318 224 | 5/1989 | JP | 63-219152 | 9/1988 |
| EP | | 0 321 073 | 6/1989 | JP | 63-237571 | 10/1988 |
| EP | | 0 349 415 | 1/1990 | JP | 63-279228 | 11/1988 |
| EP | | 0 412 701 | 2/1991 | JP | 63-283068 | 11/1988 |
| EP | | 0 459 763 | 12/1991 | JP | 64-012576 | 1/1989 |
| GB | | 1 396 486 | 6/1975 | JP | 64-018266 | 1/1989 |
| GB | | 2 130 781 | 6/1984 | JP | 64-030272 | 2/1989 |
| GB | | 2 187 859 | 9/1987 | JP | 64-035959 | 2/1989 |
| JP | | 49-052598 | 5/1974 | JP | 64-047076 | 2/1989 |
| JP | | 49-077537 | 7/1974 | JP | 01-068732 | 3/1989 |
| JP | | 49-078483 | 7/1974 | JP | 64-068724 | 3/1989 |
| JP | | 49-098964 | 9/1974 | JP | 64-068728 | 3/1989 |
| JP | | 52-076897 | 6/1977 | JP | 01-107237 | 4/1989 |
| JP | | 53-027483 | 3/1978 | JP | 64-089464 | 4/1989 |
| JP | | 53-144297 | 12/1978 | JP | 01-121802 | 5/1989 |
| JP | | 55-032026 | 3/1980 | JP | 01-130131 | 5/1989 |
| JP | | 55-154750 | 12/1980 | JP | 01-134342 | 5/1989 |
| JP | | 56-043679 | 4/1981 | JP | 01-156725 | 6/1989 |
| JP | | 56-069864 | 6/1981 | JP | 01-183845 | 7/1989 |
| JP | | 56-094386 | 7/1981 | JP | 01-183853 | 7/1989 |
| JP | | 57-109994 | 7/1982 | JP | 01-194351 | 8/1989 |
| JP | | 58-002073 | 1/1983 | JP | 01-241862 | 9/1989 |
| JP | | 58-023478 | 2/1983 | JP | 01-274117 | 11/1989 |
| JP | | 58-023479 | 2/1983 | JP | 01-289917 | 11/1989 |
| JP | | 58-027365 | 2/1983 | JP | 01-292315 | 11/1989 |
| JP | | 58-066477 | 4/1983 | JP | 02-002522 | 1/1990 |
| JP | | 58-105574 | 6/1983 | JP | 02-004093 | 1/1990 |
| JP | | 58-106861 | 6/1983 | JP | 02-016596 | 1/1990 |
| JP | | 58-115864 | 7/1983 | JP | 02-024604 | 1/1990 |

| | | |
|---|---|---|
| JP | 02-027320 | 1/1990 |
| JP | 02-044314 | 2/1990 |
| JP | 02-051129 | 2/1990 |
| JP | 02-079476 | 3/1990 |
| JP | 02-090683 | 3/1990 |
| JP | 02-103925 | 4/1990 |
| JP | 02-146878 | 6/1990 |
| JP | 02-158714 | 6/1990 |
| JP | 02-159730 | 6/1990 |
| JP | 02-165104 | 6/1990 |
| JP | 02-177679 | 7/1990 |
| JP | 02-188723 | 7/1990 |
| JP | 02-199498 | 8/1990 |
| JP | 02-201940 | 8/1990 |
| JP | 02-210330 | 8/1990 |
| JP | 02-211428 | 8/1990 |
| JP | 02-212818 | 8/1990 |
| JP | 02-228041 | 9/1990 |
| JP | 02-228042 | 9/1990 |
| JP | 02-234134 | 9/1990 |
| JP | 02-250357 | 10/1990 |
| JP | 02-278749 | 11/1990 |
| JP | 02-281291 | 11/1990 |
| JP | 02-282728 | 11/1990 |
| JP | 02-307273 | 12/1990 |
| JP | 02-309317 | 12/1990 |
| JP | 03-007911 | 1/1991 |
| JP | 03-012637 | 1/1991 |
| JP | 03-017629 | 1/1991 |
| JP | 03-024735 | 2/1991 |
| JP | 03-034434 | 2/1991 |
| JP | 03-036767 | 2/1991 |
| JP | 03-059543 | 3/1991 |
| JP | 03-109739 | 5/1991 |
| JP | 03-165575 | 7/1991 |
| JP | 03-180058 | 8/1991 |
| JP | 03-185839 | 8/1991 |
| JP | 03-217059 | 9/1991 |
| JP | 03-272183 | 12/1991 |
| JP | 03-288824 | 12/1991 |
| JP | 04-015956 | 1/1992 |
| JP | 04-268536 | 9/1992 |
| JP | 04-283729 | 10/1992 |
| JP | 04-291240 | 10/1992 |
| JP | 04-299864 | 10/1992 |
| JP | 04-360580 | 12/1992 |
| JP | 05-267667 | 10/1993 |
| JP | 06-032814 | 2/1994 |
| JP | 11-311805 | 11/1999 |

OTHER PUBLICATIONS

Wallmark et al., "Field-Effect Transistors Physics, Technology and Applications," p. 199, 1968, MOS Field-Effect Transistors Sec. 8-3.
Montgomery et al., XP000162922, "Improving Multiplexability of Polymer-Dispersed Liquid Crystal Films by Dual Frequency Addressing," pp. 67-74, Aug. 1990, Molecular Crystals and Liquid Crystals (Inc. Nonlinear Optics), vol. 185.
Millman et al., "Microelectronics," p. 143, 1988, McGraw-Hill Book Company, Second Edition.
Cobbold, "Theory and Applications of Field-Effect Transistors," p. 62, 1971, Field-Effect Transistors.
Wilmsen, "Chemical Composition and Formation of Thermal and Anodic Oxide/III-V Compound Semiconductor Interfaces," pp. 279-287, Sep.-Oct. 1981, J. Vacuum Society Technology, vol. 19, No. 3.
Inventor: Shunpei Yamazaki, et al., "Electro-Optical Device and Method of Driving the Same," Jan. 19, 1999, Specification and Drawings for U.S. Appl. No. 09/233,145.
Inventor: Hideomi Suzawa, "Semiconductor Device Including Active Matrix Circuit," Apr. 3, 2000, Specification and Drawings for Re-examination U.S. Appl. No. 90/005,692.
T. Yanagisawa et al., "An MOS Array with Platinum Display Electrodes for Reflective Dynamic Scattering LCDs," SID 81 Digest, pp. 110-111, 1981.
Y. Oana et al., "A 240×360 Element Active Matrix LCD with Integrated Gate-Bus Drivers Using Poly-Si TFTs," SID 84 Digest, pp. 312-315, Jan. 6, 1984.
Color Liquid Crystal Display, pp. 162-163, Dec. 14, 1990.
Flat Panel Display 1991, pp. 66-67, Jan. 1, 1991.
Flat Panel Display 1992, pp. 100-101, Nov. 19, 1992.
Tsumura et al., "High Resolution 10.3 Diagonal Multicolor TFT-LCD," SID 1991, pp. 215-218.
Bahadur, "Liquid Crystal Devices and Uses," vol. 1, World Scientific Press, 1990, pp. 178-180 and 421-423.
Non-Final Office Action (U.S. Appl. No. 10/844,347) dated Feb. 19, 2009.
Bahadur et al., Materials and Assembling Process of LCDs, Liquid Crystals Applications and Uses, vol. 1, 1990, pp. 171-177.
Specification, Original Claims, Abstract, and Drawings of U.S. Appl. No. 09/288,509 filed Apr. 8, 1999, now abandoned.
Specification, Original Claims, Abstract, Drawings and Pending Claims on Appeal as of Jul. 10, 2006 of U.S. Appl. No. 09/285,899 filed Apr. 8, 1999.
Specification, Original Claims, Abstract, Drawings and Pending Claims as of Jun. 26, 2006 of U.S. Appl. No. 09/300,596 filed Apr. 28, 1999.
Specification, Claims, Abstract, and Drawings of U.S. Appl. No. 09/316,198 filed May 21, 1999, now abandoned.
Pending Claims on Appeal as of Jan. 21, 2004 of U.S. Appl. No. 90/006,102 filed Aug. 29, 2001 (Reexamination of U.S. Patent 5,905,555).
Bahadur, "Liquid Crystal Devices and Uses," vol. 1, World Scientific Press, 1990, pp. 178-181 and 421-423.
Official Action dated Mar. 24, 2006 and Corresponding Claims for U.S. Appl. No. 09/300,596.
Official Action dated Dec. 26, 2006 and Corresponding Claims for U.S. Appl. No. 09/300,596.
Official Action dated Apr. 4, 2007 and Corresponding Claims of U.S. Appl. No. 09/288,509, now abandoned.
Official Action dated Mar. 9, 2000 and Corresponding Claims of U.S. Appl. No. 09/316,198, now abandoned.

* cited by examiner

FIG. 7
PIXEL A 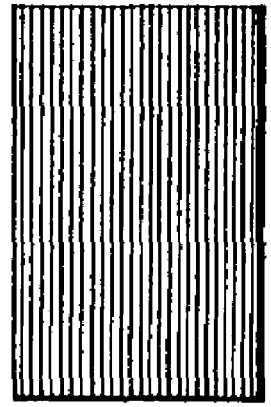 PIXEL F 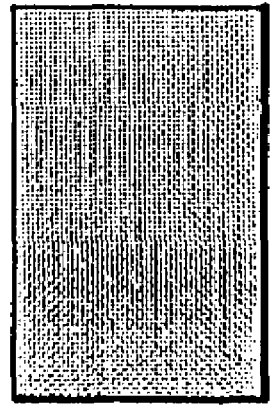 PIXEL I
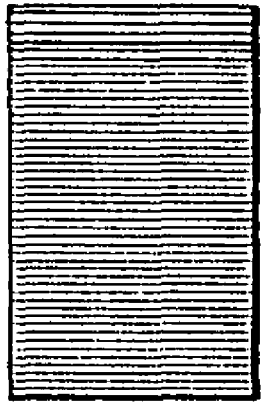

FIG. 14
PIXEL A 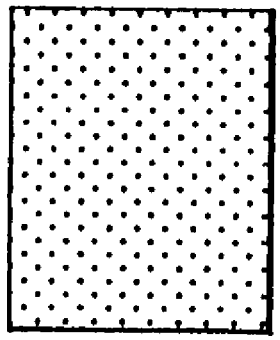
PIXEL E 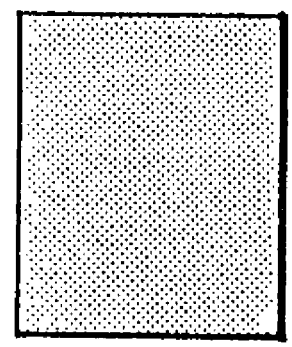
PIXEL C 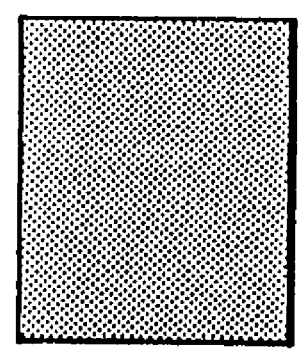

FIG. 22(A)
FIG. 22(B)
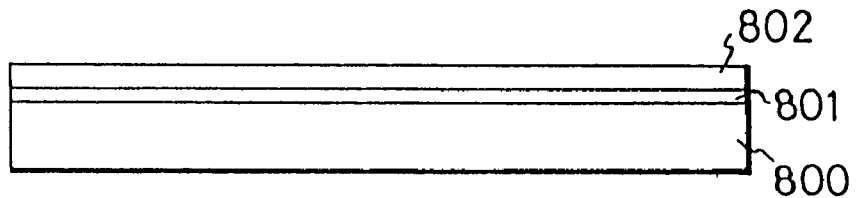
FIG. 22(C)
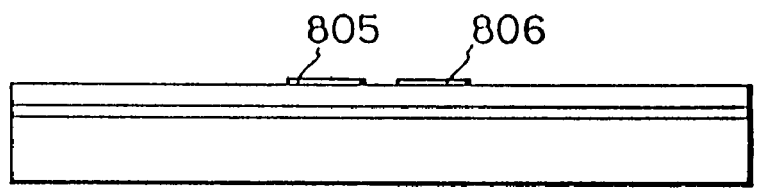
FIG. 22(D)
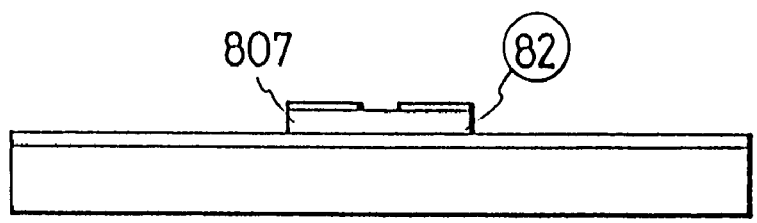
FIG. 22(E)
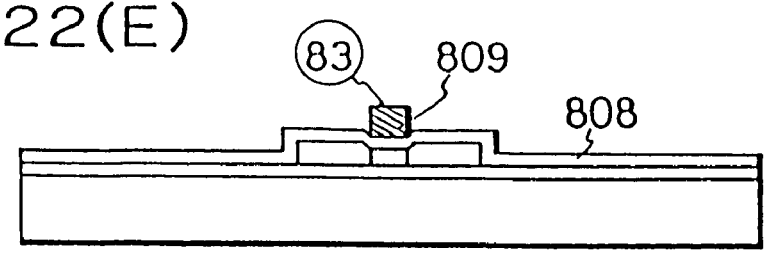

f = 500 KHz f = 1MHz

ELECTRO-OPTICAL DEVICE

BACKGROUND OF THE INVENTION

1. Field of the Invention

This invention relates to an electro-optical device and more particularly to an active-type liquid crystal display device in which clear gradated display levels can be set.

2. Description of the Prior Art

Because of the physical characteristics of the liquid crystal composition, the dielectric constant thereof differs between a direction parallel to the molecule axis and a direction perpendicular to the molecule axis, which is referred to as dielectric anisotropy, therefore the liquid crystals can easily be arranged parallel to or perpendicular to an external electric field. A liquid crystal electro-optical device utilizes this dielectric anisotropy, so that the ON/OFF display is achieved controlling the amount of light transmitted or the amount of light dispersion.

The electro-optical characteristics of a nematic liquid crystal are shown in FIG. 2. The relationship between the applied voltage and the transmissivity (amount of light transmitted) is as follows;

| the applied voltage | the light transmitted |
|---|---|
| smaller Va at point A 201 | 0%; |
| Vb at point B 202 | about 30%; |
| Vc at point C 203 | about 80%; |
| larger Vd at point D 204 | about 100%. |

In short, if only points A and D are utilized, the two gradations, black and white, are displayed, and if the rising portion of the electro-optical characteristic curve is utilized, such as at points B and C, an intermediate gradated display is possible.

It was confirmed that Va=2.0V, Vb=2.18V, Vc=2.3V and Vd=2.5V.

Conventionally, in the case of a liquid crystal electro-optical device with a gradated display utilizing a TFT, the applied gate voltage or voltage applied over the source and drains of the TFT is varied to adjust the voltage, so that an analogue gradated display is obtained.

The gradated display method with a liquid crystal electro-optical device utilizing TFTs is further described below in detail.

An n-channel thin film transistor conventionally utilized in a liquid crystal electro-optical device has the voltage-current characteristic as shown in FIG. 20. In the drawing, numeral 301 designates the characteristic in case of an n-channel thin film transistor using amorphous silicon, while numeral 302 designates the characteristic in case of an n-channel thin film transistor using polycrystalline silicon.

In a conventional gradated display method, by controlling analog voltages to be applied to the gate electrode, drain currents can be controlled and accordingly the resistance value between the source and the drain can be changed. As a result, the strength of the electric fields to be applied to the liquid crystal connected thereto in series can be arbitrarily changed by the division of the resistance, whereby a gradated display is made possible.

Also there is another method, where the gate electrode is connected to scanning signal lines and the voltage between the source and drain is changed, resulting in controlling arbitrarily the electric field value itself to be applied to the liquid crystal.

Both of the above methods are analogue gradated display methods largely relying upon the TFT characteristics. It is however difficult to form numbers of TFTs for matrix composition so as to make all of them have an uniform electric characteristic. Particularly, it is extremely difficult in the present circumstances to finely adjust the intermediate voltage necessary for a gradated display by the present techniques. As can be realized by the electro-optical characteristics of a nematic liquid crystal shown in FIG. 2, a gradated display has to be carried out within 0.32V, that is, from around 2.08V, the boundary value of dark condition, to around 2.40V, the boundary value of light condition. In the case of a gradated display of 16 gradations, the control of the voltage at every 0.02V in average is required.

On the other hand, when the voltage is controlled at such as point A 201 and point D 204 shown in FIG. 2 where liquid crystal is completely turned ON/OFF, the difference between voltages of 0.5V or more can be obtained, which will sufficiently ease the variation in TFT characteristics. When, using a plurality of write-in frames, for example 6 frames among 10 frames are turned ON (at 2.5V) and the remaining 4 frames are turned OFF (2.0V), the write-in voltage is 2.3V in average, so that an intermediate gradated display becomes possible.

In this case, however, the drive frequency might be decreased to 30 Hz or lower which is not discernible by the human eyes. Depending on conditions, this becomes a cause of the inferiority of a display such as flicker. Although it is proposed to raise the drive frequency to prevent the above problem, the data transfer speed of a driver IC has its limit up to about 20 MHz.

SUMMARY OF THE INVENTION

Accordingly, an object of the present invention is to provide a means of supplying a precise, clear level of gradated display to the liquid crystals by presenting a digital gradated display rather than a conventional analogue gradated display.

In order to obtain a good quality gradated picture, the drive frequency of the drive IC is raised and the frame frequency is not reduced substantially and the frame frequency does not fall below the visually discernable minimum frequency (the lowest confirmed number of frames) in the method of displaying a gradated image in accordance with the present invention.

With the present invention, a gradated display is provided in an active-matrix-type liquid crystal display device, using a display drive system with the display timing related to the unit time t for writing-in a picture element and to the time F for writing-in one picture, wherein, by time-sharing the signal during a write-in of time t, without changing the time F, a gradated display corresponding to the ratio of the division is obtained since an average electric field applied to a liquid crystal at a picture element (pixel) during the time t can be controlled by controlling the ratio of the division.

For purposes of explanation, the type of 4×4 matrix shown in FIG. 3 will be used.

In the case of a method for gradated display with a conventional display device, as shown in FIG. 4, the electric fields like 220-223 to be applied to the pixel electrodes are determined depending on the strength of the electric fields to the signal lines 210-213 of the data electrode direction, from which the transmittance of the liquid crystals is determined. Note reference numerals in FIG. 3 corresponds to that in FIG. 4.

In the present invention, this type of analogue gradation control is not used, and the signal during a write-in unit time t 225 for writing in a pixel is time-shared as shown in FIG. 1, so that the gradated display can be accomplished with each of the divisions used as a minimum unit.

At this time, in the case where the electric fields 227, 229, 231 in the write-in time are changed as shown in FIG. 1, the electric fields in the non-write-in time become the average values 228, 230, 232, and a clear gradated display becomes possible.

For another explanation, the type of 2×2 matrix shown in FIG. 10 or FIG. 17 will be used.

In another method for gradated display with a conventional display device, as shown in FIG. 11, a plurality of picture frames, for example, 16 frames are used, and the electric field over the picture element electrodes is determined as the average voltage for 16 frames by turning the picture elements ON and OFF, from which the transmittance of the liquid crystals is determined.

In the present invention, however, the conventional analogue gradation control or the gradated display with a plurality of frames is not used, and the signal during a write-in unit time t 325 for writing in a pixel is time-shared as shown in FIG. 9 and FIG. 16, so that the gradated display can be accomplished with each of the divisions used as a minimum unit. In the case of the circuit shown in FIG. 10, a gradated display can be obtained with the signal in FIG. 9, and in the case of the circuit shown in FIG. 17, a gradated display is obtained with the signal in FIG. 16.

At this time, in the case where the electric fields 327, 329 in the write-in time are changed as shown in FIG. 9 or FIG. 16, the liquid crystals are activated by the average value of the applied voltage and a clear gradated display becomes possible.

In another method of the present invention, a digital gradated display is carried out without changing the frame frequency and with the data transfer frequency and the frequency for gradated display being independent of each other.

In the case of a liquid crystal electro-optical device having 1920×400 dots, for example, the data transfer on the information signal side by 8 bit parallel transfer requires the clock frequency of 5.76 MHz. If the conventional method with a plurality of frames, e.g. 10 frames, is employed for this data transfer, the clock frequency as high as 57-0.6 MHz is necessary. However, since the clock frequency for a gradated display is made independent in the present invention, a gradated display having about 166 gradations is possible with an IC driven at 8 MHz in maximum. If an IC driven at 12.3 MHz is used, a display having 256 gradations, which is considered necessary for a visual display, is sufficiently possible. Therefore, the gradated display in accordance with the above method is greatly advantageous over the conventional analogue gradated display and the gradated display with a plurality of frames.

Liquid crystal components which can be utilized in the present invention are a material exhibiting ferroelectricity, a material exhibiting anti-ferroelectricity, a material consisting mainly of a nematic liquid crystal, a material consisting mainly of a cholesteric liquid crystal, a nematic liquid crystal dispersed in an organic resin, a cholesteric liquid crystal dispersed in an organic resin, and a smectic liquid crystal dispersed in an organic resin.

BRIEF DESCRIPTION OF THE DRAWINGS

FIG. 7 shows examples of picture elements in display in this invention;

FIG. 14 is a gradated display obtained in one embodiment of the present invention;

FIGS. 22(A) to 22(I) are cross-sectional views to show the manufacturing process of another example of the present invention;

DETAILED DESCRIPTION OF THE PREFERRED EMBODIMENTS

Embodiment 1

Figure 17:
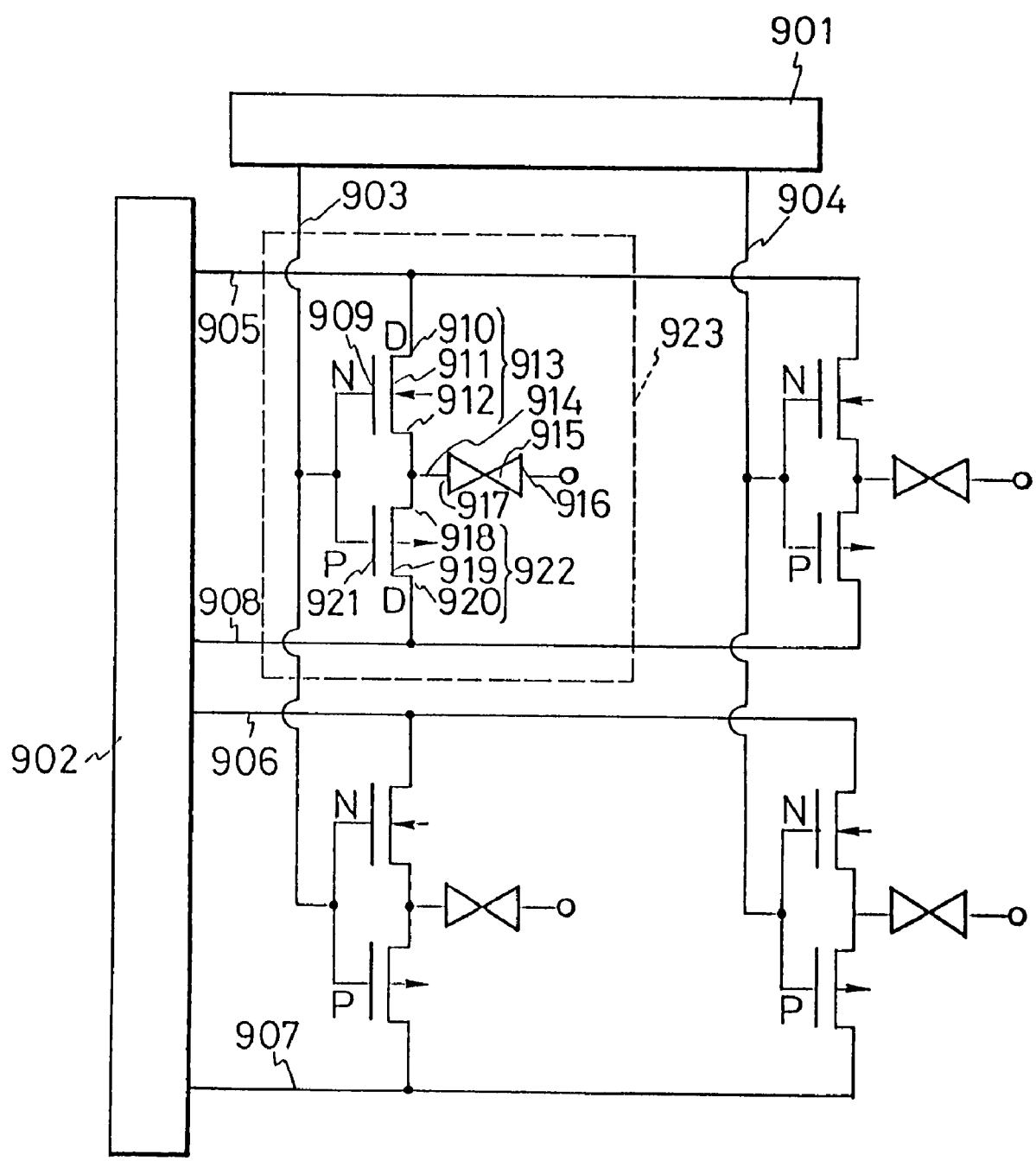
FIG. 17 is another example of the circuit configuration of a liquid crystal electro-optical device of the present invention.

In this embodiment, a liquid crystal display device with the circuit configuration shown in FIG. 17, that is, a buffer type circuit configuration, is used.

Figure 38:
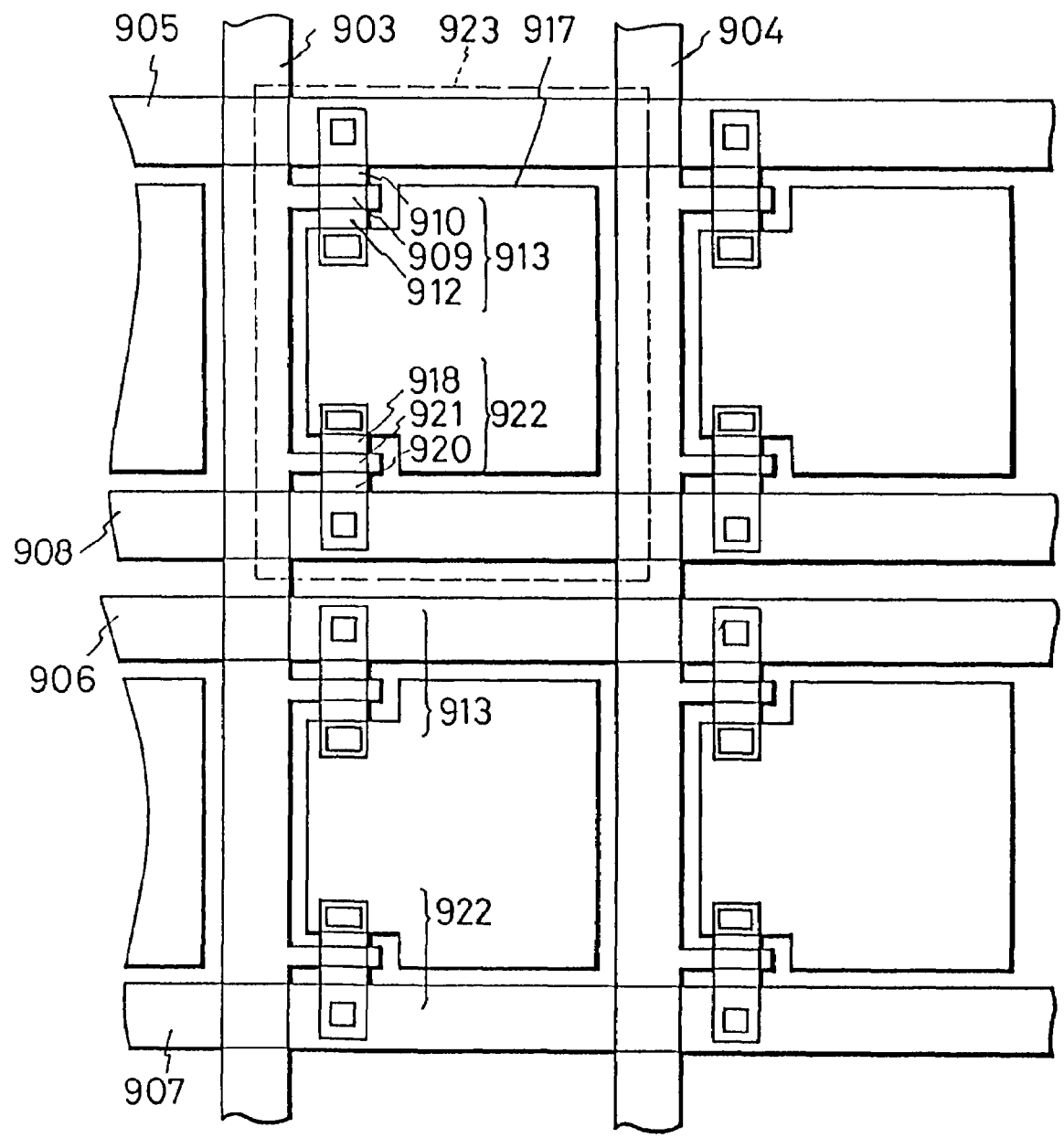
FIG. 38 is a layout of electrodes and the like of still another embodiment of the present invention.

FIG. 38 shows the layout of the actual electrodes and the like corresponding to the circuit configuration of FIG. 17.

In order to simplify the explanation, the parts corresponding to a 2×2 matrix only are described.

Figure 16:
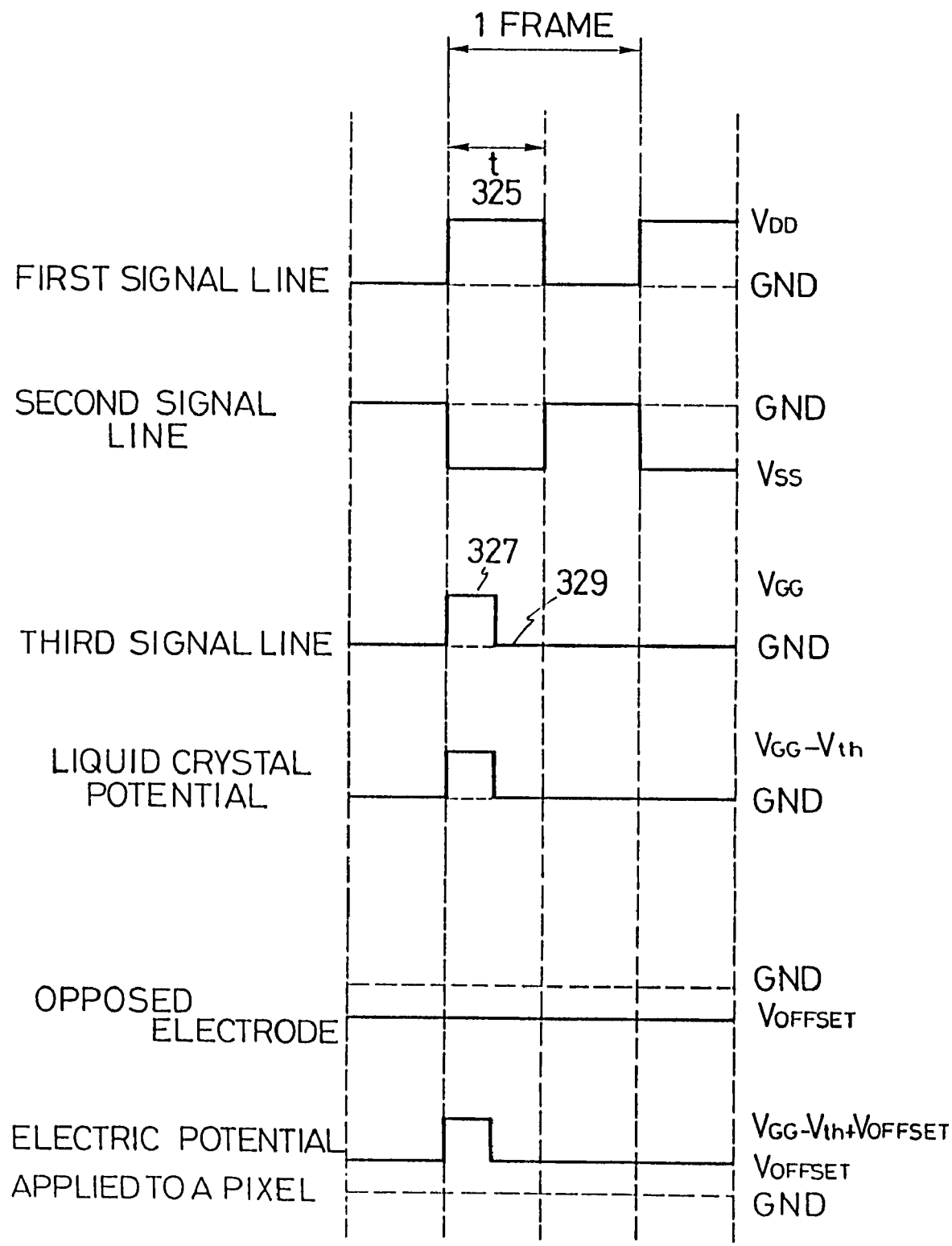
FIG. 16 is a graph showing another example of the drive waveform in accordance with the present invention.

Also, the actual driving signal waveform is shown in FIG. 16. For simplicity, the explanation of the signal waveform is also given for the case of 2×2 matrix configuration.

The manufacturing process for forming the substrate for the liquid crystal display device used in an embodiment of the present invention is shown in FIG. 18.

Figure 18A:
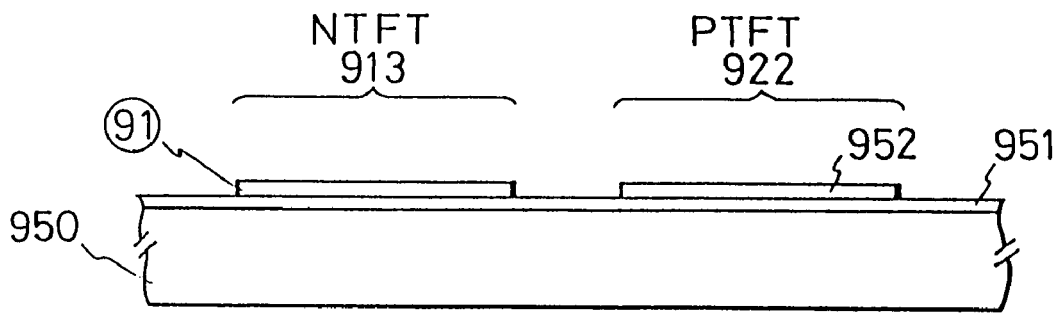
FIGS. 18(A) to 18(F) are cross-sectional views to show the formation process of a substrate of one embodiment of the present invention.
Figure 18B:
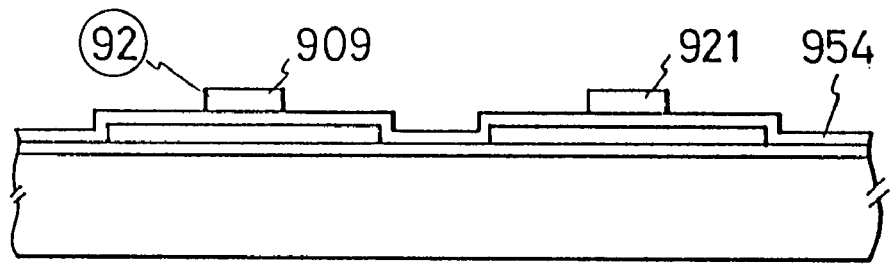

In FIG. 18(A), a silicon oxide film for a blocking layer 951 having a thickness of 1000 to 3000 angstroms was formed on a glass substrate 950, using a magnetron RF (high frequency) sputtering method. The glass substrate 950 was made of inexpensive glass capable of withstanding heat treatment up to 700° C. e.g. of 600° C.

The process conditions were as follows:
atmosphere: 100% oxygen
film forming temperature: 150° C.
output: 400 to 800 W
pressure: 0.5 Pa The film forming, using either quartz or single-crystal silicon for a target had a speed of 30 to 100 Angstroms/minute.

On top of this construction, an amorphous silicon film was formed using an LPCVD (low pressure chemical vapor deposition) method, sputtering method, or a plasma CVD method.

If using the LPCVD method to form the silicon film, disilane ($Si_2H_6$) or trisilane ($Si_3H_8$) was supplied to the CVD apparatus at a temperature 100 to 200° C. less than the crystallization temperature, that is, 450 to 550° C., for example at 530° C. The pressure inside the reaction furnace was 30 to 300 Pa. The film forming speed was 50 to 250 Å/minute.

In order to control the threshold voltage (Vth) of both the NTFT and PTFT at a substantially same level, boron with a concentration of $1×10^{15}$ to $5×10^{18}$ cm$^{-3}$ can be added using diborane.

In the case of using a sputtering method, the conditions were as follows;
back pressure before sputtering: up to $1×10^{-5}$ Pa
target: a single crystal silicon
atmosphere: argon with hydrogen 20 to 80% by volume e.g. 20 volume % Ar and 80 volume % $H_2$
the film forming temperature: 150° C.
frequency: 13.56 MHz
sputter output: 400 to 800 W
pressure: 0.5 Pa In the case of forming a silicon film using the plasma CVD method, the temperature was 300° C. for example, and monosilane ($SiH_4$) or disilane ($Si_2H_6$) was used as the reactive gas, which were input into a PCVD apparatus and 13.56 MHz high frequency electric power was applied for film forming.

In this method, it is preferable that the oxygen concentration of the film formed is $5×10^{21}$ cm$^{-3}$ or less. If the oxygen concentration is higher than this range, crystallization becomes difficult and the heat annealing temperature must be high or the annealing time long. On the other hand, if the concentration is too low, the current leak in the OFF state increases because of the back light. For this reason the concentration is held in the range from $4×10^{19}$ to $4×10^{21}$ cm$^{-3}$. Silicon concentration was assumed to be $4×10^{22}$ cm$^{-3}$ and hydrogen concentration was $4×10^{20}$ cm$^{-3}$, which is equal to one atomic % of the silicon concentration.

Also, to promote further crystallization at the source and drain, the oxygen concentration is adjusted to $7×10^{19}$ cm$^{-3}$ or less, or, preferably, $1×10^{19}$ cm$^{-3}$ or less, and oxygen may be added by ion implantation to a concentration range of $5×10^{20}$ to $5×10^{21}$ cm$^{-3}$, only to the channel forming regions of the TFTs which form the pixels. On the other hand, it is effective for a high frequency operation to reduce the amount of oxygen contained in the TFT provided in the peripheral circuits which no light reaches, so as to make the carrier mobility greater.

After the amorphous silicon film was formed to a thickness of 500 to 5000 Å, for example 1500 Å by means of the foregoing process, an intermediate heat treatment was performed at 450 to 700° C. for 12 to 70 hours in an oxygen-free atmosphere, for example, in a hydrogen atmosphere at 600° C.

Because an amorphous silicon oxide film was formed on the surface of the substrate beneath the silicon film, no specific nucleus existed in this heat treatment so the whole amorphous silicon film was uniformly heat annealed. Specifically, the amorphous structure was kept in film forming and hydrogen was merely mixed in.

It was supposed that when annealing the silicon film, crystallization was inclined to take place in a highly ordered state from the amorphous structure, so that a crystal state was partly produced. Particularly, in the regions where a relatively highly ordered state was produced just after film forming of silicon, the tendency of crystallization to a crystal state was strong. A junction, however, took place due to the silicon between these regions, so that the silicon attracted each other.

According to laser Raman spectrometry measurement of the annealed silicon film, it was observed that a peak thereof was shifted from 522 cm$^{-1}$ of the single crystal silicon to a lower frequency side. The apparent grain diameter, when calculated using the half-value width, was 50 to 500 Å, like a micro crystal. Actually, there were many of these highly crystallized regions that made up clusters. Each cluster was joined to the other by a silicon junction (anchoring) forming a semi-amorphous film.

Consequently, it was believed that the film could be said to have substantially no grain boundary (GB). The carriers could easily travel between the clusters through the anchored areas, so the mobility of the carriers was higher than that of the poly-crystalline silicon having clear grain boundaries (GB).

The Hall mobility obtained was (μh)=10 to 200 cm²/Vsec, and the electron mobility obtained was (μe)=15 to 300 cm²/Vsec.

When the film is polycrystallized at a higher temperature of 900 to 1200° C. and not an intermediate temperature above, segregation of impurities occurs due to the growth of solid phase from nucleus in the film, and there are a lot of impurities such as oxygen, carbon, nitrogen in GB. Therefore, the mobility is large in the crystal, but the movement of carriers is prohibited by the barrier at GB. Consequently, it is actually impossible to obtain the mobility of 10 cm²/Vsec. or more.

This is a reason why a silicon semiconductor with a semi-amorphous or semicrystalline structure is used in this embodiment. Of course, other crystalline semiconductor materials having a high mobility can be used in the present invention.

FIG. 18(A) shows the silicon film which was photoetched using a first photomask 91, with the NTFT region 913 (20 μm in channel width) prepared at the left side of the drawing and the PTFT region 922 at the right side.

A silicon oxide film was then formed as a gate insulation film in the thickness range of 500 to 2000 Å, for example, 1000 Å. This is prepared under the same conditions as the silicone oxide film formed as a blocking layer. A small amount of fluorine may be added to this film for fixation of the sodium ion during film forming.

When this operation was completed, a silicon film was provided containing a 1 to $5\times10^{21}$ cm$^{-3}$ concentration of phosphorus. Molybdenum (Mo), tungsten (W), MoSi$_2$ or WSi$_2$ film may be optionally formed on this silicon film to form a multilayer film. The silicon film (or multilayer film) was patterned with a second photomask 92 to obtain the configuration shown in FIG. 18(B). An NTFT gate electrode 909 and a PTFT gate electrode 921 were then formed. For example, as a gate electrode, a phosphorus-doped silicon 0.2 μm thick was formed and a molybdenum layer 0.3 μm thick was formed thereon with a channel length of 10 μm.

Figure 18C:
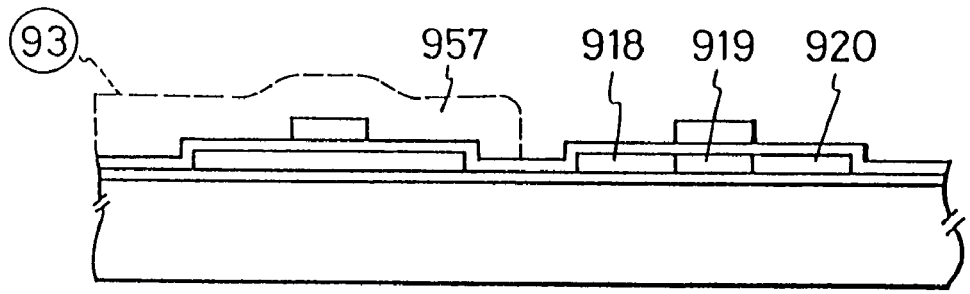
Figure 18D:
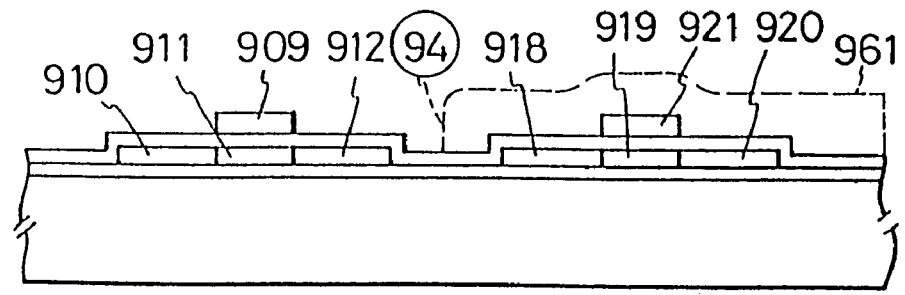
Figure 18E:
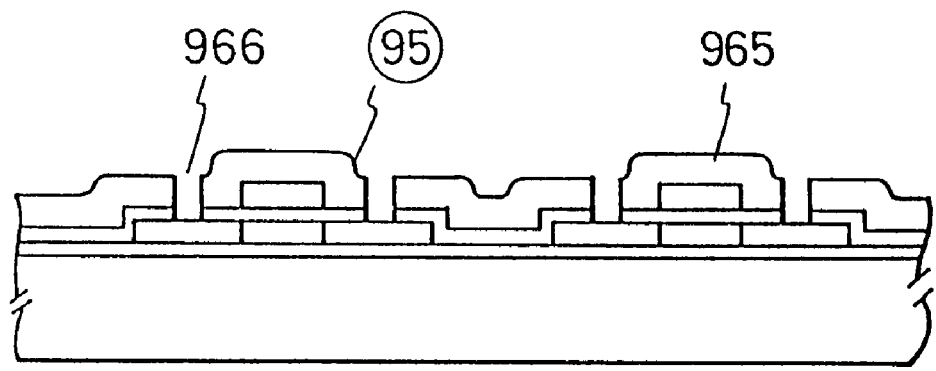

As shown in FIG. 18(C), a photoresist 957 was formed using a photomask 93, and boron was added using the ion implantation method at a dosage of 1 to $5\times10^{15}$ cm$^{-2}$ for the PTFT source 918 and drain 920. Next, as illustrated in FIG. 18(D), a photoresist 961 was formed using a photomask 94. Phosphorous was added using the ion implantation method at a dosage of 1 to $5\times10^{15}$ cm$^{-2}$ for an NTFT source 910 and drain 912.

Also, in the case where aluminum is used as the gate electrode material, after patterning with the second photomask 92, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

The doping above is made through a gate insulation film 954. However, in FIG. 18(B), using the gate electrodes 921, 909 as a mask the silicone oxide on the silicone film may be removed, followed by the addition of the boron and phosphorous directly into the silicon film using the ion implantation method.

Next, annealing was again conducted for 10 to 50 hours at 600° C. The impurities of the NTFT source 910 and drain 912, and the PTFT source 918, and drain 920, were activated to form P$^+$ and N$^+$ regions. The channels 919 and 911 below the gate electrodes 921 and 909 were made of a semi-amorphous semiconductor.

The entire manufacturing process for the C/TFT can thus be done without having to apply a temperature above 700° C. in the self-aligning system. This makes it possible to use other materials other than expensive quartz as the substrate material. Accordingly, this embodiment of the invention is very suitable for a liquid crystal display having a large picture element.

The heat anneal process, shown in FIG. 18(A) and FIG. 18(D), was performed twice. However, the anneal process of FIG. 18(A) can be omitted, depending on the desired characteristics, and followed up with the heat anneal process of FIG. 18(D), shortening the manufacturing time. Also, in FIG. 18(E), the interlayer insulation layer 965 was made of silicon oxide film using the sputtering method mentioned above.

This silicon oxide film can, however, also be formed using the LPCVD method or photo CVD method or normal pressure CVD method.

The thickness of the insulation layer was e.g. 0.2 to 0.6 μm.

Next, using photo mask 95, a window 966 for the electrodes was formed. Then, a layer of aluminum was formed over the entire structure using the sputtering method, and leads 971 and 972 and contacts 967, 968 were made using photo mask 96.

An organic resin film 969 for surface-flattening, e.g. a transparent polyimide resin film was formed, and electrode openings were provided using photomask 97.

Figure 18F:
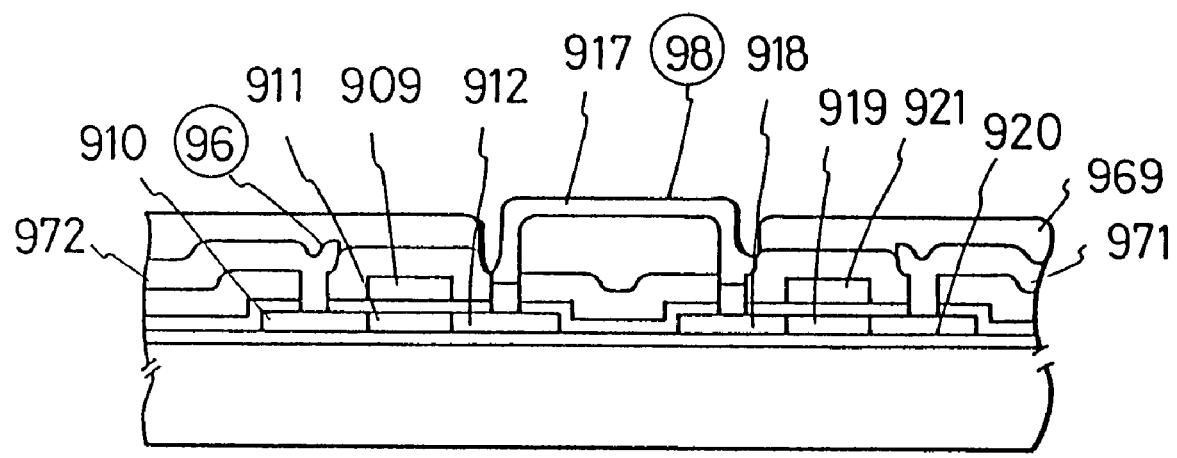

Two TFTS were formed in a complementary structure in a picture element of the liquid crystal display device as shown in FIG. 18(F), in which the output-terminal of the TFTS was each connected to the (transparent) electrode of the picture element of the liquid crystal display device, forming the ITO (Indium Tin Oxide) by sputtering.

The electrode 917 was completed by etching through the photomask 98.

This ITO film was formed in the range from room temperature to 150° C. and finished by annealing at 200° C. to 400° C. in oxygen or atmosphere. The NTFT 913, the PTFT 922 and the transparent electrode 917 were thus prepared on a single glass substrate 950.

The electrical characteristics of the TFT obtained thus are as follows:

mobility in the PTFT: 20 cm²/Vs
Vth in the PTFT: −5.9 V
mobility in NTFT: 40 cm²/Vs
Vth in NTFT: 5.0 V Another glass substrate provided with a transparent electrode over the entire surface thereof and the substrate fabricated according to the above-described method were combined to form a liquid crystal cell. A TN liquid crystal material was injected into the liquid crystal cell. FIG. 38 illustrates the positioning of the electrodes and the like for the liquid crystal display device according to this embodiment.

An NTFT 913 is provided at the intersection of a first signal line 905 and a third signal line 903, and, in the same manner, an NTFT for another picture element is provided at the intersection of the first signal line 905 and a third signal line 904. A PTFT is provided at the intersection of a second signal line 908 and the third signal line 903. Also, an NTFT for another picture element is provided at the intersection of another, adjacent first signal line 906 and the third signal line 903, while in the same manner an NTFT is provided at the intersection of the first signal line 906 and the third signal line 904.

The NTFT 913 is connected to the first signal line 905 through a contact on the input terminal on the drain 910, and the gate 909 is connected to a signal line 903 which is formed of multilayer wiring. The output terminal of the source 912 is connected to a picture element electrode 917 through a contact.

The PTFT 922 is connected to the second signal line 908 through a contact on the input terminal on the drain 920, wherein the gate 921 is connected to the signal line 903, and the output terminal of the source 918 is connected to the picture element electrode 917 through a contact in the same way as in the NTFT.

Adjacently, another C/TFT which is connected to the same signal line 903 is provided and the PTFT 922 of said another C/TFT is connected to a second signal line 907, and the NTFT 913 of said another C/TFT is connected to the first signal line 906.

One pixel comprising a picture element 923 formed from a transparent conducting film and a C/TFT is interposed between this pair of signal lines 905 and 908. By repeating this type of configuration laterally and vertically, the 2×2 matrix can be expanded to form a large picture element liquid crystal display device of 640×480 or 1280×960 matrixes.

A special feature of this device is that the picture element electrode 917 is set at three values of the liquid crystal potential $V_{LC}$ by providing a complementary configuration of two TFTs for one picture element.

Next, in order to form a second substrate, an ITO film (Indium Tin Oxide) was formed by sputtering on a substrate which was formed by laminating a silicon oxide film to a thickness of 2000 Å on glass plate by the sputtering process. This ITO film was formed in the range from room temperature to 150° C. and finished by annealing at 200° C. to 400° C. in oxygen or atmosphere.

A polyimide precursor member was printed on the above-mentioned substrate using the offset method and fired for one hour at 350° C. in an oxygen-free atmosphere (for example, in a nitrogen atmosphere). The polyimide surface was then reformed using a commonly known rubbing method, so that a means for orienting the liquid crystal molecules in a uniform direction in at least the initial stage was provided, whereby the second substrate was completed.

Then, the liquid crystal composition having ferroelectricity was interposed between the first and second substrates, and the assembly was sealed around the periphery using an epoxy-type adhesive. A drive IC of a TAB form was connected to a lead on the substrate and a polarizing plate was affixed to the outside to obtain a light-transmission type of liquid crystal display device.

FIG. 14 shows the display for the A, E, and C picture elements when the drive waveform shown in FIG. 16 is applied. In FIG. 14, darkness is expressed by a dot. A clear gradated display is obtained, as shown in FIG. 14.

Embodiment 2

In this embodiment, a first substrate and a second substrate were obtained using the same process as for the Embodiment 1. However, no polyimide film for alignment was formed on the second substrate. Since this device was made for use in a video camera viewfinder, the pitch of the picture element was 60 μm, and a matrix 200 high×300 wide was formed.

In this embodiment, a nematic liquid crystal composition was dispersed throughout an acrylic organic resin to form a dispersed-type liquid crystal display device. 62 wt % of the nematic liquid crystals was dispersed throughout an acrylic resin denatured with an ultraviolet-curable epoxy. This material was interposed between the first and second substrates, then cured by the application of a light beam from a UV light source with a 1000 mW output for 20 sec.

Figure 19:
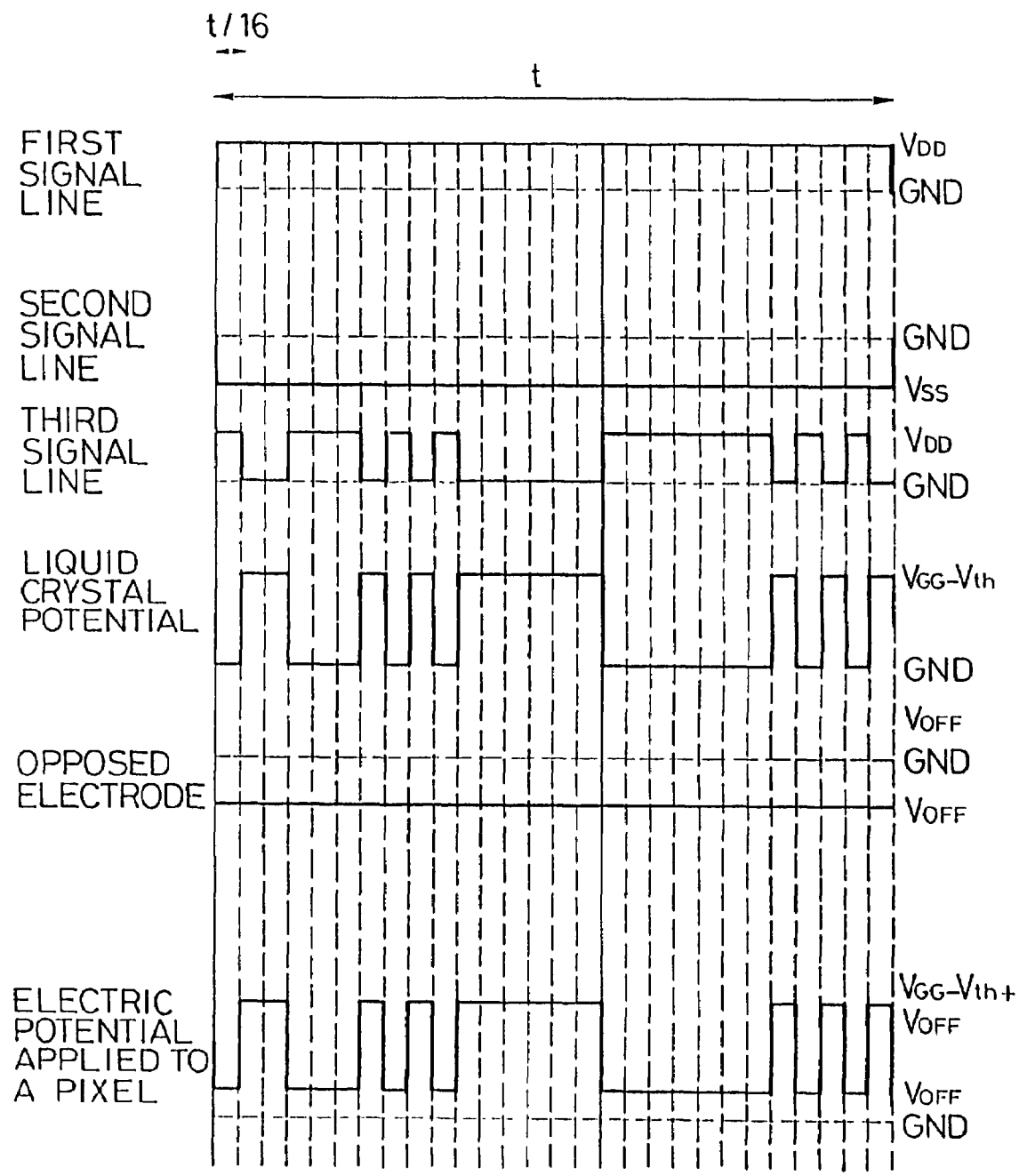
FIG. 19 is a graph showing an example of the drive waveforms in the present invention.
Figure 20:
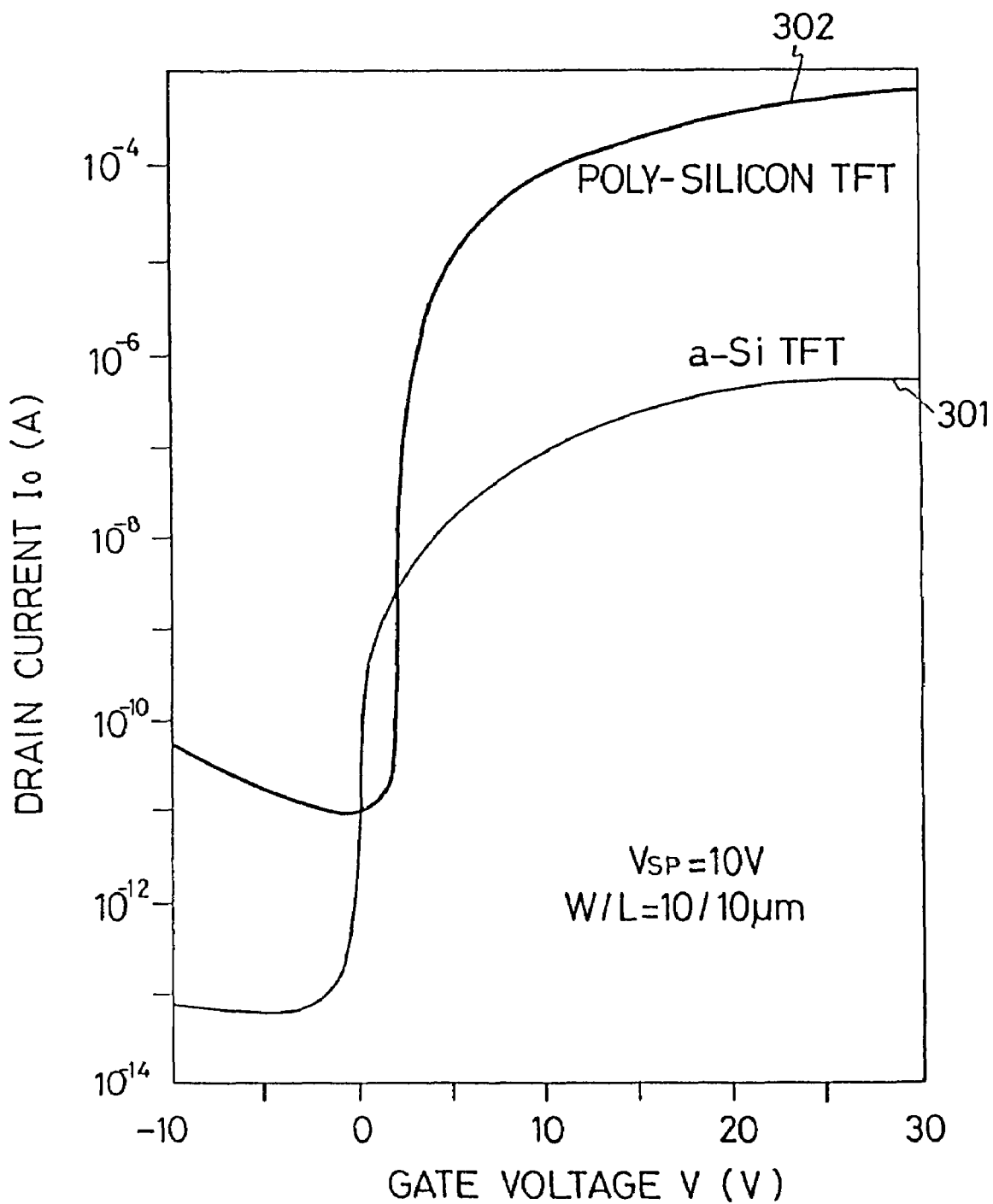
FIG. 20 shows gate voltage-drain current characteristics in a polycrystalline silicon TFT and an amorphous silicon TFT.

This display device was time-shared into 16 to provide a gradated display, and each color had 16 gradations, to give a liquid crystal display device which can display a total of 4096 colors. The drive wave form at that time is shown in FIG. 19.

In summary, a plurality of write-in entries (display frames) is provided in conventional gradated display methods. For example, 16 frames are utilized to provide a method for presenting a gradated display by a combination of their ON/OFF states. If, in a total 16 frames, eight frames are ON and the remaining eight frames are OFF, a gradated display results at a 50% transmission, which is the average transmittance in this case.

If, however, four frames are ON and the remaining 12 frames are OFF, the average transmittance becomes 25% and a gradated display occurs at this transmission.

When this conventional method is used there is a strong possibility of the number of frames less than the lowest confirmed number of frames, 30 frames, which are the minimum number of frames that can be discerned by the human-eye. This is the main cause of a drop in the quality of the display.

In this embodiment, where the frequency of the driver is increased for providing a gradated display of the present invention, a gradated display becomes possible preventing the actual frame frequency from decreasing. Therefore, the frequency never becomes lower than a visually confirmed frequency, so that a drop in display quality does not occur, and a high quality picture can be provided.

By using the same type of process and drive method it is possible to provide a word processor screen, a computer screen, or a device for projecting a visual image display.

Embodiment 3

Figure 9:
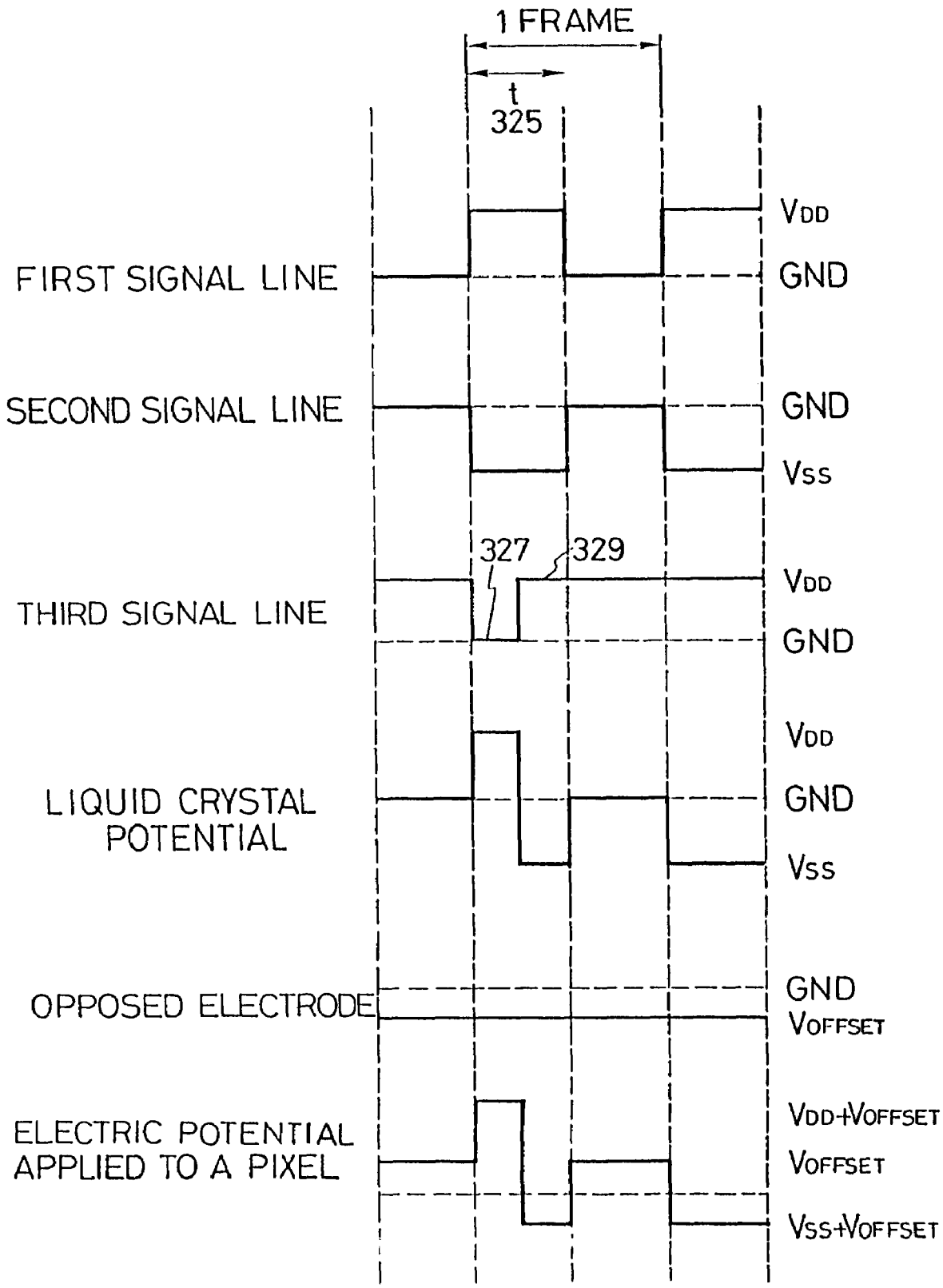
FIG. 9 is a graph showing an example of the drive waveforms in accordance with the present invention.
Figure 10:
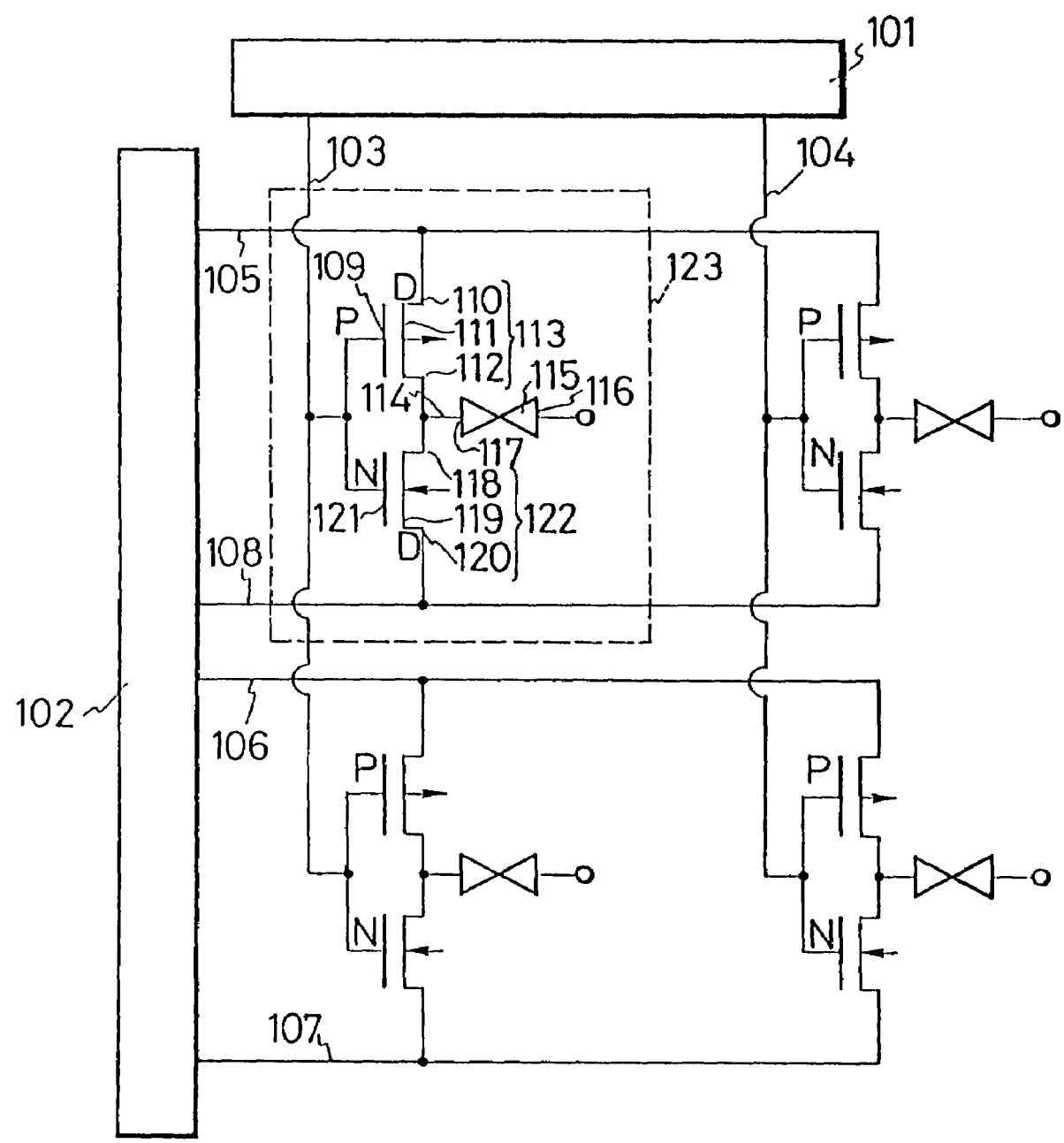
FIG. 10 shows an example of the circuit configuration of a liquid crystal electro-optical device in accordance with the present invention.
Figure 11:
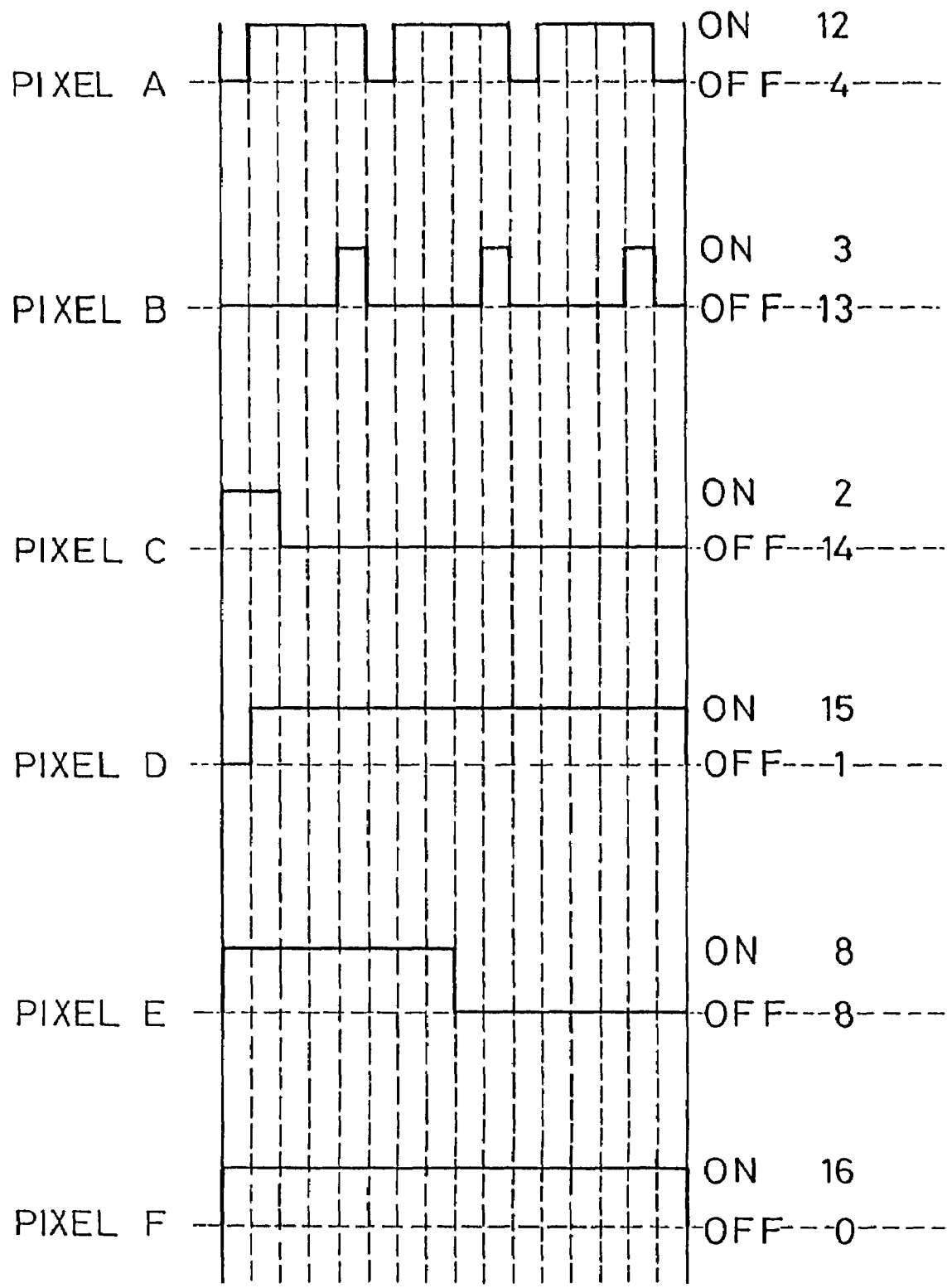
FIG. 11 is a graph showing another example of conventional drive waveforms.
Figure 12:
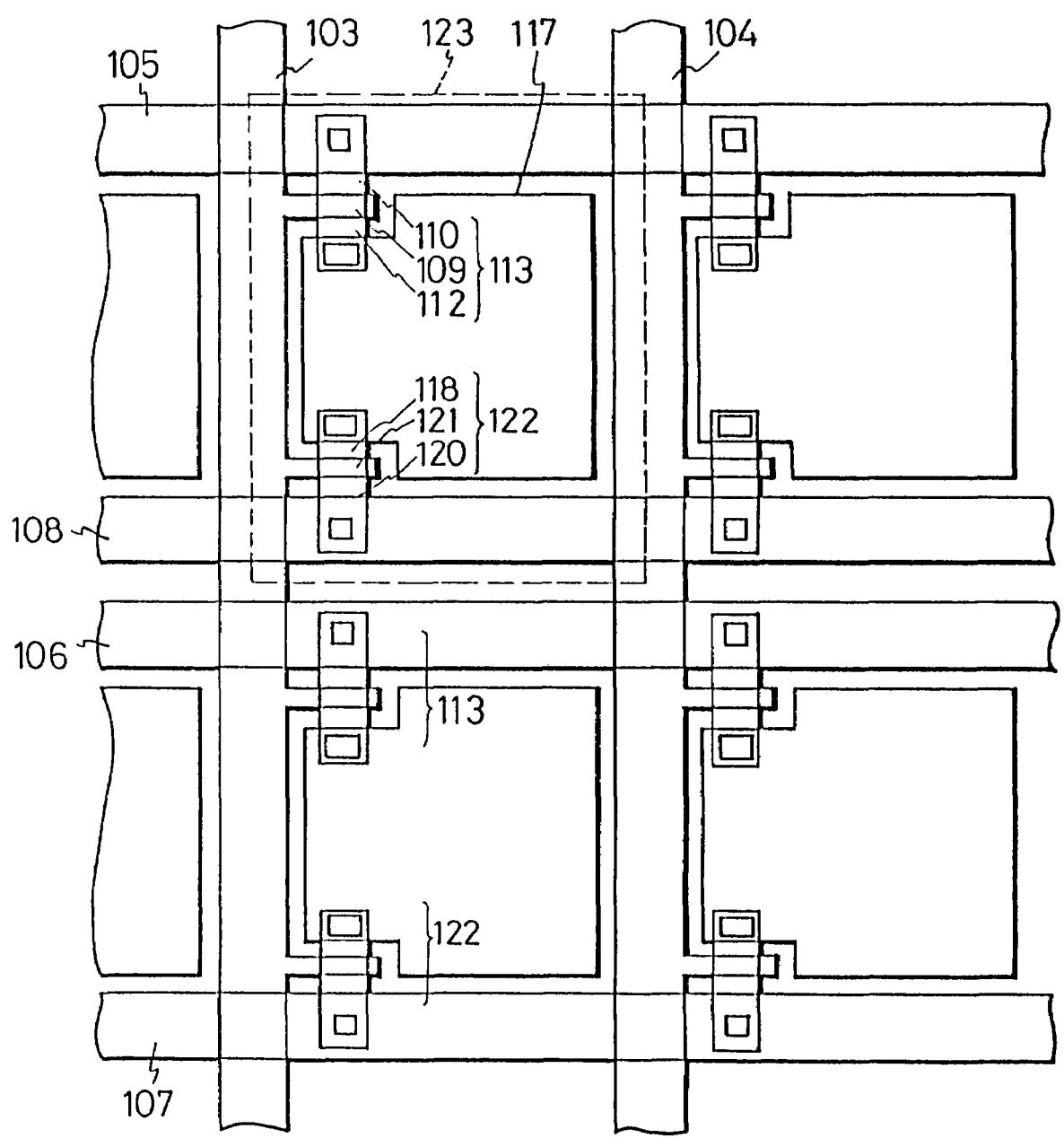
FIG. 12 shows a layout of electrodes and the like of one embodiment of the present invention.
Figure 13A:
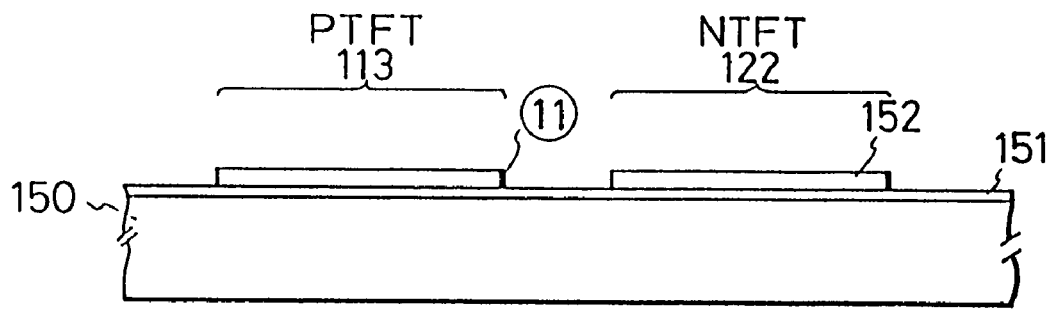
FIGS. 13(A) to 13(F) are cross-sectional view to show the formation process of a substrate of the present invention.
Figure 13B:
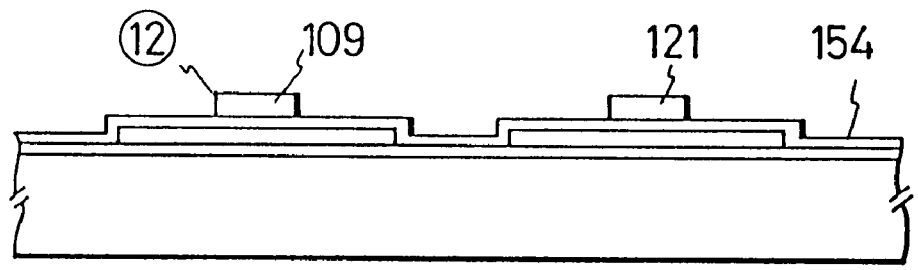
Figure 13C:
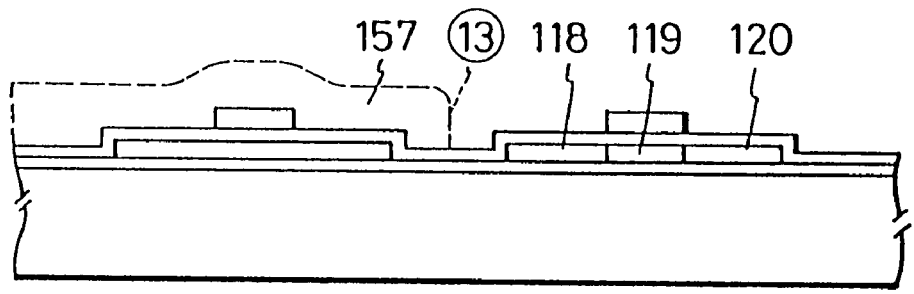
Figure 13D:
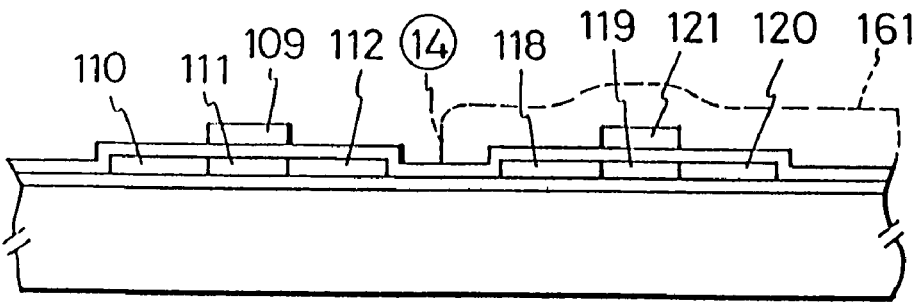
Figure 13E:
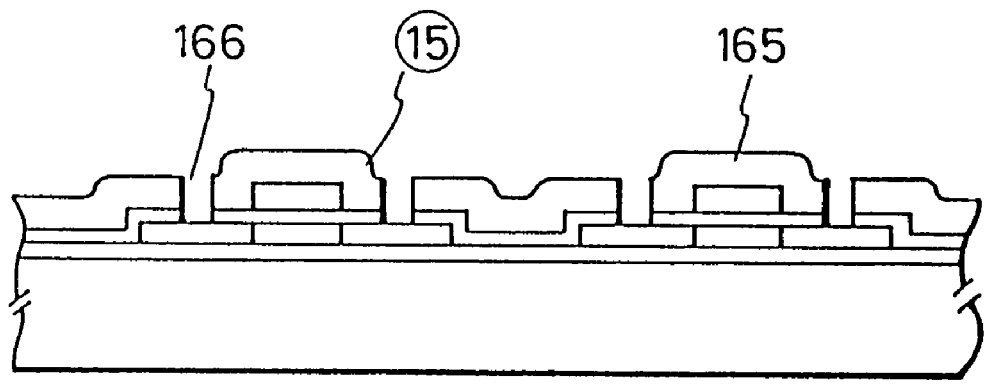
Figure 13F:
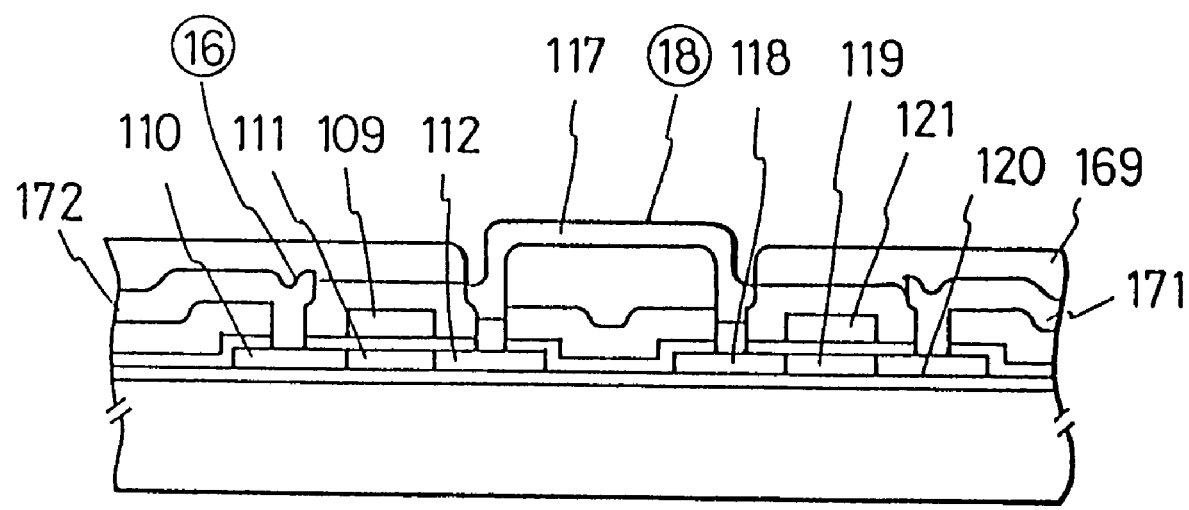

The liquid crystal electro-optical device utilized in this embodiment has the circuit configuration shown in FIG. 10, namely, the circuit configuration of inverter type. FIG. 12 shows the layout of the actual electrodes and the like corresponding to the circuit configuration of FIG. 10. In order to simplify the explanation, the parts corresponding to a 2×2 matrix only are described. Also, the actual driving signal waveform is shown in FIG. 9.

The process for forming a substrate for the liquid crystal electro-optical device utilized in this embodiment is shown in FIGS. 13(A) to (F). In accordance with the process shown in FIGS. 13(A) to (F), the substrate shown in FIG. 13(F) was formed in the same manner as in Embodiment 1. The substrate had the same structure as that in Embodiment 1 except that the location of a PTFT and an NTFT thereof was opposite to that of Embodiment 1, as shown in FIGS. 10 and 13. With thus obtained substrate, a light-transmission type liquid crystal electro-optical device was completed as in Embodiment 1.

Embodiment 4

In this embodiment, a first substrate and a second substrate were obtained using the same process as for Embodiment 3. However, an orientation film made of polyimide was not formed on the second substrate. With these first and second substrates, a liquid crystal electro-optical device for use in a video camera viewfinder was formed at a pitch of a picture element of 60 μm, and a matrix 200 high×300 wide in the same way as in Embodiment 2.

In this embodiment, where the frequency of the driver is increased for providing a gradated display of the present invention, a gradated display becomes possible preventing the actual frame frequency from decreasing. Therefore, the frequency never becomes lower than a visually confirmed frequency, so that a drop in display quality does not occur, and a high quality picture can be provided.

By using the same type of process and drive method it is possible to provide a word processor screen, a computer screen, or a device for projecting a visual image display.

Figure 15:
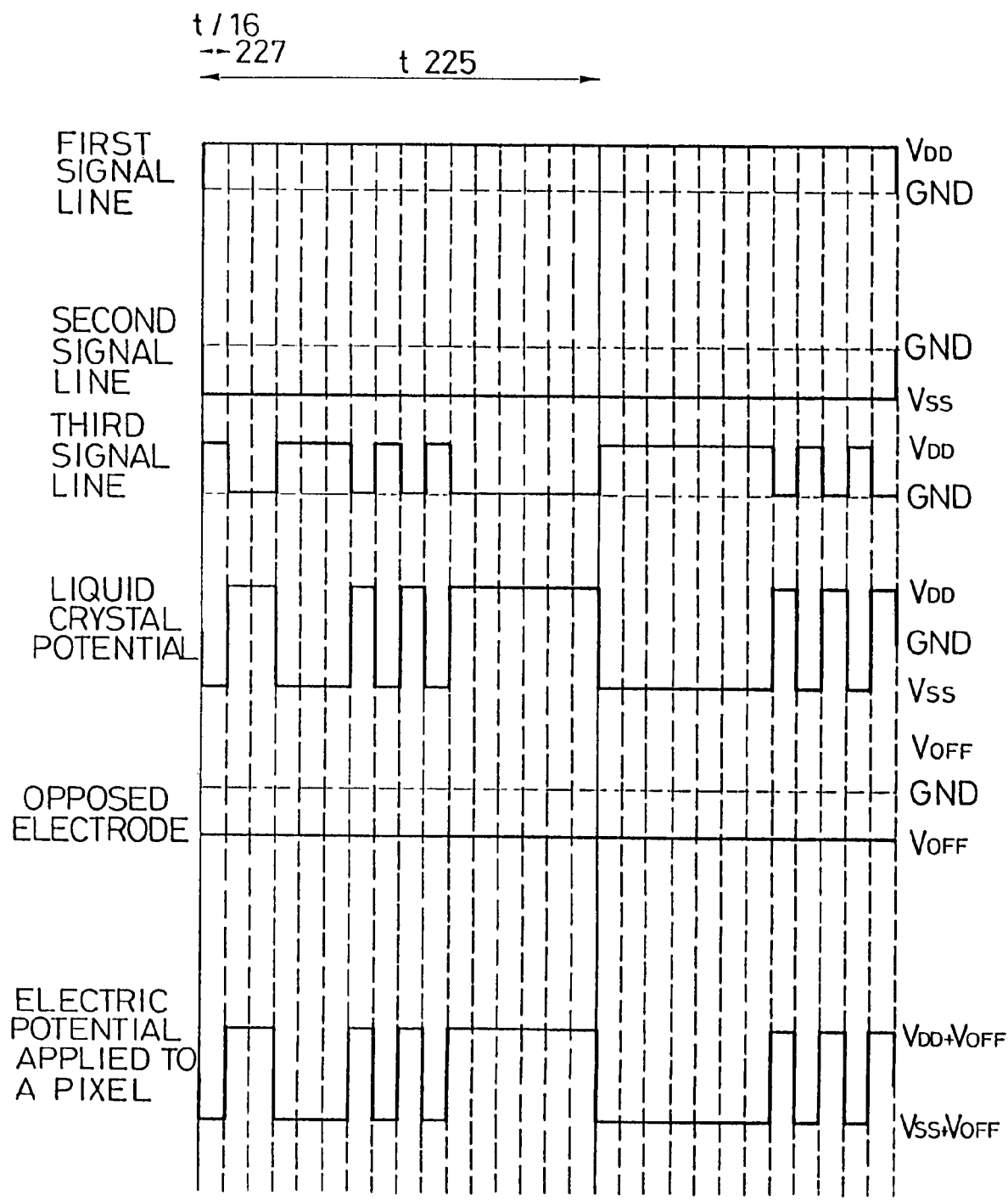
FIG. 15 is a graph showing another example of the drive waveforms in the present invention.

In the drive method of the present invention shown in FIG. 15 where the unit time t 225 for writing-in a picture element is divided into 16 minimum units (a period of each minimum unit 227 is t/16), each color is displayed with 16-gradations, so that a display with 4096 colors is possible in total.

Embodiment 5

Figure 3:
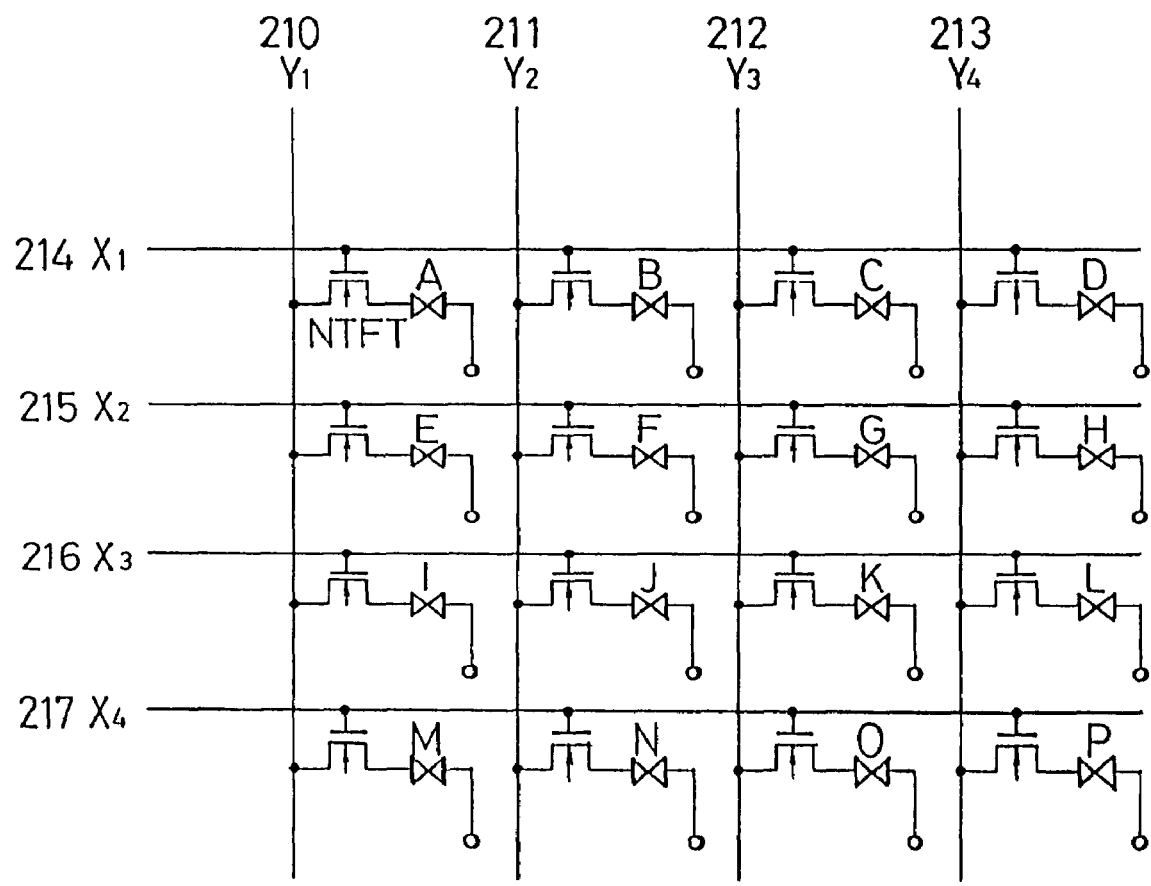
FIG. 3 is an electric circuit of the NTFT matrix.
Figure 4:
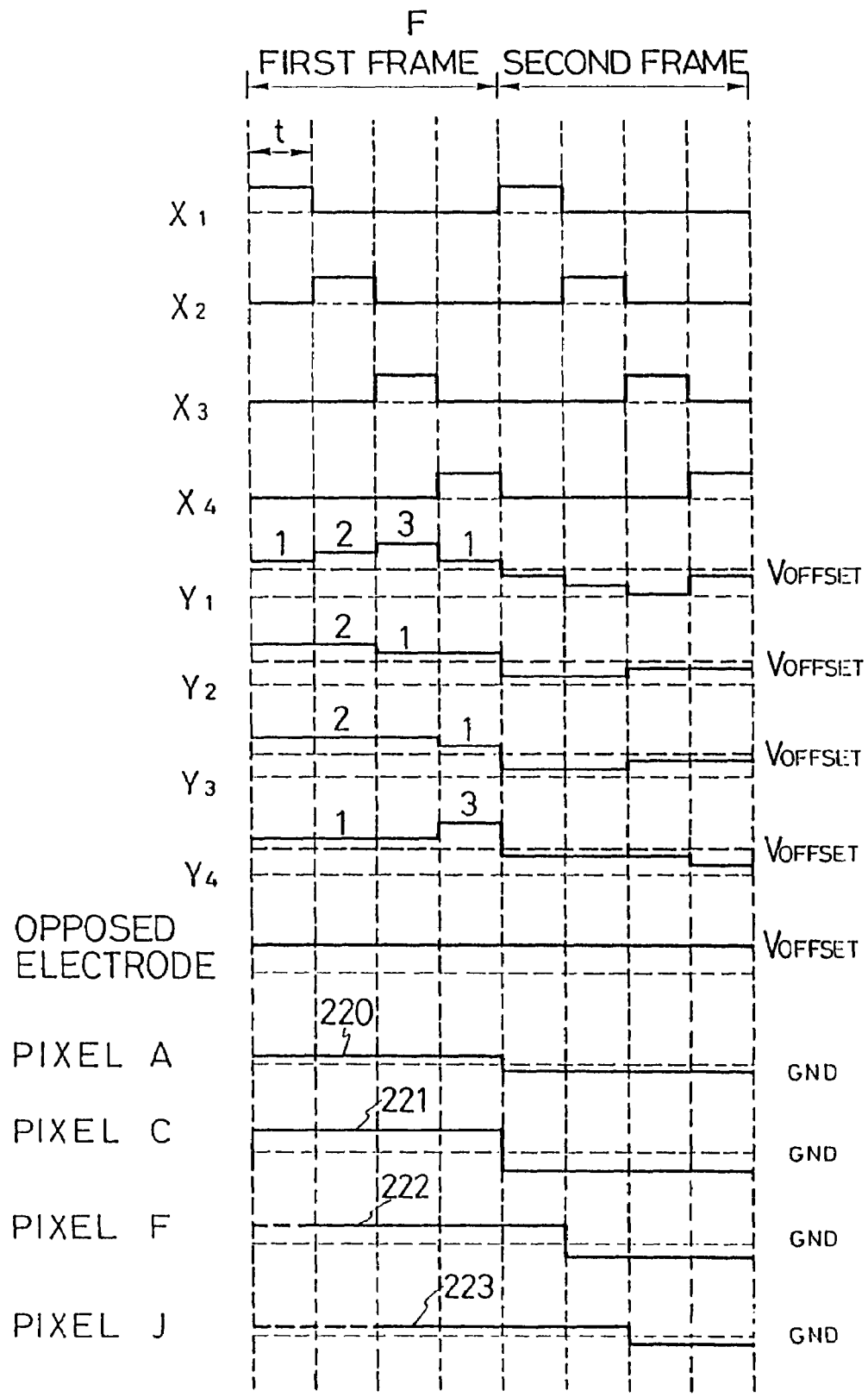
FIG. 4 is a graph showing an example of the drive waveforms in the prior art device.

In this embodiment, a liquid crystal display device with the circuit configuration shown in FIG. 3 is used.

Figure 5:
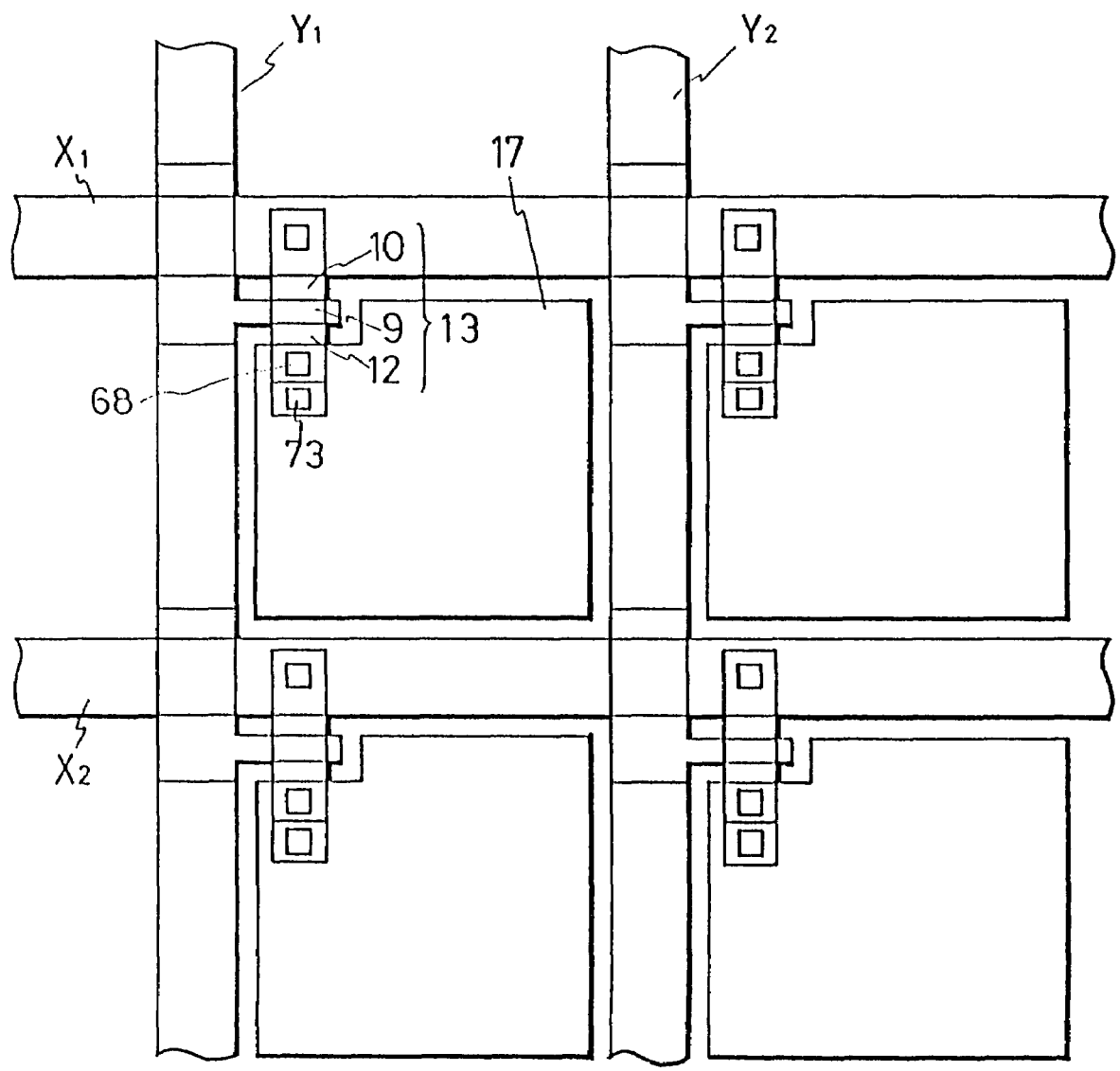
FIG. 5 is a partly cut-away plan view of the device of an embodiment in the present invention.

FIG. 5 shows the layout of the actual electrodes and the like corresponding to the circuit configuration of FIG. 3.

In order to simplify the explanation, the parts corresponding to a 4×4 matrix (2×2 matrix) only are described.

Figure 1:
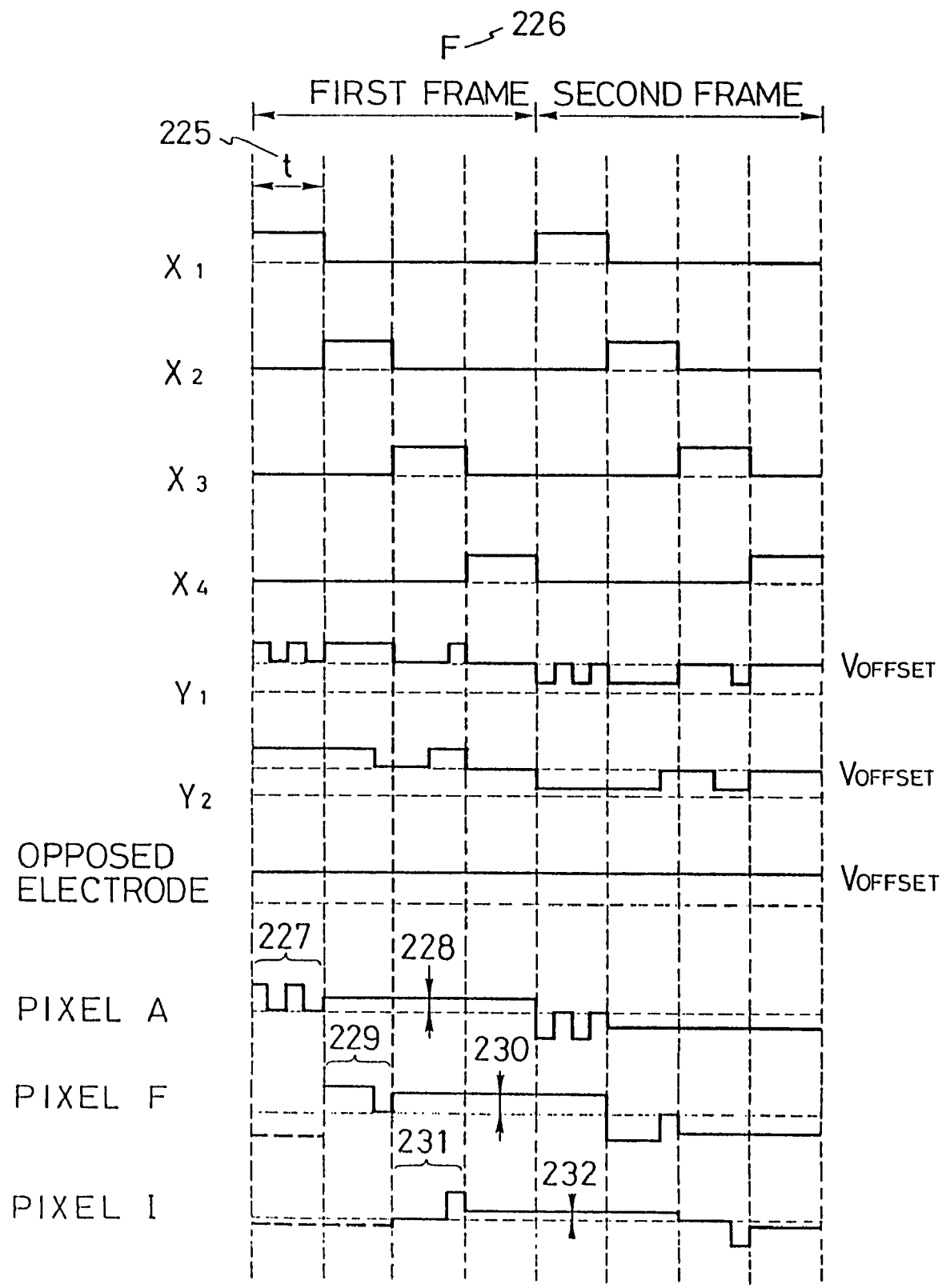
FIG. 1 is a graph showing an example of the drive waveforms in this invention.

Also, the actual driving signal waveform is shown in FIG. 1. For simplicity, the explanation of the signal waveform is also given for the case of 4×4 matrix configuration.

The manufacturing process for the liquid crystal display device used in this embodiment is shown in FIG. 6.

Figure 6A:
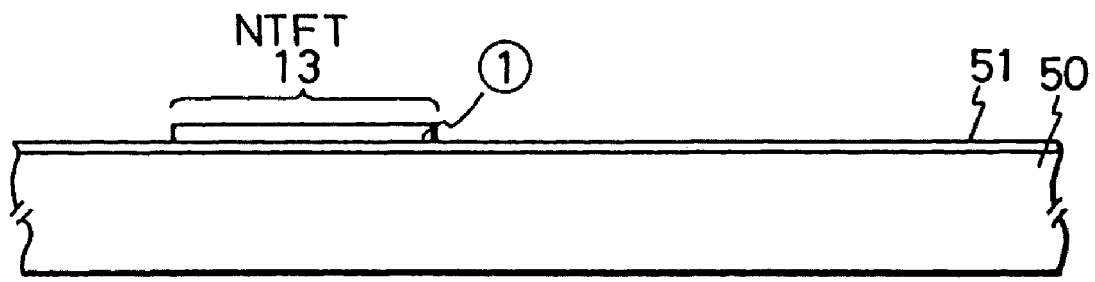
FIGS. 6 (A) to 6 (G) are cross-sectional views to show the manufacturing process of an example of this invention.

In FIG. 6(A), a silicon oxide film for a blocking layer 51 having a thickness of 1000 to 3000 angstroms was formed on a glass substrate 50, using a magnetron RF (high frequency) sputtering method. The glass substrate 50 utilized was the one which was not expensive unlike quartz glass and was resistant to heat treatment up to 700° C. e.g. of 600° C. The conditions for the process are as follows:

Atmosphere: 100% oxygen
Film Formation Temperature: 150° C.
Output Power: 400-800 W
Pressure: 0.5 Pa The film formation, using either quartz or single-crystal silicon for a target, had a speed of 30 to 100 Å/min.

On the top surface thereof, a silicon film in an amorphous state having a thickness of 500 to 5000 Å, e.g. 1500 Å, was formed as in Embodiment 1. In the case of using low pressure CVD method to form the amorphous silicon film as in Embodiment 1, boron may be added at a concentration of $1\times10^{15}$ to $1\times10^{18}$ cm$^{-3}$ by the use of diborane during the film formation, in order to control the threshold voltage (Vth) of the NTFT.

Then, in the same manner as in Embodiment 1, the silicon film in an amorphous state was heat-annealed at an intermediate temperature of 450 to 700° C. for 12 to 70 hours under a non-oxide atmosphere. Then, an NTFT region 13 was obtained from the silicon film by the use of a first photomask 1.

A silicon oxide film was then formed as a gate insulating film 54 in the thickness range of 500 to 2000 Å, for example, 1000 Å. This is prepared under the same conditions as the silicone oxide film formed as a blocking layer. A small amount of fluorine may be added to the film for fixation of the sodium ion during the film formation.

Figure 6B:
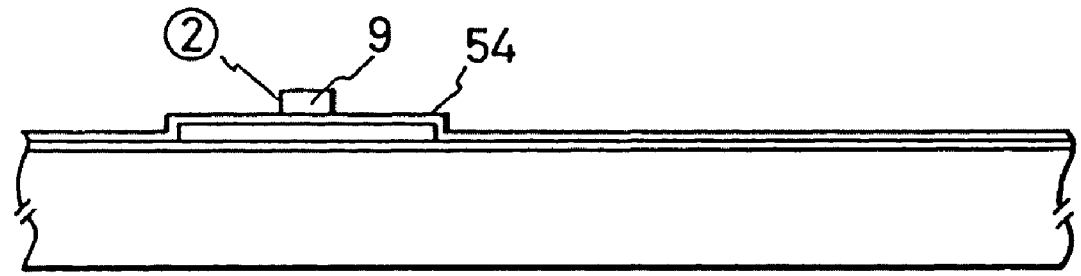
Figure 6C:
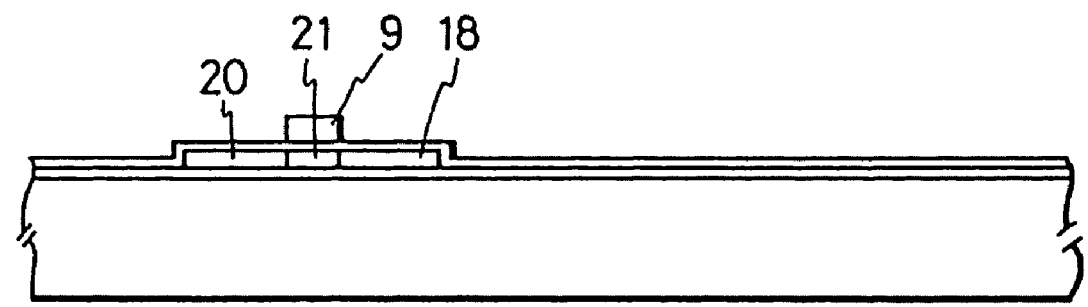
Figure 6D:
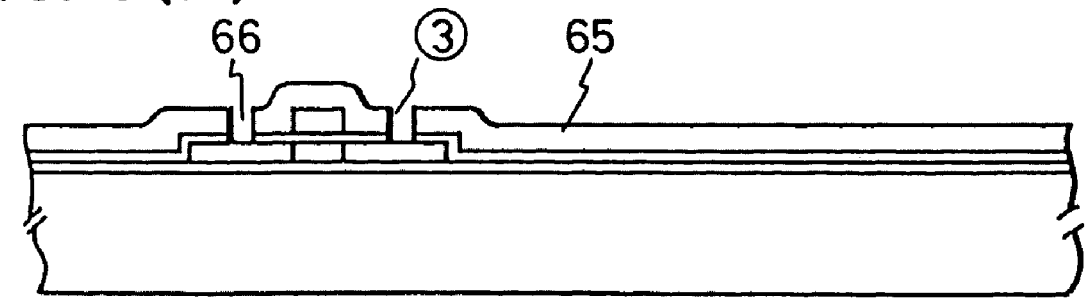
Figure 6E:
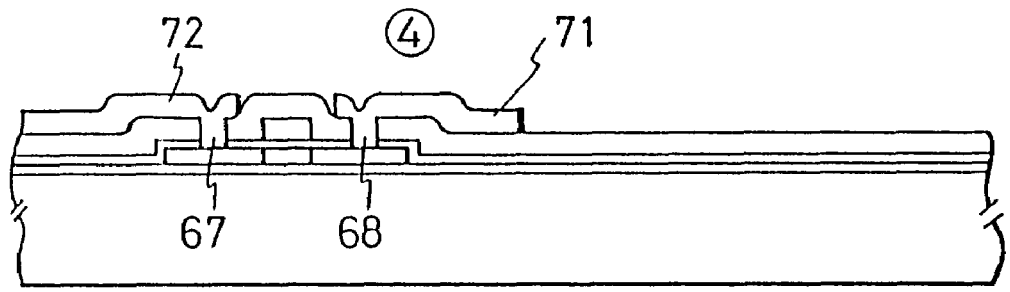

When this operation was completed, a silicon film containing a 1 to $5\times10^{21}$ cm$^{-3}$ concentration of phosphorus, or a multilayered film comprising the silicon film laminated thereon with molybdenum (Mo), tungsten (W), MoSi$_2$ or WSi$_2$ film was formed, which was then patterned with a second photomask 2 to obtain the configuration shown in FIG. 6(B). Phosphorus was added by ion implantation method at a dosage of 1 to $5\times10^{15}$ cm$^{-2}$ for a NTFT source 20 and drain 18, using the gate electrode 9 as a mask.

Also, in the case where aluminum is used as the gate electrode material, after patterning with the second photomask 2, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

The above process is carried out through the gate insulating film 54. However, in FIG. 6(B), it is possible to remove the silicon oxide formed on the silicon film using the gate electrode 9 as a mask and then add the phosphorus directly into the silicon film using the ion implantation method.

Next, annealing was again conducted for 10 to 50 hours at 600° C. The impurities were activated, whereby the source 20 and drain 18 of the NTFT were made N$^+$ regions. A channel forming region 21 of semi-amorphous semiconductor was formed below the gate electrode 9.

The entire manufacturing process for the NTFT can thus be done without having to apply a temperature above 700° C. in spite of the self-aligning system. This makes it possible to use materials other than expensive ones such as quartz for the substrate material. Accordingly, this embodiment of the invention is very suitable for a liquid crystal display having a large number of pixels.

The heat anneal process was carried out twice as shown in FIGS. 6(A) and (C). However, the anneal process of FIG. 6(A) may be omitted, depending on the desired characteristics, and followed up with the heat anneal process of FIG. 6(C), shortening the manufacturing time. Also, in FIG. 6(D), the interlayer insulating layer 65 was made of silicon oxide film using the sputtering method mentioned above.

This silicon oxide film can, however, also be formed using the LPCVD method or photo CVD method or normal pressure CVD method. The thickness of the film was e.g. 0.2 to 0.6 μm.

Next, using photo mask 3, an opening 66 for the electrodes was formed. Then, a layer of aluminum was formed on the entire surface by sputtering, and leads 71 and 72 and contacts 67, 68 were formed by using photo mask 4.

An organic resin film 69 for surface-flattening, e.g. a transparent polyimide resin film was formed, and openings for electrodes were provided using a photomask 5.

Figure 6F:
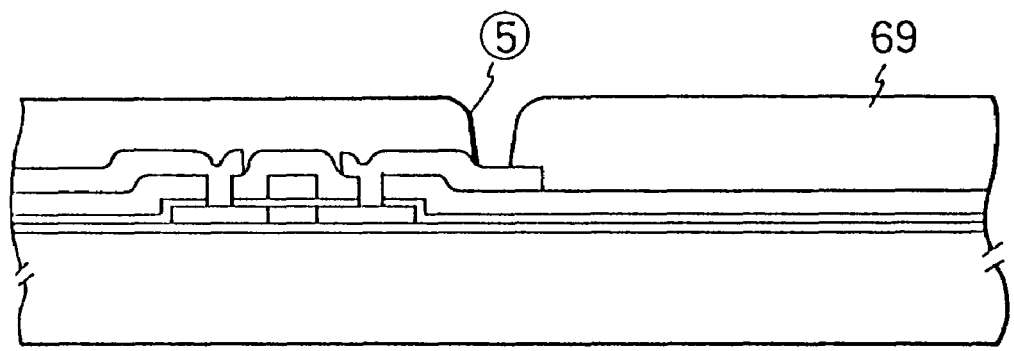
Figure 6G:
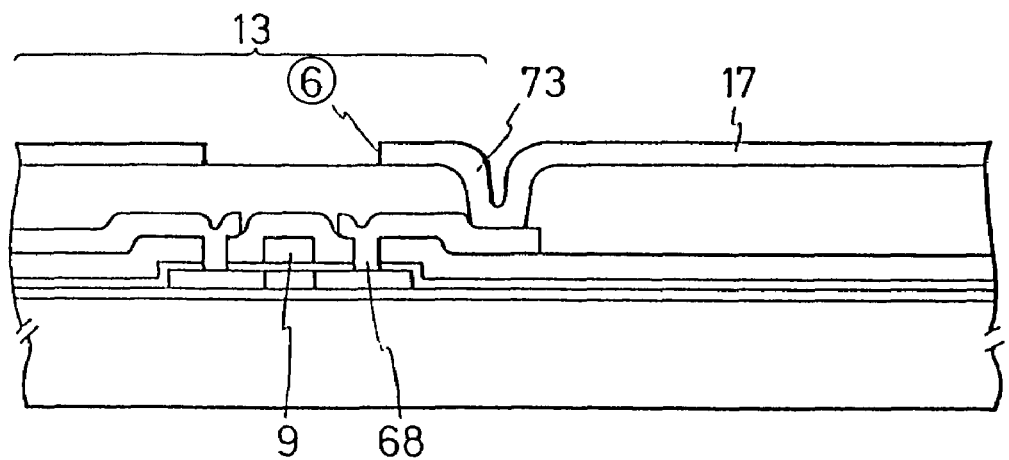

The TFT was thus formed as shown in FIG. 6(F), and further an ITO (Indium Tin Oxide) film was formed by sputtering in order that the output terminal of the TFT was connected to a transparent electrode of the picture element of the liquid crystal display device by the ITO.

The electrode was completed by etching the ITO film through a photomask 6, whereby a pixel electrode 17 and a contact 73 of the pixel electrode with the drain electrode were completed. This ITO film was formed in the range from room temperature to 150° C. and annealed at 200- to 400° C. in oxygen or atmosphere.

The NTFT 13 and the transparent pixel electrode 17 were thus prepared on an identical glass substrate 50.

The electrical characteristics of the TFT thus formed are as follows:

mobility: 40 cm$^2$/Vs
Vth: 5.0 V.

The first substrate was thus completed.

Then, a second substrate was manufactured in the same manner as the second substrate of Embodiment 1.

Then, the liquid crystal composition exhibiting ferroelectricity was interposed between the first and second substrates, and the assembly was sealed around the periphery using an epoxy-type adhesive. A drive IC of a TAB form was connected to a lead on the substrate and a polarizing plate was affixed to the outside to obtain a light-transmission type of liquid crystal display device.

FIG. 7 shows the display for the A, F, and I picture elements when the drive waveform shown in FIG. 1 is applied. This figure shows that a clear gradated display is obtained.

Embodiment 6

In this embodiment, a first substrate and a second substrate were obtained using the same process as for Embodiment 5. However, an orientation film made of polyimide was not formed on the second substrate. With these first and second substrates, a liquid crystal electro-optical device for use in a video camera viewfinder was formed at a pitch of a picture element of 60 μm and a matrix 200 high×300 wide in the same way as in Embodiment 2.

Figure 8:
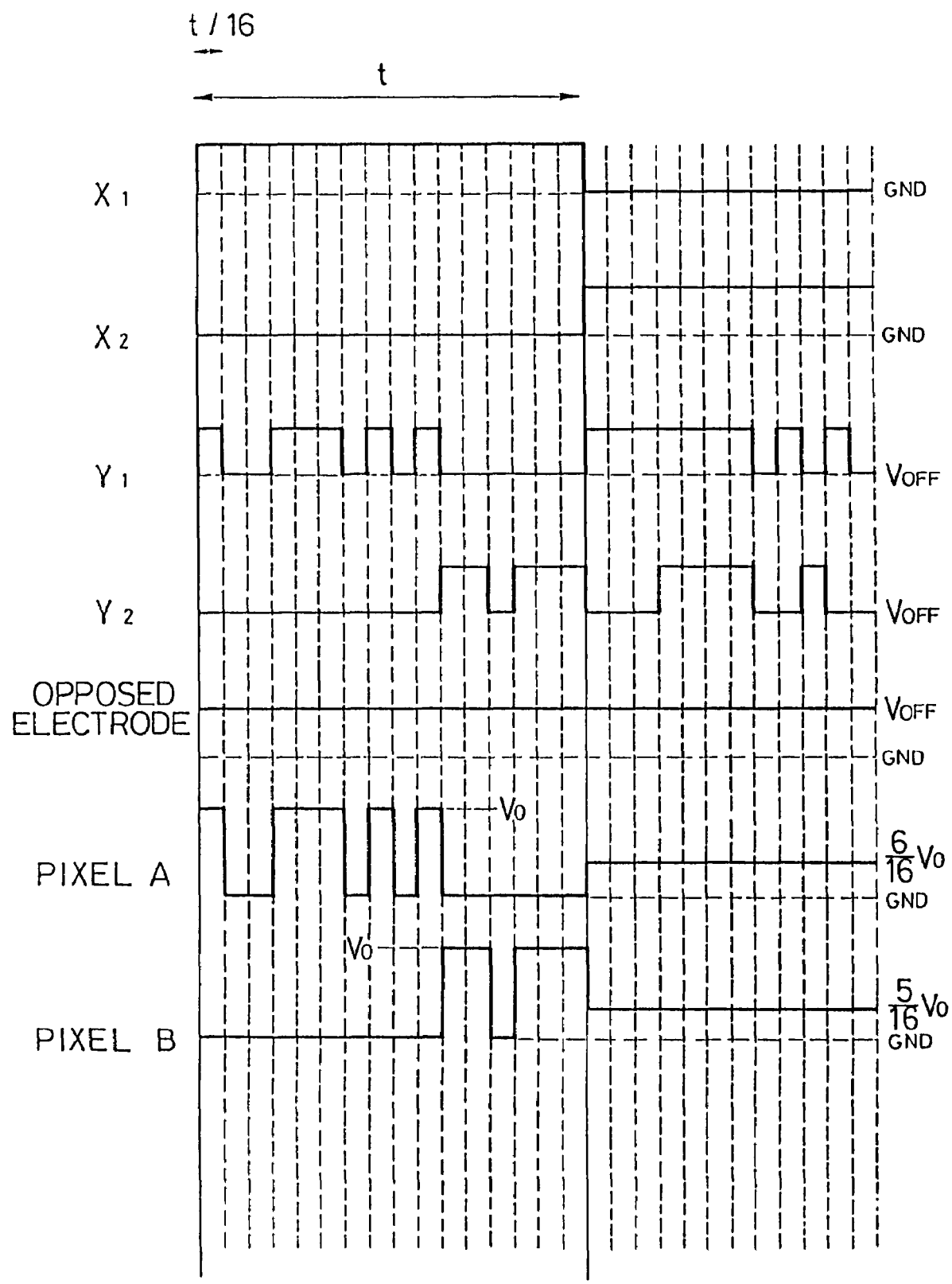
FIG. 8 shows another example of the drive waveforms in this invention.

In the drive method of the present invention shown in FIG. 8 where the unit time t for writing-in a picture element is divided into 16 minimum units (a period of each minimum unit is t/16), each color is displayed with 16 gradations, so that a display with 4096 colors is possible in total.

In this embodiment, where the frequency of the driver is increased for providing a gradated display of the present invention, a gradated display becomes possible preventing the actual frame frequency from decreasing. Therefore, the frequency never becomes lower than a visually confirmed frequency, so that a drop in display quality does not occur, and a high quality picture can be provided.

It is effective to improve the ability of gradated display over the conventional one by conducting the above-mentioned conventional method for gradated display together with the method for gradated display in accordance with the present invention. The method of the present invention is to control the average voltage applied to a liquid crystal pixel, where complete response of liquid crystal is not required.

Figure 2:
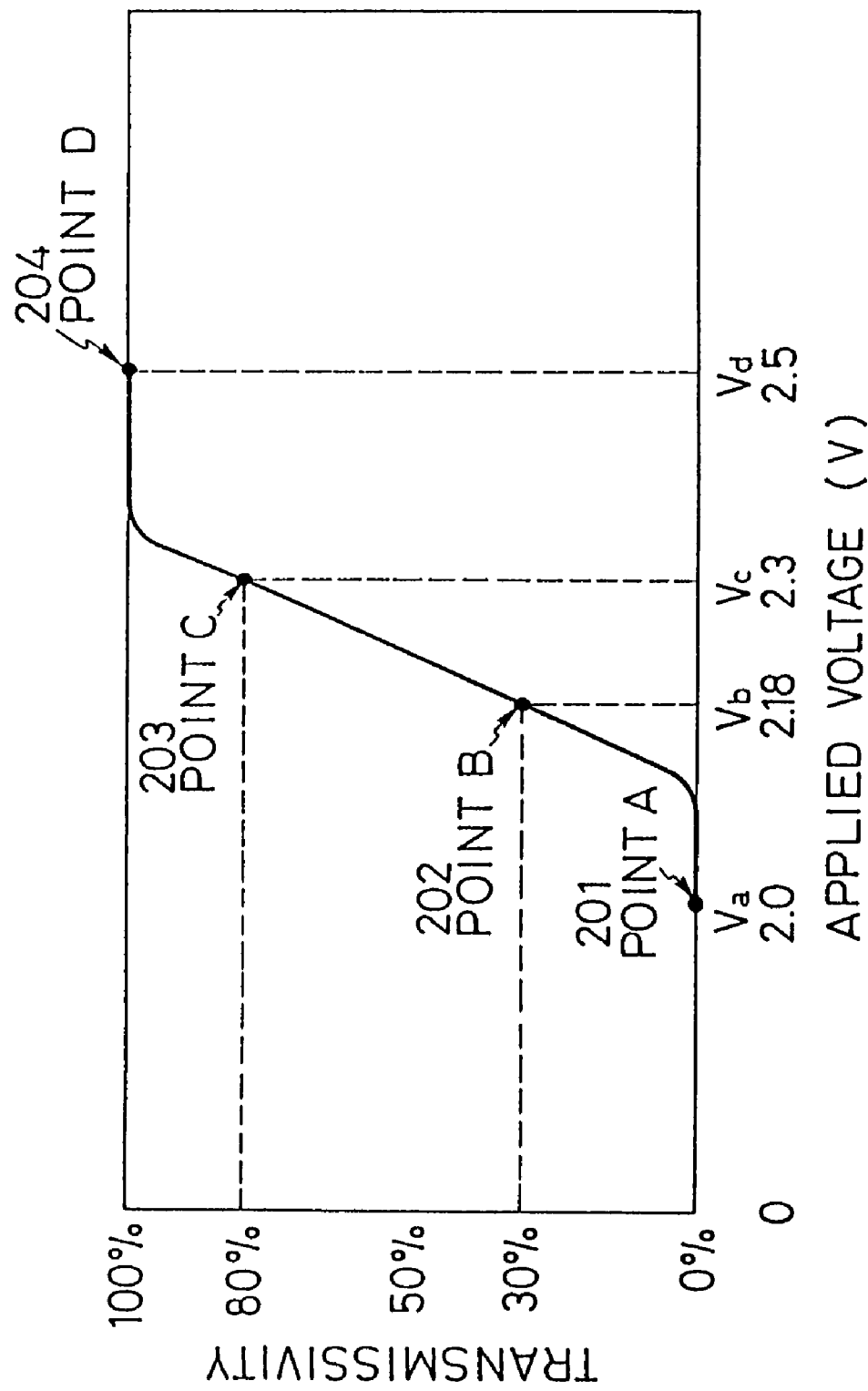
FIG. 2 is a graph showing the electro-optical characteristics of the nematic liquid crystal.

Conventionally, it was difficult to directly apply the voltages $V_b$ and $V_c$ shown in FIG. 2 to pixels. However, by changing the average of the voltage applied to pixel electrodes, an effect can be obtained as if the voltages $V_b$ and $V_c$ were directly applied to pixels.

In other words, the present invention is to provide a method for controlling liquid crystal which responds incompletely.

Although only N-channel field effect transistors are utilized in this embodiment, P-channel field effect transistors may be utilized instead.

Embodiment 7

Figure 21:
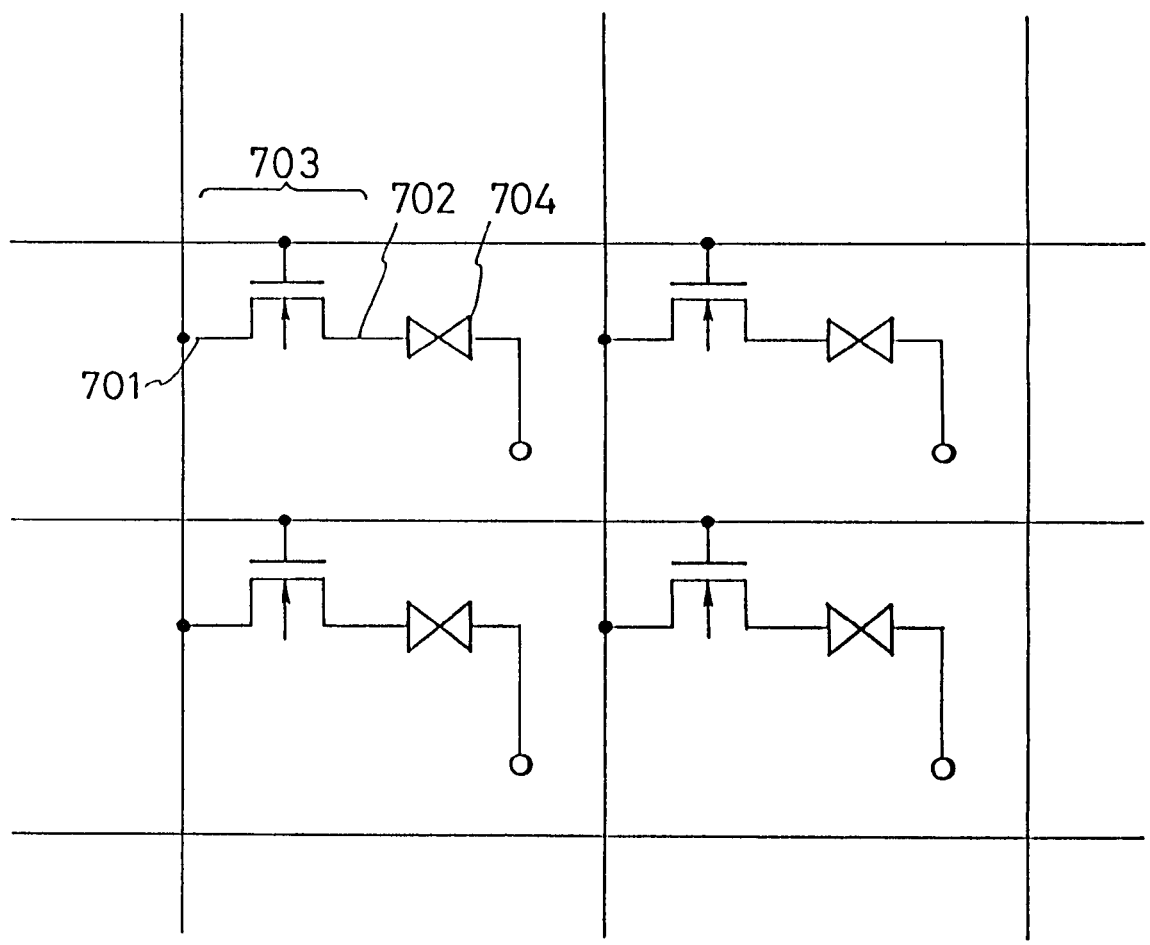
FIG. 21 is another example of the circuit configuration of a liquid crystal electro-optical device of the present invention.

In this embodiment, a liquid crystal electro-optical device (image display device) with the circuit configuration shown in FIG. 21 is utilized as a television to be hanged on the wall. The TFTs utilized therein are made of polycrystal silicon subjected to laser annealing and are of stagger type.

Referring to FIG. 21, a reference numeral 700 designates a gate electrode, 701 a source, 702 a drain, 703 a NMOSTFT, and 704 a pixel electrode.

Figure 37:
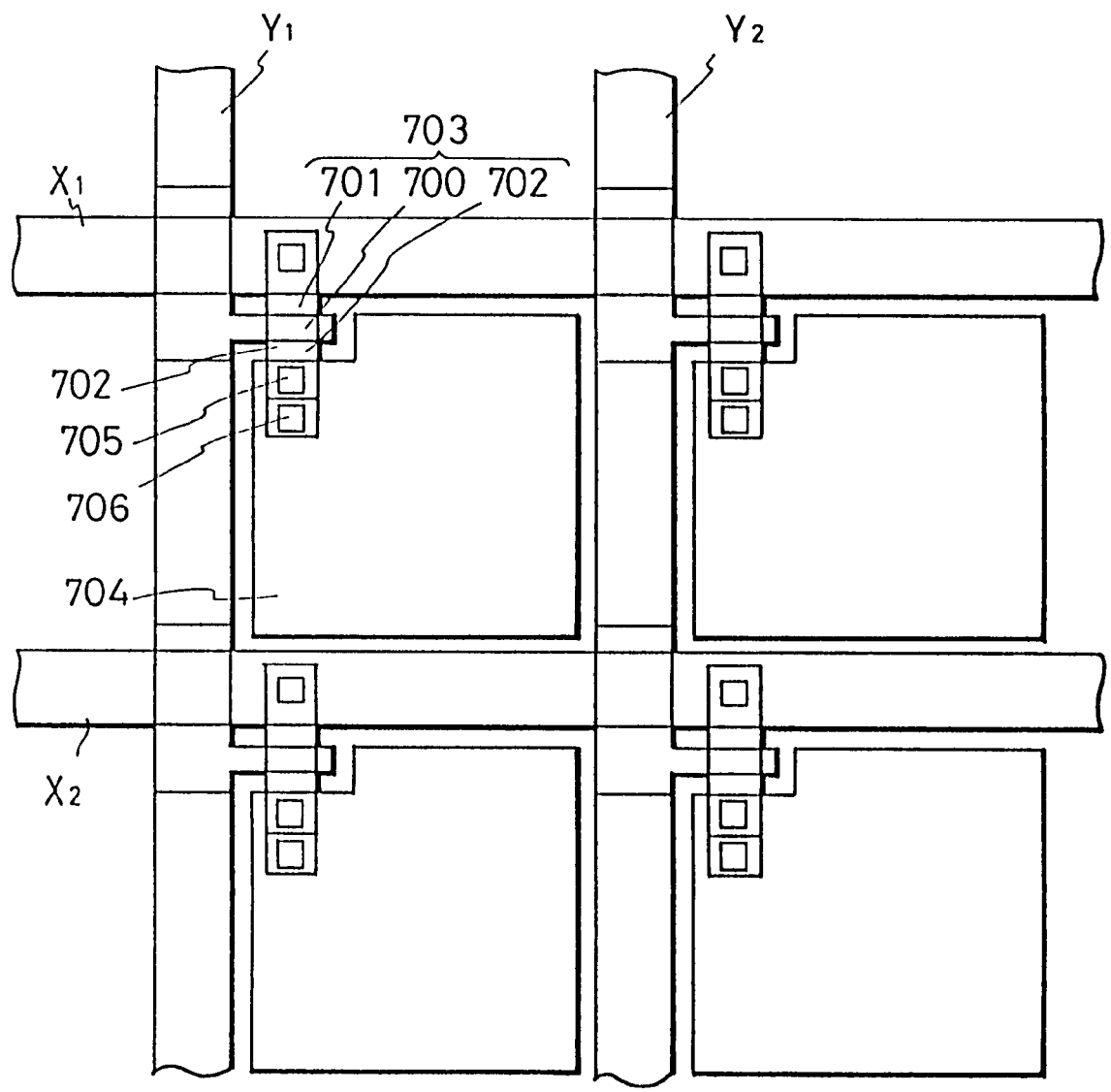
FIG. 37 is a layout of electrodes and the like of another embodiment of the present invention.

The layout of the actual electrodes and the like corresponding to the circuit configuration in FIG. 21 is shown in FIG. 37. For simplifying the explanation, the parts corresponding to a 2×2 (or less) matrix only are described. Also, the reference numerals are made so as to correspond to those in FIG. 21.

The reference numeral 705 designates a lead contact and 706 a pixel contact.

Further, the actual driving signal waveform is shown in FIG. 1. For simplicity, the explanation of the signal waveform is also given for the case of 4×4 matrix configuration.

The manufacturing process for the liquid crystal display device used in this embodiment is shown in FIG. 22.

Figure 22F:
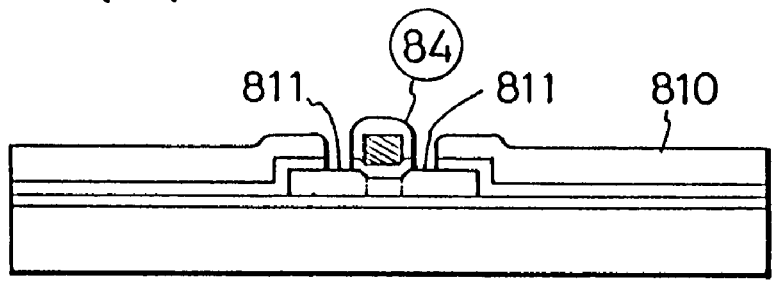
Figure 22G:
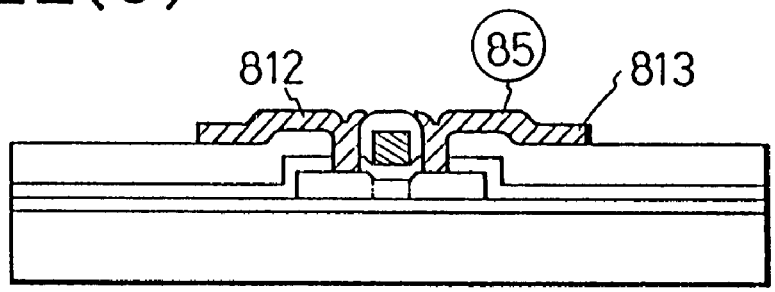
Figure 22H:
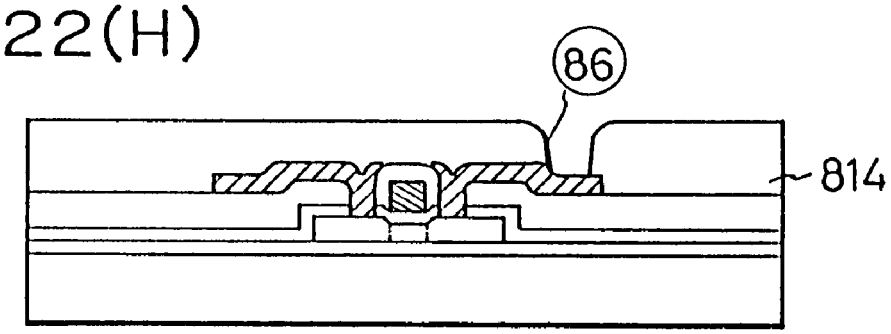
Figure 22I:
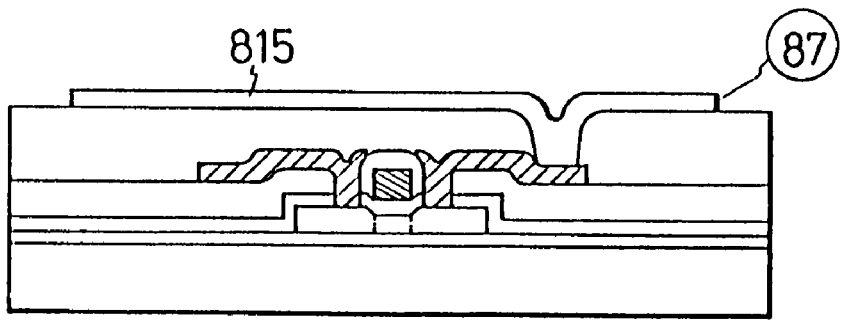
Figure 23A:
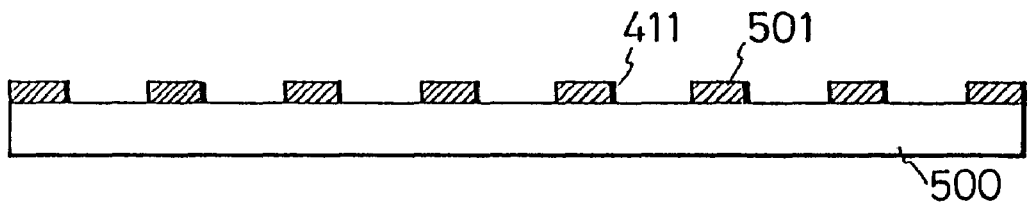
FIGS. 23(A) to 23(E) are cross-sectional views to show the formation process of a substrate of the present invention.
Figure 23B:
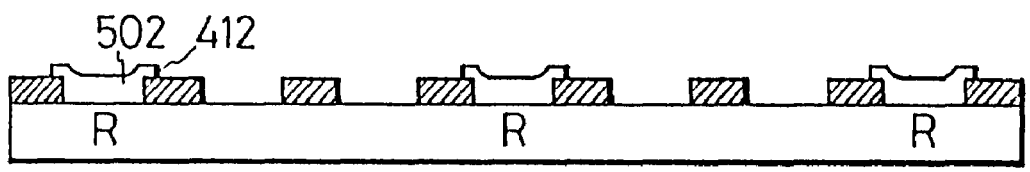
Figure 23C:
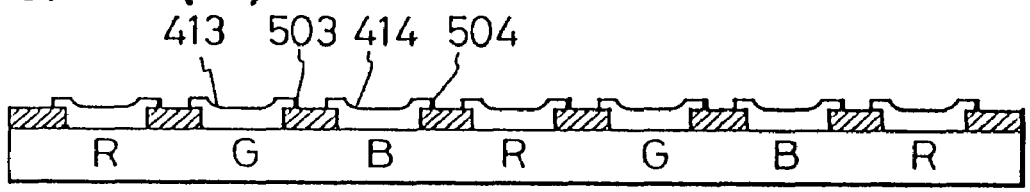
Figure 23D:
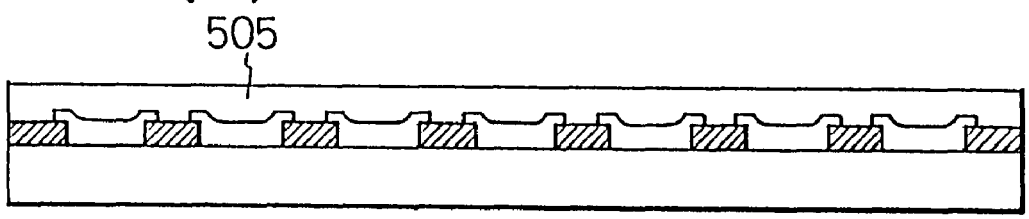
Figure 23E:
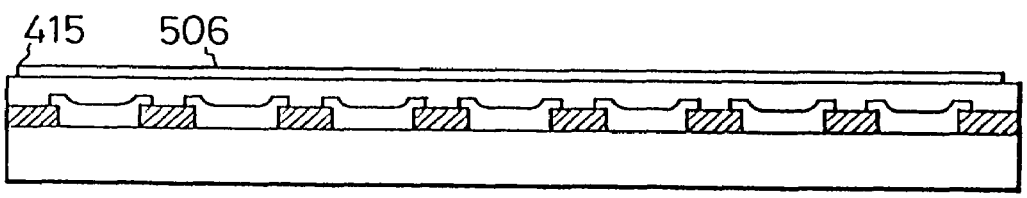

In FIG. 22(A), a silicon oxide film for a blocking layer 801 having a thickness of 1000 to 3000 angstroms was formed on a glass substrate 800, using a magnetron RF (high frequency) sputtering method. The glass substrate 800 utilized was the one which was not expensive unlike quartz glass and was resistant to heat treatment up to 700° C. e.g. of 600° C. The conditions for the process are as follows:

Atmosphere: 100% oxygen
Film Formation Temperature: 150° C.
Output Power: 400-800 W
Pressure: 0.5 Pa The film formation, using either quartz or single-crystal silicon for a target, had a speed of 30 to 100 Å/min.

On this silicon oxide film, a silicon film in an amorphous state was formed. In the case of using plasma CVD method to form this amorphous silicon film, the film formation temperature was from 250° to 350° C., e.g. 320° C. in this embodiment, and monosilane ($SiH_4$) was utilized. However, disilane ($Si_2H_6$) or trisilane ($Si_3H_8$) may be utilized instead of monosilane. The gas was inputted to a PCVD apparatus maintained at a pressure of 3 Pa and a high frequency electric power was applied thereto at a frequency of 13.56 MHz, whereby the silicon film was deposited. A high frequency electric power of 0.02, to 0.10 W/cm$^2$ was appropriate in this case, and in this embodiment a high frequency electric power of 0.055 W/cm$^2$ was applied. The flux of the monosilane was at 20SCCM and the film formation rate under this condition was about 120 Å/min.

Boron may be added at a concentration of $1\times10^{15}$ to $1\times10^{18}$ cm$^{-3}$ by using diborane during the film formation, in order to control the threshold voltage (Vth) of the NTFT.

Not only this plasma CVD method but also sputtering method and low pressure CVD method can be utilized for forming the silicon film to be a channel region in a TFT.

In the case of using a sputtering method, the conditions were as follows:

back pressure before sputtering: up to $1\times10^{-5}$ Pa
target: a single crystal silicon
atmosphere: argon with hydrogen 20 to 80% by volume
  e.g. 20 volume % Ar and 80 volume % $H_2$
the film forming temperature: 150 C
frequency: 13.56 MHz
sputter output: 400 to 800 W
pressure: 0.5 Pa If using the LPCVD method to form the silicon film, disilane ($Si_2H_6$) or trisilane ($Si_3H_8$) was supplied to the CVD apparatus at a temperature 100 to 200° C. less than the crystallization temperature, that is, 450 to 550° C., for example at 530° C. The pressure inside the reaction furnace was 30 to 300 Pa. The film forming speed was 50 to 250 Å/minute.

With respect to the film formed by these methods, it is preferable that the oxygen concentration is $5\times10^{21}$ cm$^{-3}$ or less. In order to promote crystallization of the film, it is desirable that the oxygen concentration is $7\times10^{19}$ cm$^{-3}$ or less, preferably $1\times10^{19}$ cm$^{-3}$ or less. However, if the concentration is too low, the current leak in the OFF state increases because of the back light. If the oxygen concentration is too high, crystallization becomes difficult and the laser annealing temperature must be increased or the annealing time lengthened. Silicon concentration was assumed to be $4\times10^{22}$ cm$^{-3}$ and hydrogen concentration was $4\times10$ cm$^{-3}$ which is equal to one atomic % of the silicon concentration.

Also, to promote further crystallization at the source and drain, the oxygen concentration is adjusted to $7\times10^{19}$ cm$^{-3}$ or less, or, preferably, $1\times10^{19}$ cm$^{-3}$ or less, and oxygen may be added by ion implantation to a concentration range of $5 \times 10^{20}$ to $5 \times 10^{21}$ cm$^{-3}$, only to the channel forming regions of the TFTs which form the pixels.

By the above method, the silicon film 802 in an amorphous state was formed to be 500 to 5000 Å in thickness, e.g. 1000 Å in this embodiment.

Then, photoresist 803 was formed in a pattern having openings therein on source and drain regions as shown in FIG. 22(B) by the use of a mask 1. On this structure, a silicon film 804 to be an n-type activation layer was formed by plasma CVD. The film formation temperature was 250° to 350° C., specifically 320° C. in this embodiment. Monosilane (SiH$_4$) and phosphine (PH$_3$) of monosilane base at a concentration of 3% were utilized. They were introduced into a PCVD apparatus maintained at a pressure of 5 Pa and an electric power at a high frequency of 13.56 MHz was inputted thereto, whereby the silicon film 804 was deposited. The high frequency electric power of 0.05 to 0.20 W/cm$^2$ was appropriate in this case, and in this embodiment an electric power of 0.120 W/cm$^2$ was inputted.

The n-type silicon film formed by the above method had a specific electric conductivity of about $2 \times 10^{-1}$ [$\Omega$cm$^{-1}$]. The thickness thereof was 50 Å. Then, source and drain regions 805 and 806 were formed by lift-off method. After that, an island region 807 for an N-channel thin film transistor was formed using a mask 82.

Subsequently, laser annealing to the source, drain, channel regions and laser doping to the activation layer were carried out simultaneously by the use of XeCl excimer laser. The threshold energy of this laser at this moment was 130 mJ/cm$^2$. On the other hand, in order to melt the whole film thickness, the energy of 220 mJ/cm$^2$ was necessary. However, if a laser having an energy more than 220 mJ/cm$^2$ was irradiated from the beginning, hydrogen contained in the film would be discharged rapidly, resulting in the destroy of the film. For this reason, it is necessary to firstly discharge the hydrogen at a low energy and then melt the film. In this embodiment, a laser at 150 mJ/cm$^2$ was irradiated to discharge hydrogen and then a laser at 230 mJ/cm$^2$ was irradiated to crystallize the film.

It was supposed that when annealing the silicon film, crystallization was inclined to take place in a highly ordered state from the amorphous structure, so that a crystal state was partly produced. Particularly, in the regions where a relatively highly ordered state was produced just after film forming of silicon, the tendency of crystallization to a crystal state was strong. A junction, however, took place due to the silicon between these regions, so that the silicon attracted each other.

According to laser Raman spectrometry measurement of the annealed silicon film, it was observed that a peak thereof was shifted from 522 cm$^{-1}$ of the single crystal silicon to a lower frequency side. The apparent grain diameter, when calculated using the half-value width, was 50 to 500 Å. Actually, there were many of these highly crystallized regions that made up clusters. Each cluster was joined to the other by a silicon junction (anchoring) forming a film.

Consequently, it was believed that the film could be said to have substantially no grain boundary (GB). The carriers could easily travel between the clusters through the anchored areas, so the mobility of the carriers was higher than that of the polycrystalline silicon having clear grain boundaries (GB). The electron mobility ($\mu_e$) obtained was 15 to 300 cm$^2$/Vsec.

A silicon oxide film 808 was then formed as a gate insulating film in the thickness range of 500 to 2000 Å, for example, 1000 Å. This is prepared under the same conditions as the silicon oxide film formed as a blocking layer. A small amount of fluorine may be added to this film for fixation of the sodium ion during film formation.

When this operation was completed, a silicon film containing phosphorus at 1 to $5 \times 10^{21}$ cm$^{-3}$ concentration, or a multilayered film comprising the silicon film laminated thereon with molybdenum (Mo), tungsten (W), MoSi$_2$ or WSi$_2$ film was formed. This film was patterned with a third photomask 83 to obtain the configuration shown in FIG. 22(E). A gate electrode 809 was then formed. For example, as a gate electrode, a phosphorus-doped silicon 0.2 μm thick was formed and a molybdenum layer 0.3 μm thick was formed thereon with a channel length of 7 μm.

Also, in the case where aluminum is used as the gate electrode material, after patterning with the third photomask 83, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

The entire manufacturing process for the TFT can thus be done without having to apply a temperature above 400° C. This makes it possible to use, as the substrate, materials other than expensive materials such as quartz. Accordingly, this embodiment of the invention is very suitable for a liquid crystal display having a large number of picture elements.

Then, a silicon oxide film was formed as an interlayer insulator 810 by sputtering method. In place of the sputtering method, LPCVD method, photo CVD method, and normal pressure CVD may be utilized for the formation of the silicon oxide film. The thickness of the layer was 0.2 to 0.6 μm, for example. After that, an opening 811 for electrode was formed using a forth photomask 84. On the entire surface of this structure, an aluminum film having a thickness of 0.3 μm was formed by sputtering method, and then a lead 812 and a contact 813 were formed using a photomask 85. An organic resin for surface-flattening 814, e.g. a transparent polyimide resin was then applied on the top surface, and further an opening for an electrode was again formed using a sixth photomask 86.

An ITO (Indium Tin Oxide) film of 0.1 μm thickness was formed on the entire surface of this structure by sputtering and was subsequently patterned into a pixel electrode 815 by using a seventh photomask 87. This ITO film was formed at room temperature to 150° C. and annealed at 200° C. to 400° C. in an oxygen or an atmosphere.

The electrical characteristics of the thus formed TFT were as follows:

Mobility: 80 cm$^2$/Vs

Vth: 5.0V

In accordance with the foregoing method, the first substrate for a liquid crystal electro-optical device was completed.

The method for forming the second substrate is shown in FIG. 23.

A polyimide resin film, made of polyimide mixed with black pigment, having a thickness of 1 μm was formed on a glass substrate 500 by spin coat method and was then patterned into black stripes 501 by the use of a first photomask 411.

Then, a film of polyimide resin mixed with red pigment having a thickness of 1 μm was formed by spin coat method and was subsequently patterned into red color filters 502 by the use of a second photomask 412.

In the same manner as the above, green color filters 503 were formed by the use of a third photomask 413, and blue color filters 504 by the use of a fourth photomask 414.

During the formation of the filters, the filters were baked at 350° C. for 60 min. in an nitrogen atmosphere.

Subsequently, a transparent polyimide layer was formed as a leveling layer 505 by spin coat method.

On the entire surface of the structure, an ITO film of 0.1 µm thickness was formed by sputtering and was patterned into a common electrode 506 by the use of a fifth photomask 415. This ITO film was formed at room temperature to 150° C. and annealed at 200 to 300° C. in an oxygen or an atmosphere. Thus, the second substrate was completed.

A polyimide precursor material was printed on the above substrates by off-set method and baked at 350° C. for 1 hour in an non-oxide atmosphere, e.g. in a nitrogen. Then the surface of the polyimide was subjected to a known rubbing method, so as to provide a means for orienting liquid crystal molecules in a fixed direction in at least an initial stage.

A nematic liquid crystal composition was interposed between the first and second substrates and the periphery of the substrates was sealed with an epoxy adhesive. An drive IC in TAB form and a PCB comprising a common signal wiring and an electric potential wiring were connected to the lead on the substrate, and a polarizing plate was affixed to the outside whereby a light-transmission type liquid crystal electro-optical device was obtained.

Figure 24:
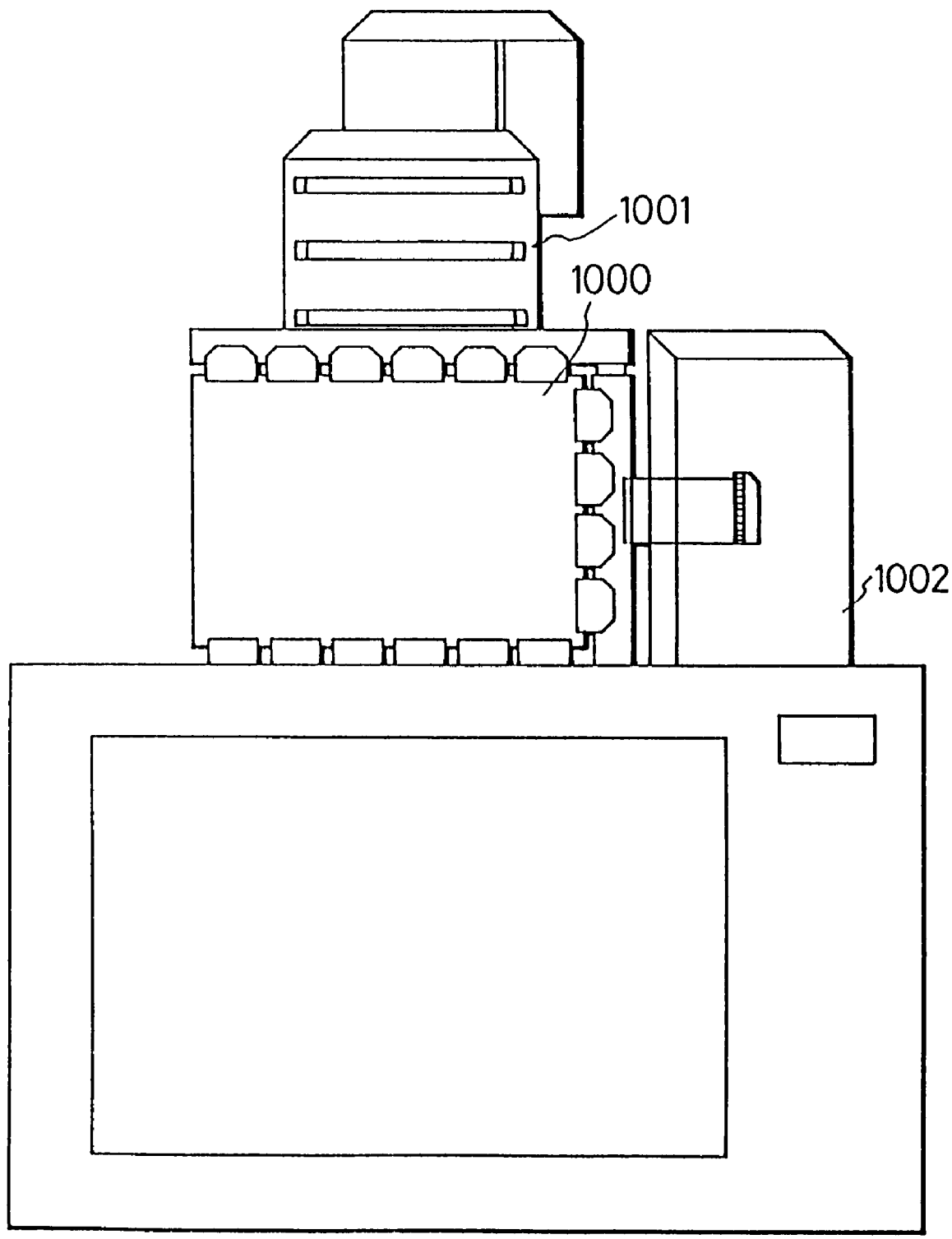
FIG. 24 shows a schematical configuration of an electro-optical device of one embodiment of the present invention.

FIG. 24 shows the schematic configuration of the electro-optical device obtained in accordance with this embodiment.

The liquid crystal panel 1000 obtained by the above steps was combined with a back light device 1001 comprising three cool cathode tubes. Then a tuner 1002 for receiving TV electric waves was connected thereto, to thereby complete an electro-optical device. Since the electro-optical device thus obtained had a flat form compared with the conventional CRT type electro-optical device, it was possible to hang it on the wall and the like.

Figure 25:
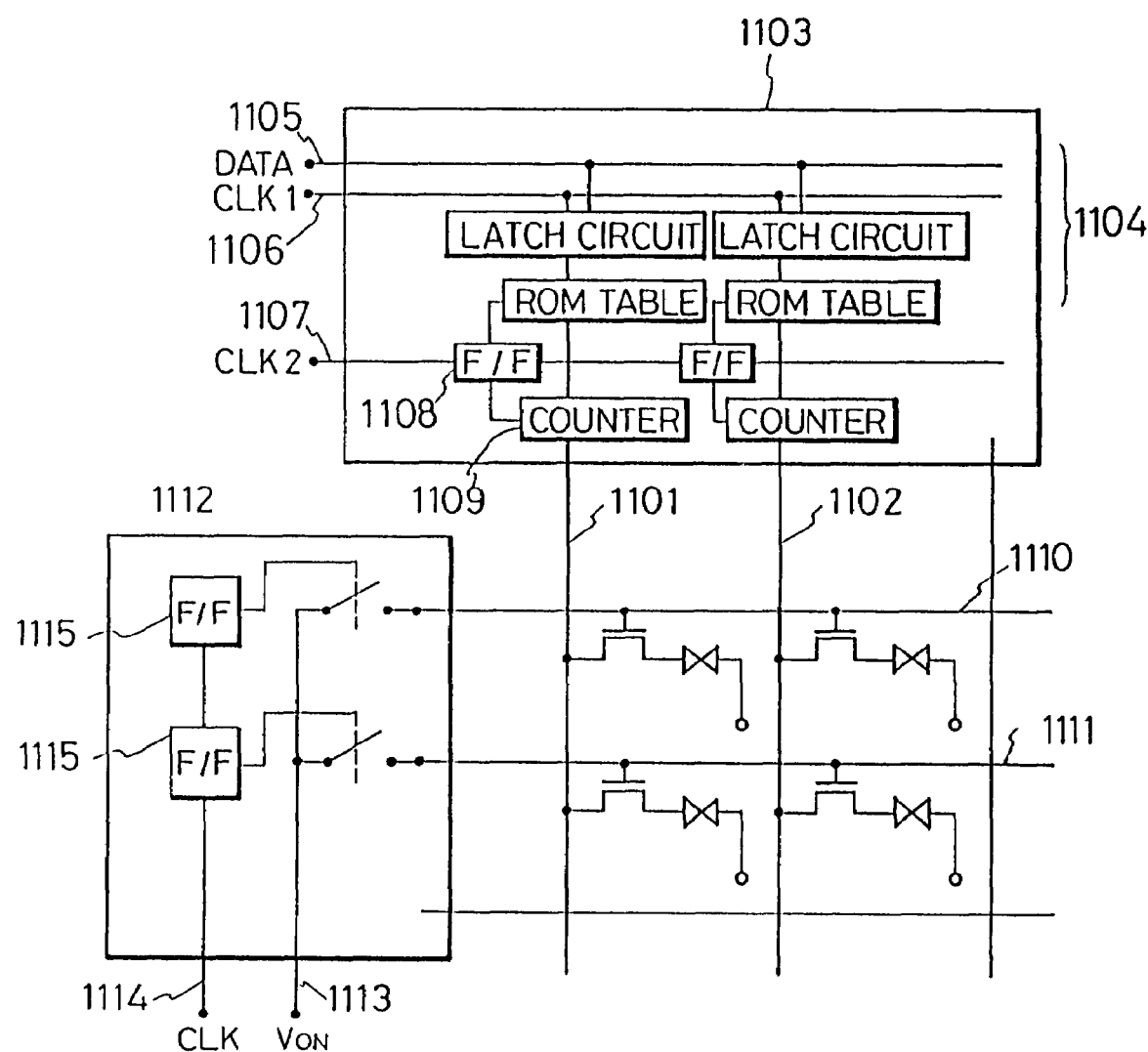
FIG. 25 shows the peripheral circuitry of a liquid crystal electro-optical device of the present invention.

Next, the configuration of a peripheral circuitry of the liquid crystal electro-optical device is described with reference to FIG. 25.

The peripheral circuitry comprises a driver circuit 1103 connected to information signal side wires 1101 and 1102 which are connected to the matrix circuit of the liquid crystal electro-optical device. The driver circuit 1103 is divided into two drive frequency systems. One of them is a data latch circuit system 1104 having a drive method same as the conventional method, where the main composition is a basic clock CLK1, 1106 for transferring data 1105 by turns and 1-12 bits parallel processing is conducted. The other is the system composed in accordance with the present invention, that is, it is composed of a flip flop circuit 1108, a counter 1109 and a clock CLK2, 1107 for the independent frequency from the data transfer frequency. Pulses are formed by the counter 1109 so as to correspond to the gradated display data transmitted from the data latch system 1104.

It is exactly this system which the present invention is characterized by. That is, by utilizing two kinds of drive frequency, a clear digital gradated display can be obtained without reducing frame numbers for rewriting a picture. Accordingly, occurrence of flicker and the like due to the reduction of the frame number can be avoided.

On the other hand, in a driver circuit 1112 connected to scanning signal lines 1110 and 1111, the electric potential transmitted from a voltage level 1113 is controlled by a flip flop circuit 1115 of a clock CLK 1114 to supply address signals.

In the TFT obtained in accordance with this embodiment the mobility was 80 cm²/Vs, so that drive frequency could be increased up to about 1 MHz. Therefore, a gradated display of up to 42 gradations was possible, the gradation number being calculated by the following formula:

1 MHz/(400*60)=42 where 1 MHz represents the drive frequency, 400 the duty number, and 60 the frame number.

In the case of an analogue gradated display method, a gradated display of 16 gradations was its limit due to the variation of the TFT characteristics. In the case of the digital gradated display method of the present invention, however, since the influence from the variation of the TFT characteristics is very little, a gradated display of 42 gradations is possible. In the case of a color display, a colorful, fine display of 74,088 colors is possible.

Embodiment 8

This embodiment describes the manufacture of a video camera viewfinder utilizing a liquid crystal electro-optical device of 1 inch diagonal.

In this embodiment, a device utilizing amorphous TFTs in a 387×128 matrix by low temperature processing was formed for a viewfinder. The manufacturing method of the liquid crystal display device utilized in this embodiment is explained below with reference to FIG. 26.

A silicon oxide film of 1000 to 3000 Å thickness was formed as a blocking layer 1201 on inexpensive glass 1200 such as soda-lime glass by magnetron RF (high frequency) sputtering method. The process conditions were as follows:

Atmosphere: 100% oxygen

Film Formation Temperature: 15° C.

Output Power: 400-800 W

Pressure: 0.5 Pa.

Quartz or single-crystal silicon was utilized as a target, and the film formation speed was 30 to 100 Å/min.

Figure 26A:
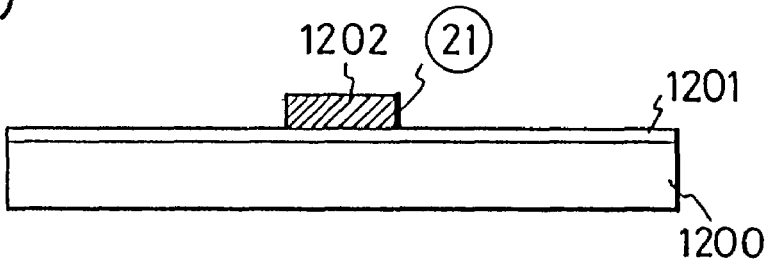
FIGS. 26(A) to 26(E) are cross-sectional views to show the manufacturing process of a liquid crystal device of one embodiment of the present invention.
Figure 26B:
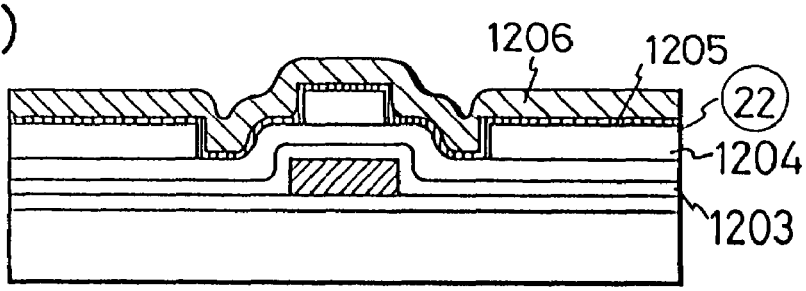
Figure 26C:
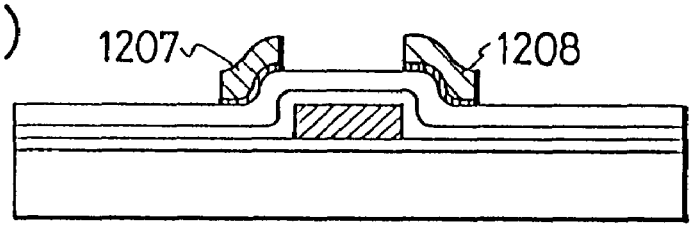
Figure 26D:
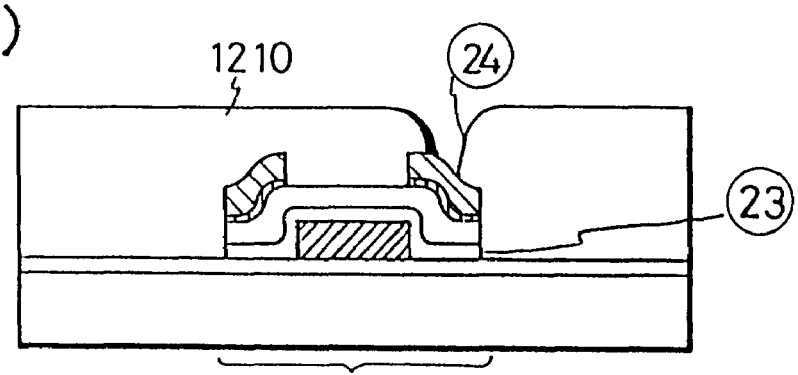
Figure 26E:
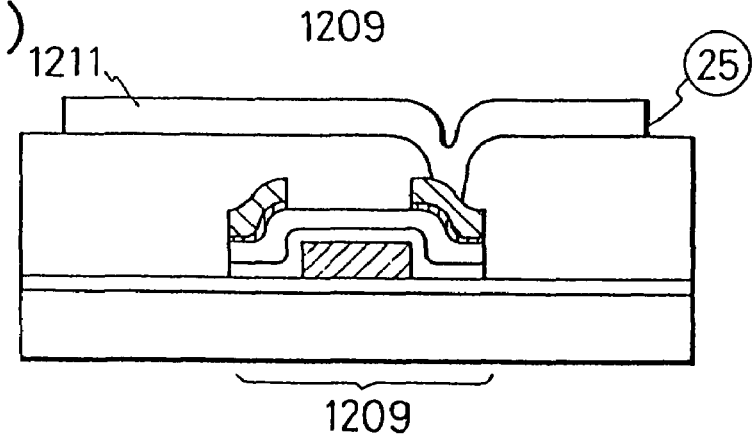

Then, a silicon film containing a 1 to $5\times10^{21}$ cm$^{-3}$ concentration of phosphorus, or a multilayered film comprising the silicon film laminated thereon with molybdenum (Mo), tungsten (W), $MoSi_2$ or $WSi_2$ film was formed, which was then patterned with a first photomask 21 to form a gate electrode 1202 as in FIG. 26(A). In this embodiment, the channel length was 10 µm and as a gate electrode a phosphorus doped silicon film of 0.2 µm thickness was formed and a molybdenum film of 0.3 µm thickness was formed further thereon.

In the case of utilizing aluminum (Al) for the gate electrode material, after patterning with the first photomask 21, it is possible to prevent the occurrence of cracks, voids in a channel region or an insulating layer on the gate electrode by anodic oxidation of this surface of the patterned aluminum gate electrode. Therefore, the TFT characteristics can be further increased by improving mobility and decreasing the threshold voltage.

A silicon oxide film was then formed as a gate insulating film 1203 in the thickness range of 500 to 2000 Å, e.g. 1000 Å. This was prepared under the same conditions as the silicon oxide film formed as a blocking layer. A small amount of fluorine may be added to this film for fixation of the sodium ions during the film formation.

An amorphous silicon film was then formed on this structure by plasma CVD method. When forming a silicon film by plasma CVD, the temperature was maintained at e.g. 300° C. and monosilane ($SiH_4$) or disilane ($Si_2H_6$) was utilized. The gas was introduced into a PCVD apparatus and a high frequency electric power of 13.56 MHz was inputted thereto, whereby the film was formed.

With respect to the film formed by the above method, it is preferable that the oxygen concentration is $5\times10^{21}$ cm$^{-3}$ or less. If the oxygen concentration is higher than this range, the mobility is decreased. If the concentration is too low, the current leak in the OFF state increases because of the back light. For this reason, the concentration is held in the range from $4\times10^{19}$ to $4\times10^{21}$ cm$^{-3}$. Silicon concentration was assumed to be $4\times10^{22}$ cm$^{-3}$. Hydrogen concentration was $4\times10^{20}$ cm$^{-3}$ which is equal to one atomic % of the silicon concentration. In accordance with the above method, a silicon film in an amorphous state was formed to be 500 to 5000 Å, e.g. 1500 Å thick.

Then, a resist film 1204 for forming a contact region by lift-off method was formed utilizing a second photomask 22, and on the top surface a silicon film 1205 to be an n-type activation layer was formed by plasma CVD. The film formation temperature was in the range from 250° to 350° C.; at 320° C. in this embodiment. Monosilane and monosilane-based phosphine (PH$_3$) at a concentration of 1% and hydrogen (H$_2$) were introduced at a ratio of 5:3:20 into a PCVD apparatus at a pressure of 5 Pa and a high frequency electric field at 13.56 MHz was applied to form the silicon film. At this moment, a high frequency electric power of 0.05 to 0.20 W/cm$^2$ was appropriate, and an electric power of 0.120 W/cm$^2$ was utilized in this embodiment.

The thus formed silicon film 1205 to be an n-type activation layer had a specific electric conductivity of about $2\times10^{-1}$ Ωcm$^{-1}$. The film thickness thereof was 50 Å. Then, aluminum film 1206 of 3000 Å thickness was formed for a lead and a contact electrode by sputtering. Unnecessary portions of the aluminum film were removed by lift-off method to form a source region 1207 and a drain region 1208.

After forming each TFT 1209 in the form of island by the use of a third photomask 23, an organic resin 1210 for surface-flattening, e.g. a transparent polyimide resin, was applied as shown in FIG. 12(D), and an opening for electrode was again formed by the use of a photomask 24.

In order to connect the output end of the NTFT to one of transparent pixel electrodes of the liquid crystal device, an ITO (Indium Tin Oxide) film was formed by sputtering method. The ITO film was subjected to etching by using a photomask 25 to form an electrode 1211. The ITO film was formed at room temperature to 150° C. and annealed at 200° C. to 400° C. in an oxygen or an atmosphere. Thus, an NTFT 1209 and an electrode 1211 made of a transparent conductive film were formed on an identical glass substrate 1200. The electrical characteristics of the thus obtained TFT were as follows:

Mobility: 0.2 cm$^2$/Vs
Vth: 5.3V.

Next, in the same manner as in Embodiment 7, color filters and a transparent conductive film of ITO were formed to a thickness of 1000 Å on an insulating substrate to obtain a second substrate.

On the substrates, a polyimide precursor material was printed by off-set printing and baked at 350° C. for 1 hour in an non-oxidation atmosphere, e.g. in nitrogen. The surfaces of the polyimide were then subjected to a known rubbing treatment so as to provide a means for orienting liquid crystal molecules in a fixed direction in at least an initial stage. Thus, the first and second substrates were completed.

Then a nematic liquid crystal composition was interposed between the first and the second substrates, and the periphery thereof was sealed with an epoxy adhesive. Since the pitch of the leads on the substrate was so fine as 46 μm, the connection was carried out by the use of COG method. In this embodiment, leads were connected to gold bumps provided on an IC chip by means of a silver paradium resin of epoxy system, and then an epoxy transformed acrylic resin was filled in the space between the substrate and the IC chip for the purpose of fixing and enclosing the IC chip and the substrates. Then a polarizing plate was affixed to the outside thereof, whereby a light-transmission type liquid crystal display device was obtained.

With the TFT in accordance with this embodiment, the mobility of 0.2 cm$^2$/Vs could be obtained in spite of the amorphous state, and accordingly the drive frequency could be increased to about 100 KHz. Therefore, a gradated display having 13 gradations was possible, the gradation number being calculated by the following formula:

$$100 \text{ KHz}/(128*60)=13$$

where 100 KHz represents a drive frequency; 128 duty, number, and 60 a frame number. When carrying out the usual analogue gradated display with a liquid crystal electro-optical device of 50 mm square size (the substrate of which size is obtained by dividing 300 mm square substrate into 36 plates) on which TFTs of 384×128 49,152 were formed, the variation of the amorphous TFT characteristic was about +10%, so that a gradated display of 8 gradations was its limit. In the case of carrying out the digital gradated display method of the present invention, the method was not affected by the variation of TFT characteristic so much, so that a gradated display of 13 gradations or more was possible. In the case of a color display, a colorful, fine display of 2027 colors was possible.

Embodiment 9

Figure 27A:
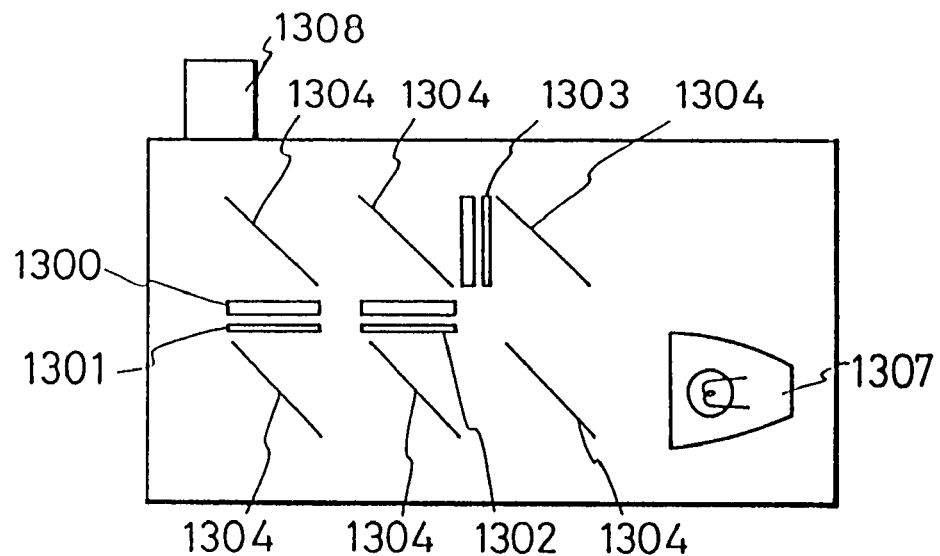
FIG. 27 shows an assembly of a projection type image display of one embodiment of the present invention.
Figure 27B:
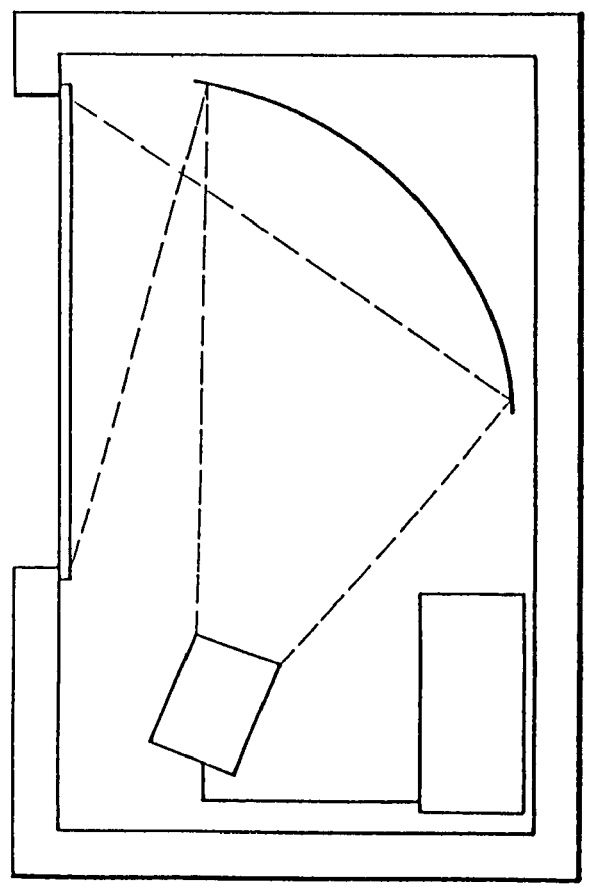

This embodiment describes the manufacture of a projection type image display device as shown in FIG. 27.

In this embodiment, an image projecting part for a projection type image display device was assembled using three liquid crystal electro-optical devices 1300. Each of them had a 640×480 dot matrix, and 307,200 pixels were-formed within the size of 4 inch diagonal. The size of one pixel was 127 μm square.

The projection type image display device is composed of three liquid crystal electro-optical devices 1300 for three primary colors of light, i.e. red, green, and blue respectively, a red color filter 1301, a green color filter 1302, a blue color filter 1303, reflection boards 1304, a metal halide light source 1307 of 150 W, and an optical system for focus 1308.

The substrate of the liquid crystal electro-optical device utilized for an electro-optical device of this embodiment was the one having the NMOS configuration and a matrix circuitry. A device comprising high mobility TFTs formed by low temperature process was utilized to compose the projection type liquid crystal electro-optical device.

The manufacturing method for the liquid crystal display device utilized in this embodiment is explained hereinafter with reference to FIG. 28.

Figure 28A:
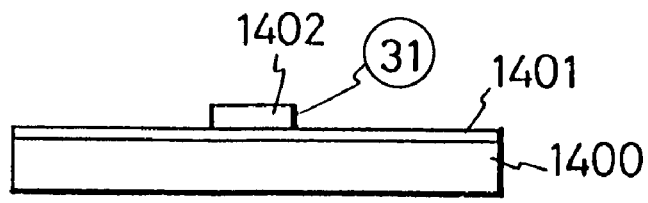
FIGS. 28(A) to 28(G) are cross-sectional views to show the manufacturing process of a liquid crystal display device of one embodiment of the present invention.

A silicon oxide film of 1000 to 3000 Å thickness was formed as a blocking layer 1401 on glass 1400 by magnetron RF (high frequency) sputtering as shown in FIG. 28(A). The glass was the one which was not expensive unlike quartz glass or so and was resistant to thermal treatment at not higher than 700° C., e.g. about 600° C. The process conditions of the film formation were the same as those for the silicon oxide film as a blocking layer in Embodiment 1.

On the silicon oxide film, a silicon film in an amorphous state was formed to be 500 to 5000 Å thick, e.g. 1500 Å thick, in the same manner as the case of the silicon film in an amorphous state in Embodiment 1.

As in Embodiment 1, the silicon film in an amorphous state was then annealed at an intermediate temperature of 450° C. to 700° C. for 12 to 70 hours in a non-oxide atmosphere.

Then the silicon film was subjected to photo etching by the use of a first photomask 31 to form a region 1402 for TFT (having a channel width of 20 μm), as shown in FIG. 28(A).

A silicon oxide film of 500 to 2000 Å thickness, e.g. 1000 Å thickness, was then formed as a gate insulating film 1403. The formation conditions thereof were the same as those for the silicon oxide film as a blocking layer. A small amount of fluorine may be added during the film formation for fixation of sodium ions.

Figure 28B:
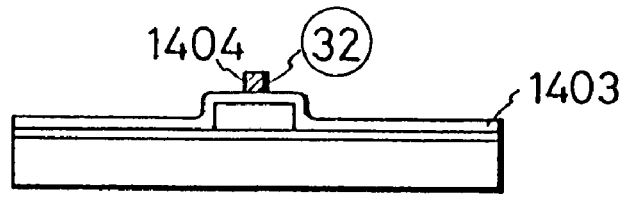
Figure 28C:
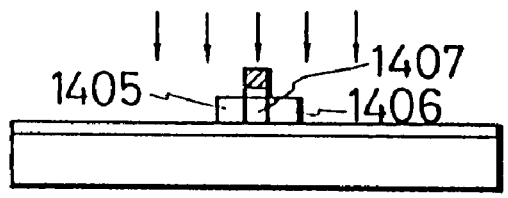

Then, a silicon film containing a 1 to $5 \times 10^{21}$ cm$^{-3}$ concentration of phosphorus, or a multilayered film comprising the silicon film laminated thereon with molybdenum (Mo), tungsten (W), $MoSi_2$ or $WSi_2$ film was formed, which was subsequently patterned with a second photomask 32 to form a gate electrode 1404 as in FIG. 28(B). In this embodiment, a channel length was made 10 μm, and as a gate electrode the phosphorus doped silicon of 0.2 μm thickness was formed and further a molybdenum film of 0.3 μm thickness was laminated thereon. In FIG. 28(C), phosphorus was added by ion implantation method at a dosage of 1 to $5 \times 10^{15}$ cm$^{-2}$ to form a source 1405 and a drain 1406.

In the case of utilizing aluminum (Al) as a gate electrode material, after patterning with the second photomask 32, it is possible to form the source and drain contact holes at positions closer to the gate by anodic oxidation of this surface of the patterned aluminum gate electrode so that self-aligning construction can be applied. Therefore, the TFT characteristics can be further increased by improving the mobility and decreasing the threshold voltage.

Next, heat annealing was again carried out at 600° C. for 10 to 50 hours. Impurities in the source 1405 and the drain 1406 were activated to make the source and drain N$^+$ regions. A channel forming region 1407 of semi-amorphous semiconductor was formed below the gate electrode 1404.

The entire manufacturing process for the NTFT can thus be done without having to apply a temperature above 700° C. in spite of the self-aligning system. This makes it possible to use materials other than expensive ones such as quartz for substrates. Accordingly, this embodiment of the invention is very suitable for a liquid crystal display having a large number of pixels.

Figure 28D:
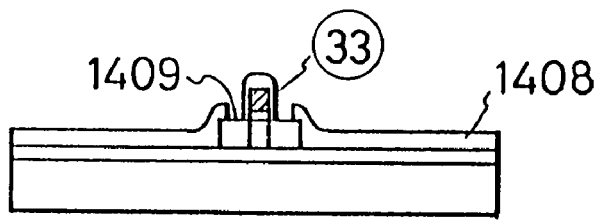
Figure 28E:
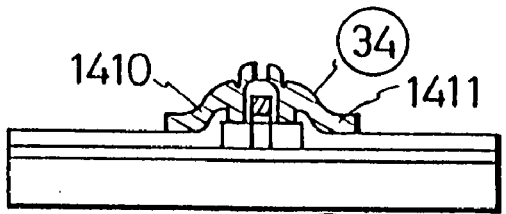
Figure 28F:
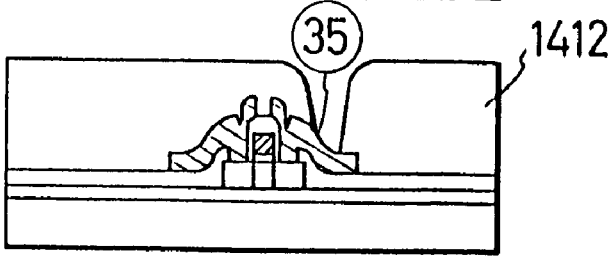
Figure 28G:
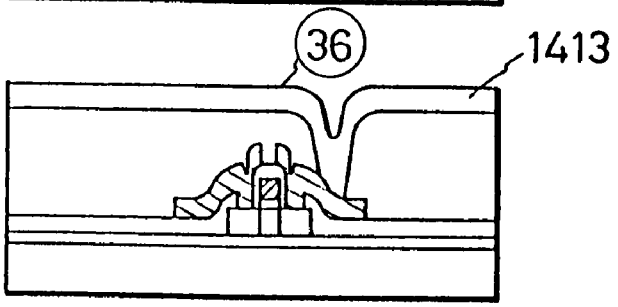

In this embodiment, the heat annealing process was carried out twice as shown in FIGS. 28(A) and (C). However, the anneal process of FIG. 28(A) may be omitted, depending on the desired characteristics, and followed up with the heat anneal process of FIG. 28(C), shortening the manufacturing time. In FIG. 28(D), an interlayer insulating layer 1408 was made of silicon oxide film using the sputtering method mentioned above.

This silicon oxide film can, however, be formed using the LPCVD method, photo CVD method or normal pressure CVD method.

The thickness of the insulating layer was e.g. 0.2 to 0.6 μm.

Next, using photomask 33, an opening 1409 for the electrodes was formed. Then, a layer of aluminum was formed over the entire structure using the sputtering method, and a lead 1410 and a contact 1411 were formed using photomask 34.

An organic resin film 1412 for surface-flattening, e.g. a transparent polyimide resin film was formed, and an opening for an electrode was formed using photomask 35.

In order to connect the output terminal of the NTFT to the transparent electrode of the pixel of the liquid crystal device, an ITO (Indium Tin Oxide) film was formed by sputtering. The ITO film was etched by the use of a photomask 36 to form an electrode 1413. The ITO film was formed at room temperature to 150° C. and annealed at 200 to 400° C. in an oxygen or an atmosphere.

Thus, the NTFT 1402 and the electrode 1413 of a transparent conductive film were formed on an identical glass substrate 1400. The electrical characteristics of the obtained TFT were as follows:

Mobility: 120 cm$^2$/Vs

Vth: 5.0V.

Figure 29:
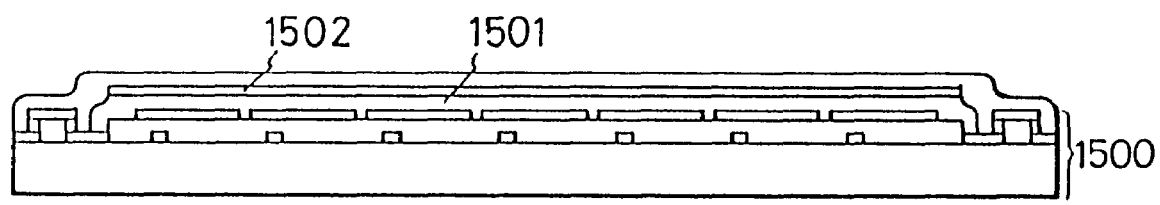
FIG. 29 shows a schematic configuration of a liquid crystal electro-optical device of one embodiment of the present invention.

A schematic view of the structure is shown in FIG. 29. On the substrate (1500 in FIG. 29) mentioned above, a mixture of 10 μm thickness was formed by die-cast method, the mixture comprising fumaric acid polymeric resin and nematic liquid crystal both dissolved at a ratio of 65:35 in a common solvent, xylene. Then the above structure was heated at 120° C. for 180 min. in a nitrogen atmosphere to remove the solvent, whereby a liquid crystal dispersion layer 1501 was formed. It was found that tact-time could be shortened by making the pressure a bit lower than the atmospheric pressure at the moment.

Then, an ITO film was formed by sputtering to obtain an opposed electrode 1502. This ITO film was formed at room temperature to 150° C. A transparent silicon resin was then applied to be 30 μm thick by printing method and was baked at 100° C. for 30 min. to thereby obtain a liquid crystal electro-optical device.

The configuration and the function of the driver IC utilized in this embodiment is the same as that in Embodiment 7.

When a usual analogue gradated display was carried out with a liquid crystal electro-optical device where 307,200 TFTs in 640×480 dot matrix were formed within 300 mm square, the variation in TFT characteristics was as large as about ±10%, so that a gradated display of up to 16 gradations was its limit. In the case of the TFTs formed in this embodiment, however, since the drive frequency can be increased up to 2.5 MHz, a gradated display of up to 86 gradations is possible, the gradation number being calculated by the following formula:

$$2.5 \text{ MHz}/(480 \times 60) = 86$$

where 2.5 MHz represents the drive frequency, 480 the number of scanning lines, and 60 the number of frames.

In the case of the digital gradated display method in accordance with this embodiment, the method is not affected by the variation in TFT characteristics so much, so that a gradated display of 86-gradations is possible. With regard to a color display, a colorful, fine display having 262,144 colors can be obtained.

A conventional television set utilizing a liquid crystal display having 16 gradations is not suitable for displaying a natural landscape, for example a 'lock' of one color, since a hollow (uneven) surface of the 'lock' of one color should be displayed by subtly different colors in order to express a variety of shades of the hollow (uneven) surface in sunshine. However, the gradated display in accordance with the present invention makes it possible to project a picture, e.g. a 'lock' of one color, with variations of fine tone.

This liquid crystal electro-optical device is applicable not only to a front type projection TV as shown in FIG. 27 but also a rear type projection TV.

Embodiment 10

Figure 30:
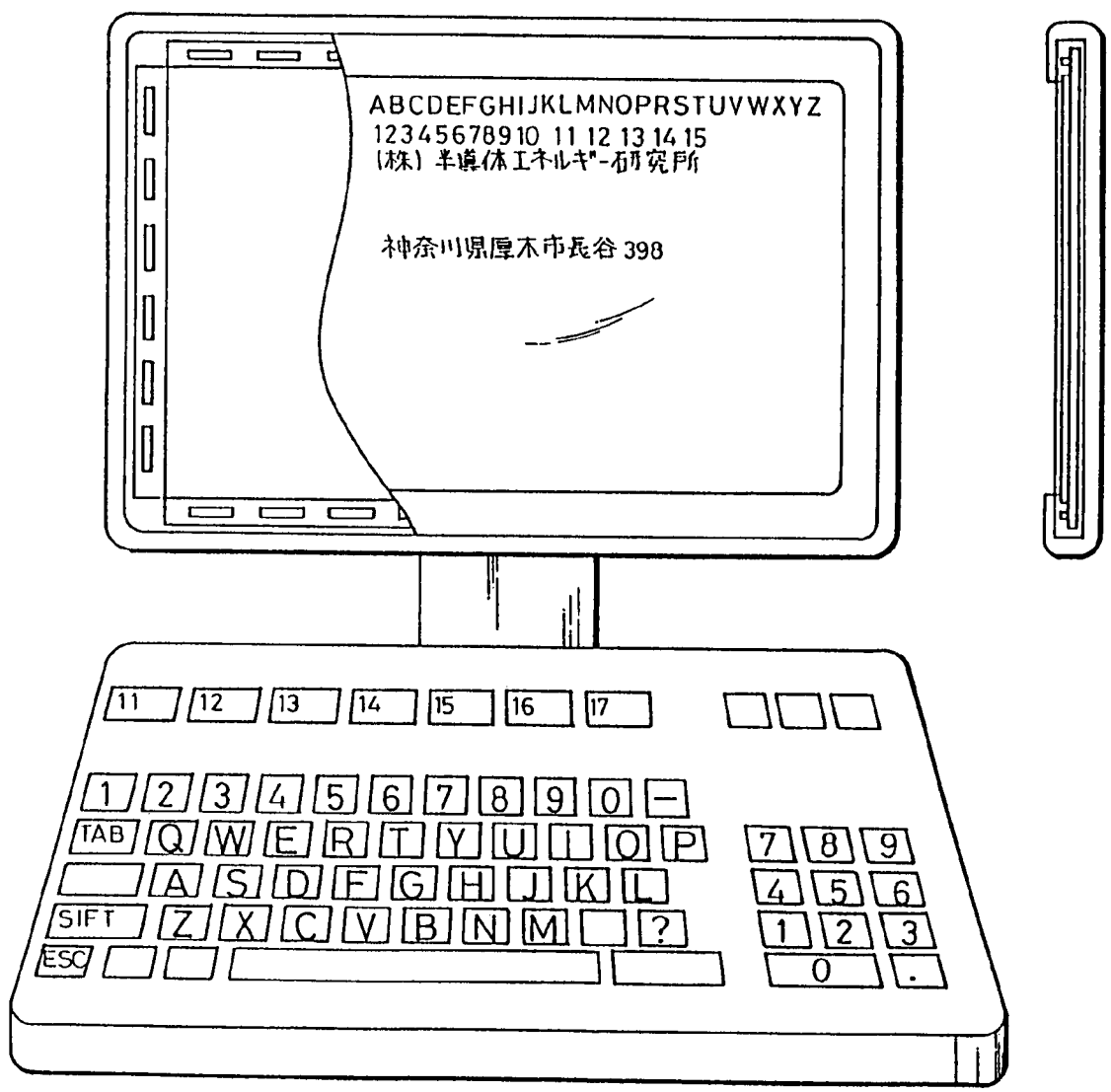
FIG. 30 shows a schematic configuration of a reflection type liquid crystal dispersion display device of one embodiment of the present invention.

This embodiment shows the manufacture of an electro-optical device for a portable computer utilizing a liquid crystal dispersion type display device of reflection type as shown in FIG. 30.

The first substrate utilized in this embodiment was formed by the same steps as in Embodiment 7.

This embodiment will be explained below utilizing the liquid crystal electro-optical device shown in FIG. 29.

Fumaric acid polymeric resin and a nematic liquid crystal mixed with a black pigment at 15% were dissolved in a common solvent, xylene at a ratio of 65:35. This solution was formed to a thickness of 10 μm on the substrate 1500 by die-cast method and was then heated at 120° C. for 180 min. in a nitrogen atmosphere to remove the solvent, whereby a liquid crystal dispersion layer 1501 was obtained.

Then, an ITO film was formed by sputtering to obtain an opposed electrode 1502. This ITO film was formed at room temperature to 150° C. Then, a silicon resin of white color of 55 μm thickness was applied on the rear surface by printing method and baked at 100° C. for 90 min to obtain a liquid crystal electro-optical device.

By utilizing the black pigment as the above, it became possible to display black color displayed when the light was dispersed (i.e. when no electric fields were applied) and also white color when the light was transmitted (i.e. when electric fields were applied), whereby a display as if characters were written on a paper could be obtained.

Alternatively, it was possible to display white color when the light was dispersed and black color when the light was transmitted, without mixing the black pigment. In this case, however, it was necessary to make the rear surface black. A display as if characters were written on a paper could be also obtained.

Embodiment 11

Figure 31:
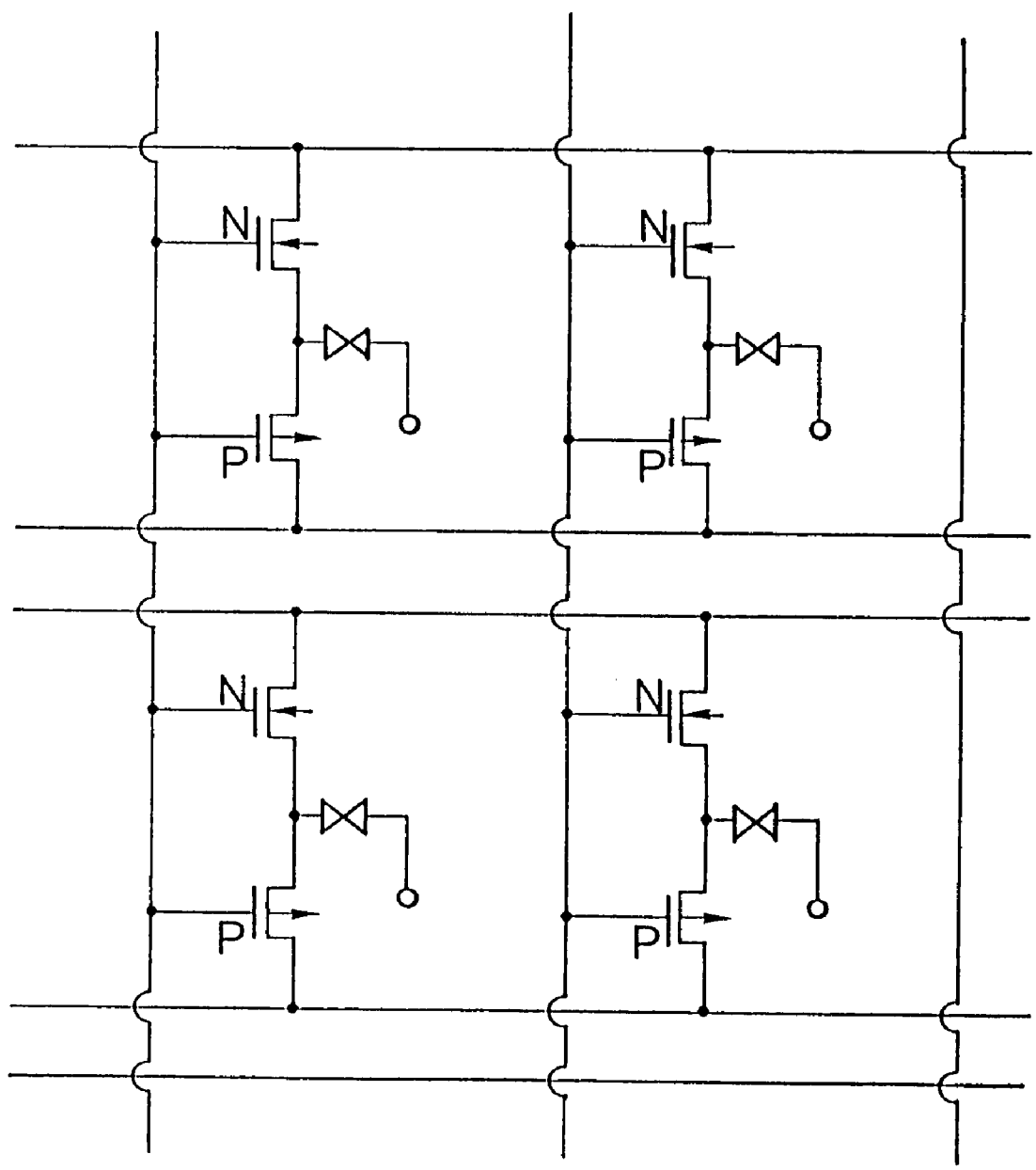
FIG. 31 is an example of the circuit configuration of a liquid crystal display device of the present invention.

This embodiment shows the manufacture of a television set to be hanged on the wall utilizing a liquid crystal display device having the circuit configuration shown in FIG. 31. TFTs utilized therein are made of polycrystalline silicon subjected to laser annealing and in stagger type.

Figures 32A, 32B:
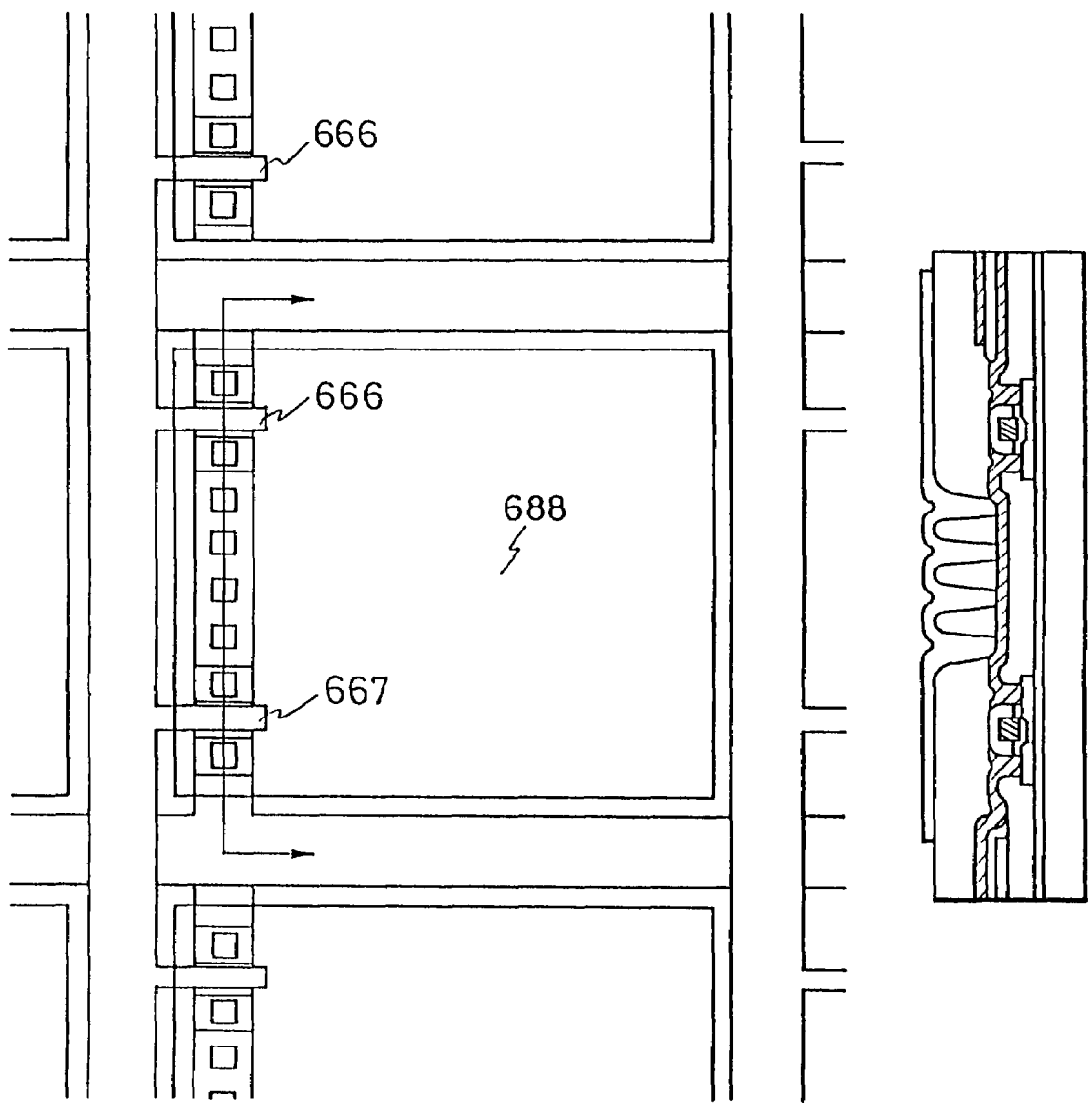
FIG. 32 is a layout of electrodes and the like of another embodiment of the present invention.

FIG. 32 shows the layout of the actual electrodes and the like corresponding to the circuit configuration in FIG. 31.

In order to simplify the explanation, the parts corresponding to a 2×2 (or less) matrix only are shown therein.

Also, the actual driving signal waveform is shown in FIG. 16. For simplicity, the explanation of the signal waveform is also given for the case of 2×2 matrix configuration.

The manufacturing process for a liquid crystal panel utilized in this embodiment is explained with reference to FIG. 33.

Figure 33A:
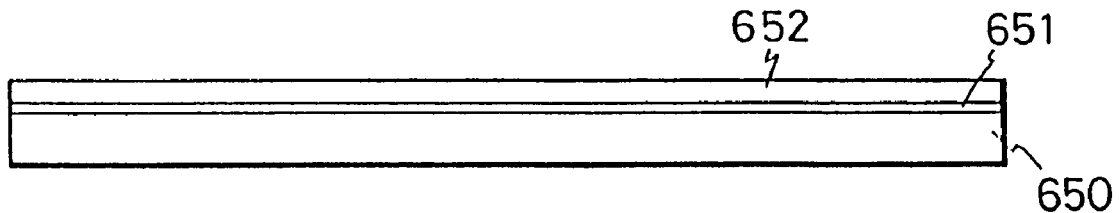
FIGS. 33(A) to 33(H) are cross-sectional views to show the manufacturing process for a liquid crystal panel of one embodiment of the present invention.

In FIG. 33(A), a silicon oxide film for a blocking layer 651 having a thickness of 1000 to 3000 Å was formed on a glass substrate 650, using a magnetron RF (high frequency) sputtering method. The glass substrate 650 was made of inexpensive materials glass capable of withstanding heat treatment up to 700° C., e.g. about 600° C.

The process conditions were the same as those for the silicon oxide film as a blocking layer in Embodiment 7.

On the blocking layer 651, a silicon film 652 in an amorphous state was formed to be 500 to 5000 Å thick, e.g. 1000 Å thick, in the same manner as that for the silicon film in an amorphous state in Embodiment 7.

Figure 33B:
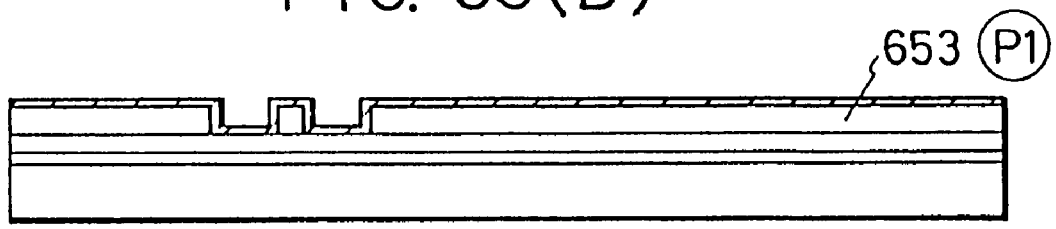

As shown in FIG. 33(B), a photoresist pattern 653 with source and drain regions opened was formed using a mask P1. Then, a silicon film to be an n-type activation layer was formed thereon by plasma CVD method. The film formation temperature was maintained at 250° C. to 350° C., specifically 320° C. in this embodiment. Monosilane (SiH$_4$) and monosilane-based phosphine (PH$_3$) at a concentration of 3% were introduced into a PCVD apparatus at a pressure of 5 Pa and a high frequency electric power at 13.56 MHz was inputted thereto, to thereby form the silicon film. A high frequency electric power of 0.05 to 0.20 W/cm$^2$ was appropriate, and a high frequency electric power of 0.120 W/cm$^2$ was inputted in this embodiment. The specific electric conductivity of the n-type silicon film thus obtained was about 2×10$^{-1}$ Ωcm$^{-1}$. The film thickness was 50 Å.

Figure 33C:
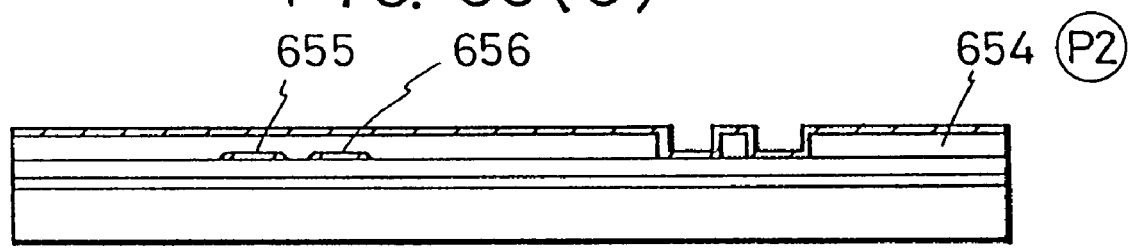
Figure 33D:
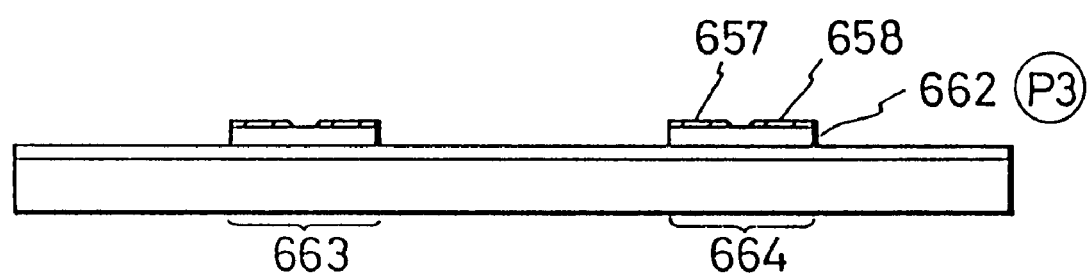

On the other hand, a photoresist pattern 654 with source and drain regions opened was formed using a mask P2, as shown in FIG. 33(C). Then, a silicon film to be a p-type activation layer was formed thereon by plasma CVD method. The film formation temperature was maintained at 250° C. to 350° C., specifically 320° C. in this embodiment. Monosilane (SiH$_4$) and monosilane-based diborane (B$_2$H$_6$) at a concentration of 2% were introduced into a PCVD apparatus at a pressure of 4 Pa and a high frequency electric power at 13.56 MHz was inputted to thereby form the silicon film. A high frequency electric power of 0.05 to 0.20 W/cm$^2$ was appropriate, and a high frequency electric power of 0.080 W/cm$^2$ was inputted in this embodiment. The specific electric conductivity of the p-type silicon film thus obtained was about 1×10$^{-1}$ Ωcm$^{-1}$. The film thickness was 50 Å.

Then, source and drain regions 655, 656 and 657, 658 were formed by lift-off method. After that, an island region 683 for an N-channel type thin film transistor and an island region 664 for a P-channel type thin film transistor were formed using a mask P3 662.

Subsequently, laser annealing to the source, drain, channel regions and laser doping to the activation layers were carried out simultaneously by the use of XeCl excimer laser in the same way as in Embodiment 7. An electron mobility (μe) of 15 to 300 cm$^2$/Vsec and a hole mobility (μe) of 5 to 100 cm$^2$/Vsec can be obtained.

A silicon oxide film of 500 to 2000 Å thickness, e.g. 1000 Å thickness, was then formed as a gate insulating film. This was prepared under the same conditions as the silicon oxide film formed as a blocking layer. A small amount of fluorine may be added to this film for fixation of the sodium ions during film formation.

Figure 33E:
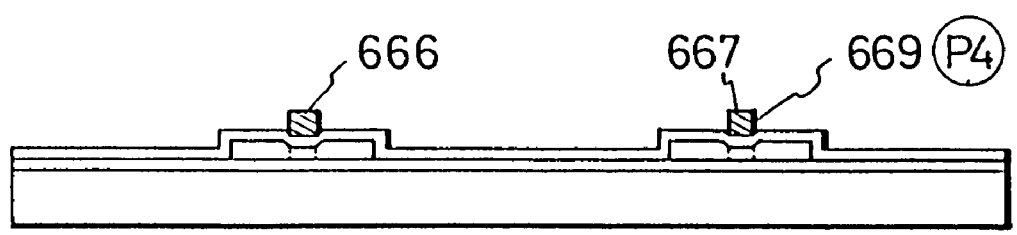

When this operation was completed, a silicon film containing phosphorus at 1 to 5×10$^{21}$ cm$^{-3}$ concentration, or a multilayered film comprising the silicon film laminated thereon with molybdenum (Mo), tungsten (W), MoSi$_2$ or WSi$_2$ film was formed, which was patterned with a fourth photomask 669 to obtain the configuration shown in FIG. 33(E). Gate electrodes 666 and 667 were then formed. For example, for gate electrodes a phosphorus-doped silicon layer 0.2 μm thick was formed and a molybdenum layer 0.3 μm thick was formed thereon with a channel length of 7 μm.

Also, in the case where aluminum is used as the gate electrode material, after patterning with the fourth photomask 669, it is possible to form the source and drain contact holes at positions closer to the gates by anodic oxidation of this surface of the patterned aluminum gate electrode so that self-aligning construction can be applied. Therefore, the TFT characteristics can be further increased by improving the mobility and decreasing the threshold voltage.

The entire manufacturing process for the C/TFT can thus be done without having to apply a temperature above 400° C. This makes it possible to use, as the substrate, materials other than expensive materials such as quartz. Accordingly, this embodiment of the invention is very suitable for a liquid crystal display having a large picture plane.

Figure 33F:
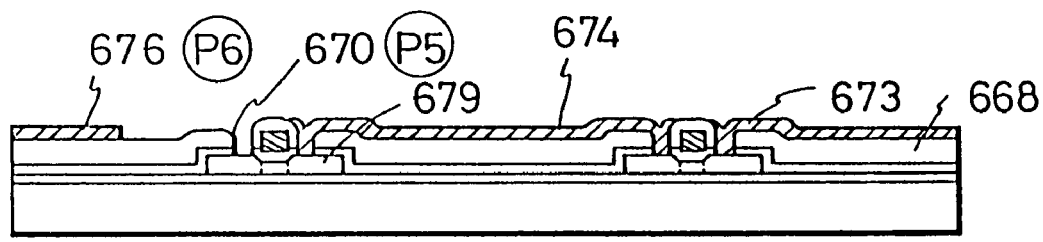
Figure 33G:
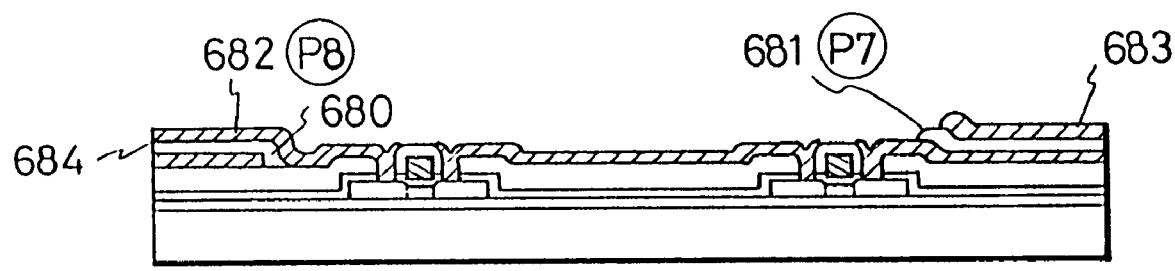
Figure 33H:
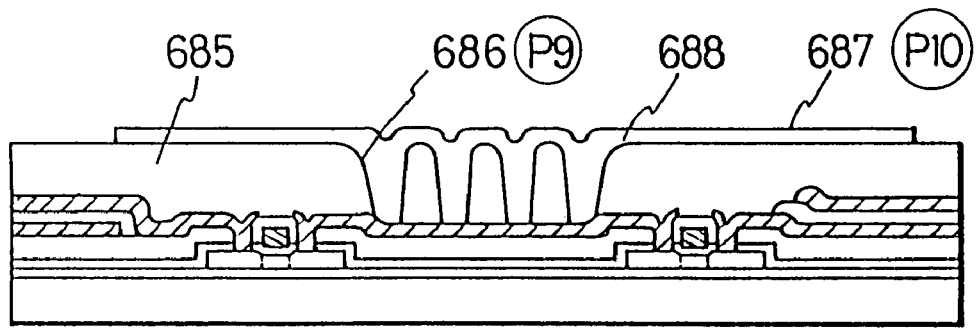

In FIG. 33(F), a silicon oxide film was formed as an interlayer insulator 668 by sputtering method. In place of the sputtering method, LPCVD method, photo CVD method, and normal pressure CVD may be utilized for the formation of the silicon oxide film. The thickness of the layer was 0.2 to 0.6 µm, for example. After that, an opening 679 for electrode was formed using a fifth photomask 670. On the entire surface of this structure, an aluminum film having a thickness of 0.3 µm was formed by sputtering method, and then a lead 674 and a contact 673 were formed using a sixth photomask 676.

A silicon oxide film was again formed as an interlayer insulating layer 680 by the above mentioned sputtering method. Instead of the sputtering method, the LPCVD method, photo CVD method, and normal pressure CVD method may be utilized for forming the silicon oxide film. The silicon oxide film was then patterned using a seventh photomask 681. Then, on the entire surface an aluminum film of 0.3 µm thickness was formed by sputtering. A lead 683 and a contact 684 were then formed using an eighth photomask 682.

An organic resin for surface-flattening 685, e.g. a transparent polyimide resin was then applied on the top surface, and further an opening for electrode was again formed using a ninth photomask 686.

An ITO film of 0.1 µm thickness was formed on the entire surface of this structure by sputtering and was subsequently patterned into pixel electrodes 688 by the use of a tenth photomask 687. This ITO film was formed at room temperature to 150° C. and annealed at 200° C. to 400° C. in an oxygen or an atmosphere.

The electrical characteristics of the thus formed NTFT and PTFT were as follows:

| NTFT | Mobility: | 80 cm$^2$/Vs |
|------|-----------|--------------|
|      | Vth:      | 5.0 V        |
| PTFT | Mobility: | 30 cm$^2$/Vs |
|      | Vth:      | 5.5 V.       |

In accordance with the foregoing method, the first substrate for a liquid crystal electro-optical device was completed.

A second substrate for the liquid crystal electro-optical device was formed in the same manner as in Embodiment 7.

A nematic liquid crystal composition was interposed between the first and second substrates and the periphery of the substrates was sealed with an epoxy adhesive. An driver IC in TAB form and a PCB comprising a common signal wiring and a potential wiring were connected to the lead on the substrate, and a polarizing plate was affixed to the outside whereby a light-transmission type liquid crystal electro-optical device was obtained.

The structure of the electro-optical device obtained in accordance with this embodiment is the same as that in Embodiment 7 and schematically illustrated in FIG. 24.

Figure 34:
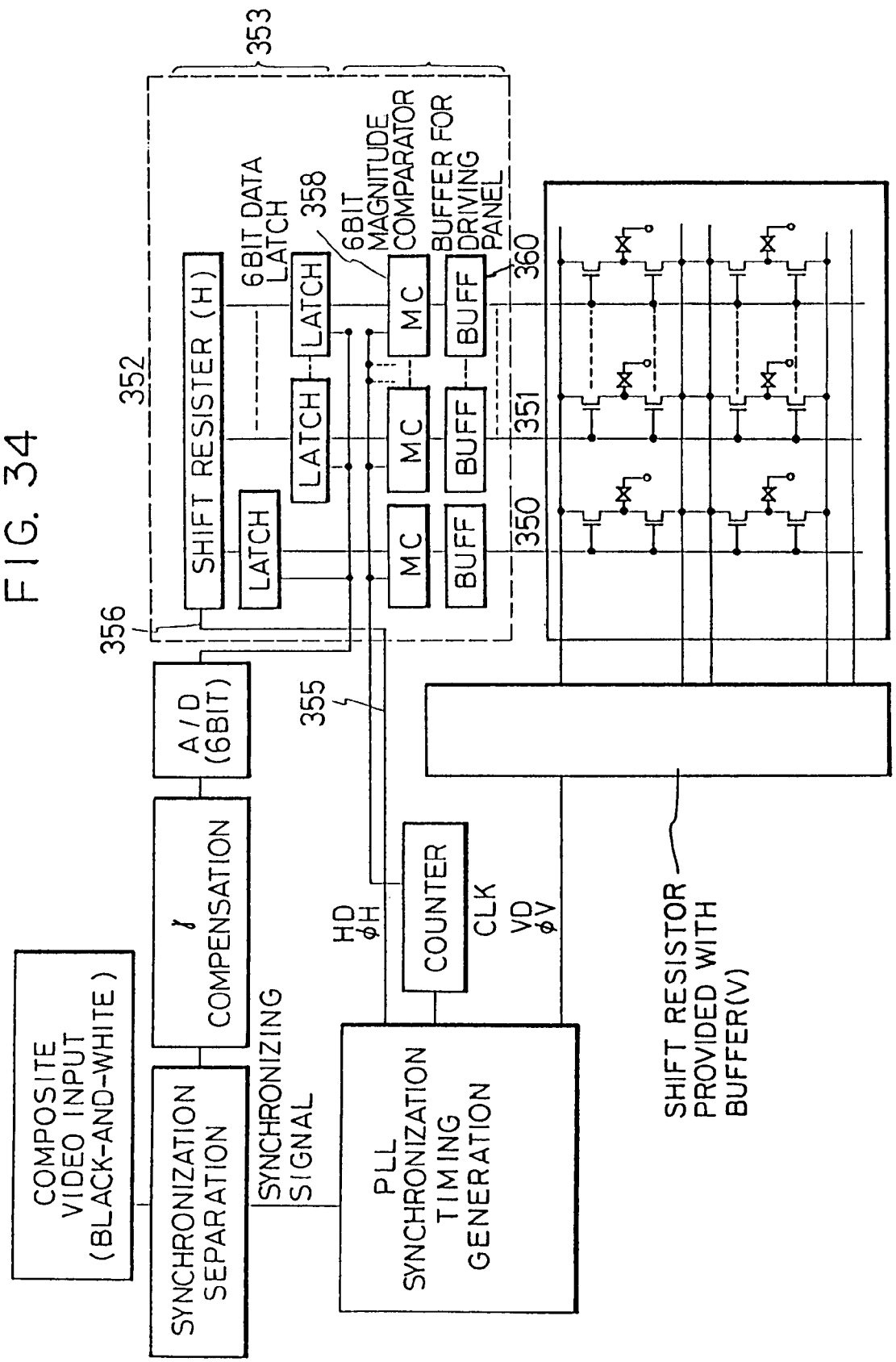
FIG. 34 shows the peripheral circuitry of a liquid crystal electro-optical device of the present invention.
Figure 35A:
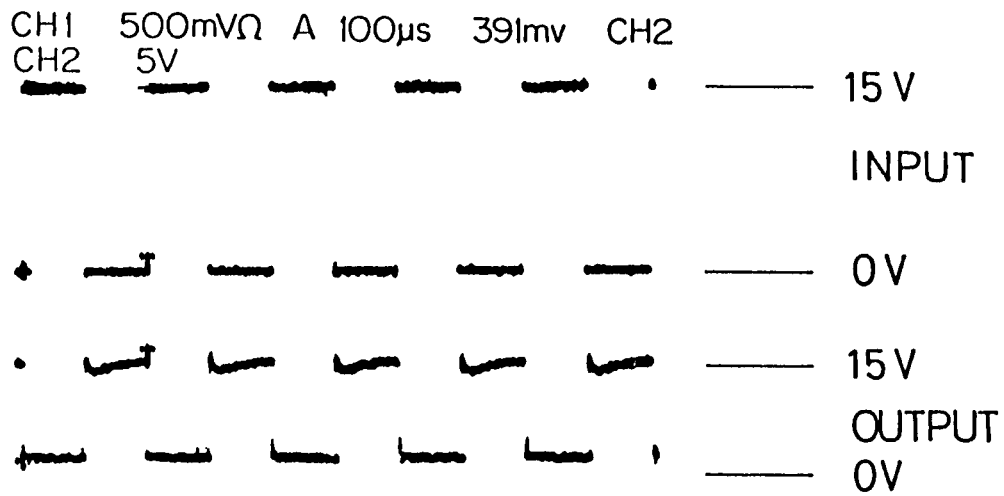
FIGS. 35(A) to 35(D) are graphs showing input signal waveforms inputted to and output signal waveforms outputted from the C/TFT obtained in one embodiment of the present invention.
Figure 35B:
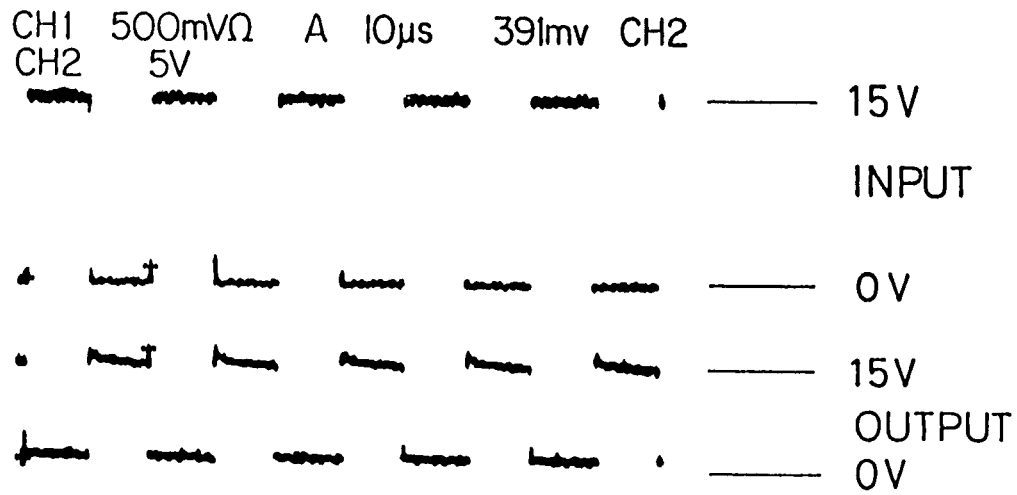
Figure 35C:
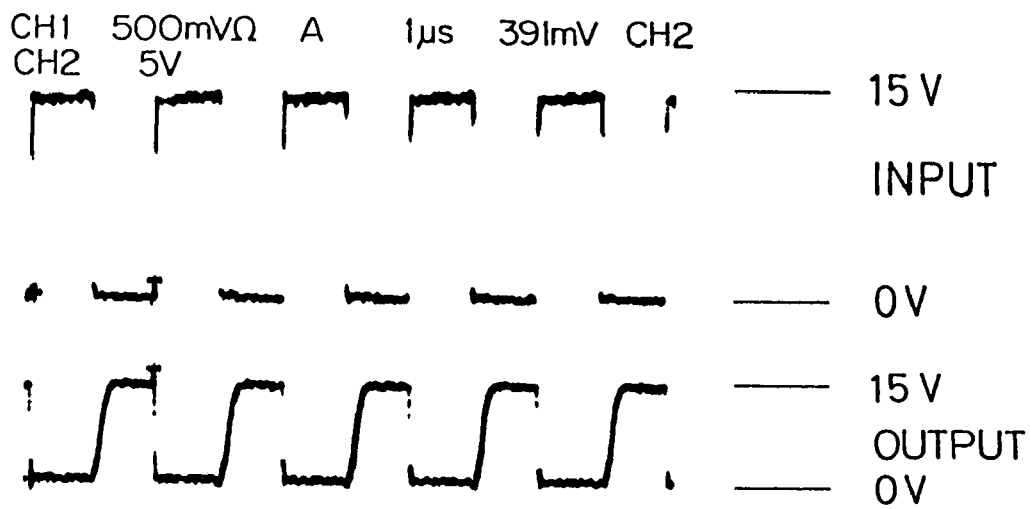
Figure 35D:
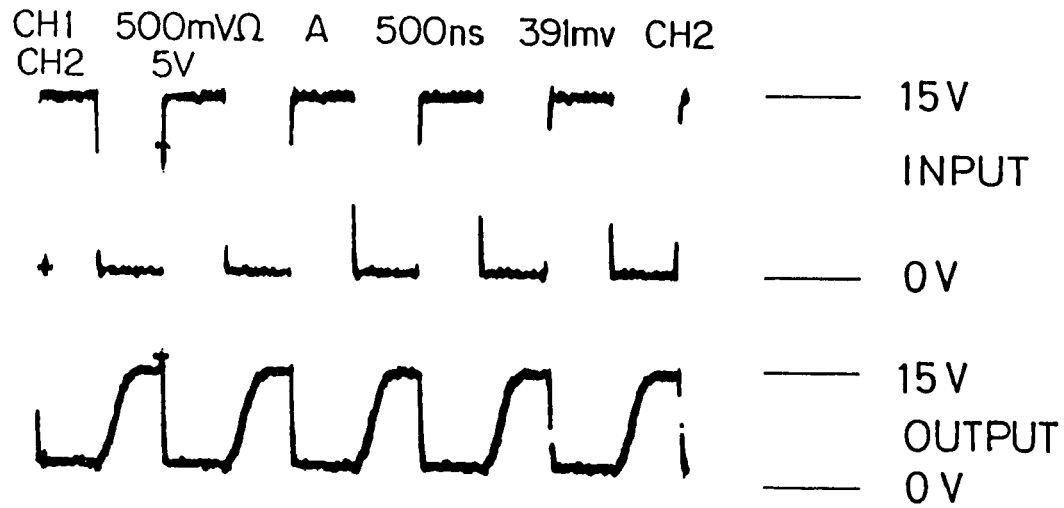

Next, the configuration of a peripheral circuitry of the liquid crystal electro-optical device is described with reference to FIG. 34.

A driver circuit 352 is connected to information signal side wires 350 and 351 which are connected to the matrix circuit of the liquid crystal electro-optical device. The driver circuit 352 is divided into two drive frequency systems. One of them is a data latch circuit system 353 having a drive method same as the conventional method, where the main composition is a basic clock OH 355 for transferring data 356 by turns and 1-12 bits parallel processing is conducted. The other is the system composed in accordance with the present invention, that is, it is composed of a magnitude comparator circuit 358, a buffer 360 for panel drive and a clock CLK 357 for the independent frequency of the data transfer frequency. Pulses are formed by the counter 358 so as to correspond to the gradated display data transmitted from the data latch system 353.

It is exactly this system which the present invention is characterized by. That is, by utilizing two kinds of drive frequency, a clear digital gradated display can be obtained without reducing frame numbers for rewriting a picture. Accordingly, occurrence of flicker and the like due to the reduction of the frame number can be avoided.

FIG. 35 is a photograph of oscilloscope showing input signal waveforms inputted to and output signal waveforms outputted from the C/TFT obtained in this embodiment. In FIGS. 35(A) to (D), drive frequency of input signals is raised as 5 KHz, 50 KHz, 500 KHz, and 1 MHz. As is apparent from FIG. 35(D), even at 1 MHz, output signal waveforms do not become gentle so much and fully useful output signals can be obtained.

The number of gradations of a gradated display can be calculated by dividing the drive frequency by duty number and frame number. In the case of the drive frequency of 1 MHz, a gradated display of 42 gradations (calculated by dividing 1 MHz by 400 and 60) can be obtained.

In the case of an analogue gradated display method, a gradated display of 18 gradations was its limit due to the variations in TFT characteristics. In the case of the digital gradated display method of the present invention, however, since the method is not affected by the variations in TFT characteristics so much, a gradated display of up to 42 gradations is possible. With regard to a color display, a colorful, fine display of 74,088 colors can be obtained.

Embodiment 12

This embodiment shows the manufacture of a video camera viewfinder utilizing a liquid crystal electro-optical device of 1 inch diagonal.

In this embodiment, a first substrate with 387×128 pixel configuration was prepared by the same process as in Embodiment 11. Also, a second substrate was prepared by providing color filters and a transparent conductive film ITO to a thickness of 1000 Å on a substrate made of insulator by the same process as in Embodiment 11.

On the above substrates, a polyimide precursor material was printed by off-set method, and subsequently the substrates were baked at 350° C. for 1 hour in an non-oxidizing atmosphere, e.g. in a nitrogen. Then, the surfaces of the polyimide films were subjected to a know rubbing treatment, whereby the first and second substrate provided with means for orientating liquid crystal molecules in one fixed direction in at least an initial stage were obtained.

A nematic liquid crystal composition was interposed between the above first and second substrates and the periphery of the substrates was sealed with an epoxy adhesive. Since the pitch of the leads on the substrates was as fine as 46 µm, connection was conducted by COG method. In this embodiment, leads were connected to gold bumps provided on an IC chip by means of a silver paradium resin of epoxy system, and then an epoxy transformed-acrylic resin was filled in the space between the IC chip and the substrates for the purpose of fixing and enclosing the IC chip. Then a polarizing plate was affixed to the outside thereof, whereby a light-transmission type liquid crystal display device was obtained.

Since the channel length was 5 µm in the TFT of this embodiment, the drive frequency could be raised up to about 2 MHz. Hence, in accordance with the division of 2 MHz by 128 and 60, 260 gradations, approximately 256 gradations were possible in a gradated display. When carrying out the usual analogue gradated display with a liquid crystal electro-optical device of 50 mm square size (the substrate of which size is obtained by dividing 300 mm square-sized substrate into 36 plates) on which TFTs of 384×128=49,152 were formed, the variation in the amorphous TFT characteristic was about ±10%, so that a gradated display of 16 gradations was its limit. In the case of carrying out the digital gradated display method of the present invention, the method was not affected by the variation in TFT characteristic so much, so that a gradated display of 256 gradations or more was possible. In the case of a color display, a colorful, fine display of 16,777,216 colors was possible.

Embodiment 13

This embodiment describes the manufacture of a projection type image display device as shown in FIG. 27.

In this embodiment, an image projecting part for a projection type image display device was assembled using three liquid crystal electro-optical devices 1300. Each of them had a 640×480 dot matrix, and 307,200 pixels were formed within the size of 4 inch diagonal. The size of one pixel was 127 μm square.

The projection type image display device is composed of three liquid crystal electro-optical devices 1300 for three primary colors of light, i.e. red, green, and blue respectively, a red color filter 1301, a green color filter 1302, a blue color filter 1303, reflection boards 1304, a metal halide light source 1307 of 150 W, and an optical system for focus 1308.

The substrate of the liquid crystal electro-optical device utilized for an electro-optical device of this embodiment was the one having C/TFT configuration and a matrix circuitry. A device comprising high mobility TFTs formed by low temperature process was utilized to compose the projection type liquid crystal electro-optical device.

The manufacturing method for the liquid crystal display device utilized in this embodiment is explained hereinbelow with reference to FIG. 36.

Figure 36A:
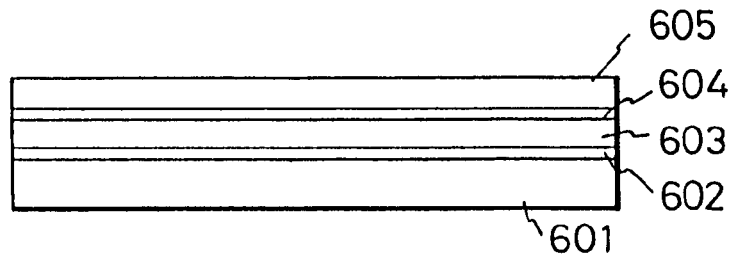
FIGS. 36(A) to 36(G) are cross-sectional views to show the manufacturing process for a liquid crystal display device of one embodiment of the present invention.

In FIG. 36(A), a silicon oxide film of 1000 to 3000 Å thickness was formed as a blocking layer 602 on glass 601 by a magnetron RF (high frequency) sputtering. The glass was the one which was not expensive unlike quartz glass or so and was resistant to thermal treatment at not higher than 700° C., e.g. about 600° C. The process conditions of the film formation were the same as those for the silicon oxide film as a blocking layer in Embodiment 1.

On the silicon oxide film, a silicon film 603 in an amorphous state was formed to be 500 to 5000 Å thick, e.g. 1500 Å thick, in the same manner as the case of the silicon film in an amorphous state in Embodiment 1.

As in Embodiment 1, the silicon film in an amorphous state was then heat-annealed at an intermediate temperature of 450° to 700° C. for 12 to 70 hours in an non-oxide atmosphere.

A silicon oxide film 604 of 500 to 2000 Å thickness, e.g. 1000 Å thickness, was then formed as a gate insulating film. The formation conditions thereof were the same as those for the silicon oxide film as a blocking layer. A small amount of fluorine may be added during the film formation for fixation of sodium ions.

Figure 36B:
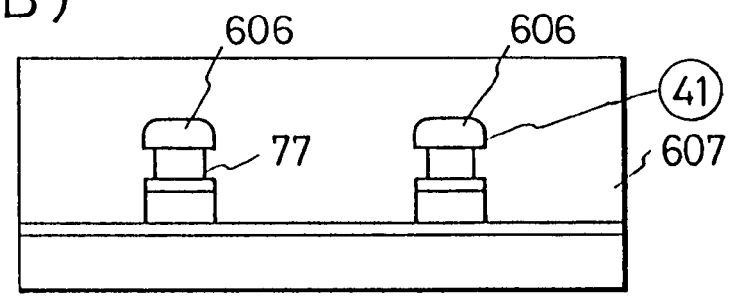
Figure 36C:
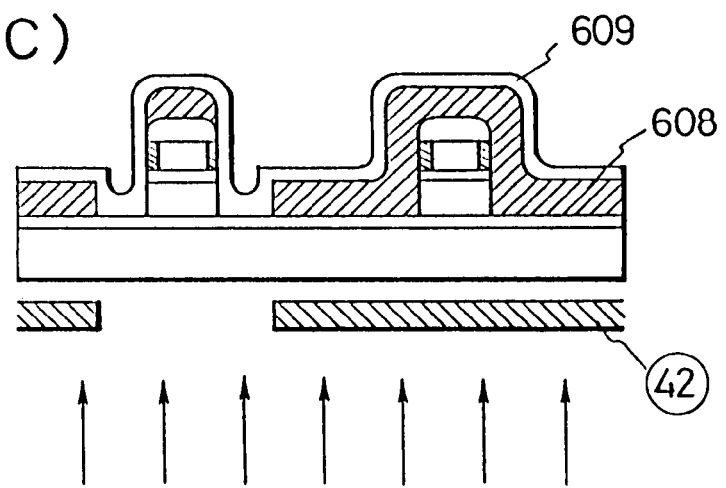
Figure 36D:
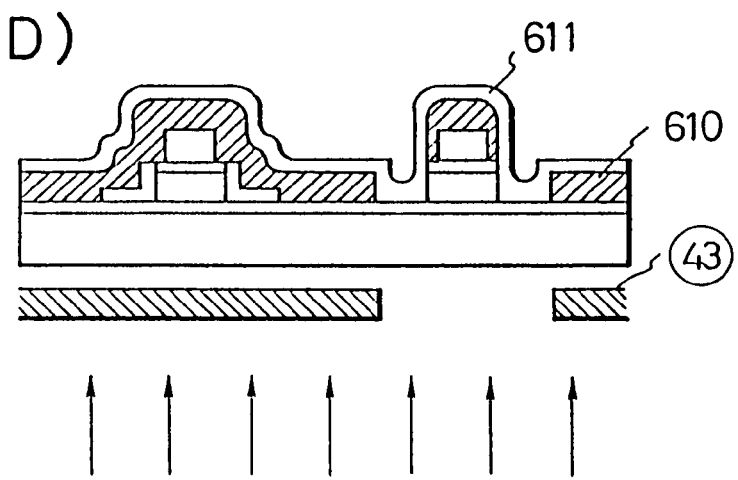

Then, a silicon film containing a 1 to $5 \times 10^{21}$ cm$^{-3}$ concentration of phosphorus, or a multilayered film comprising the silicon film laminated thereon with molybdenum (Mo), tungsten (W), MoSi$_2$ or WSi$_2$ film was formed, which was subsequently patterned with a first photomask 41 as in FIG. 36(B). In this embodiment, a molybdenum film was formed to a thickness of 0.3 μm as a gate electrode with a channel length of 10 μm. In the patterning, the gate electrodes were overetched 77 at about 3 μm. Then, a positive photoresist 607 was applied on the entire surface of the substrate.

After the application, exposure and development were carried out from the rear side of the substrate, using a photomask 42 to thereby obtain a resist 608. Then, an n-type layer was deposited by sputtering. By subsequently removing the resist 608 by lift-off method, the configuration shown in FIG. 36(D) was obtained.

In the same manner, after a positive photoresist was applied on the entire surface of the substrate, exposure and development were carried out from the rear side of the substrate using a photomask 43 to thereby obtain a resist 610. Then a p-type layer was deposited by sputtering. By removing the resist 610 by lift-off method, the configuration shown in FIG. 36(E) was obtained.

The substrate was again heat-annealed at 600° C. for 10 to 50 hours, whereby impurities in sources 612, 614 and drains 613, 615 were activated to be N$^+$ or P$^+$ type. Channel formation regions 618 and 619 of semi-amorphous semiconductor was formed below gate electrodes 616 and 617.

The entire manufacturing process for the C/TFT can thus be done without having to apply a temperature above 700° C. in the self-aligning system. This makes it possible to use materials other than expensive ones such as quartz as the substrate material. Accordingly, this embodiment of the invention is very suitable for a liquid crystal display having a large picture plane.

Figure 36E:
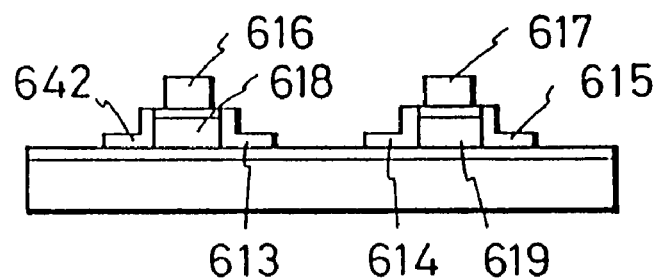

The heat anneal process, shown in FIG. 36(A) and FIG. 36(E), was performed twice. However, the anneal process in FIG. 36(A) can be omitted, depending on the desired characteristics, and followed up with the heat anneal process of FIG. 36(E), shortening the manufacturing time.

Figure 36F:
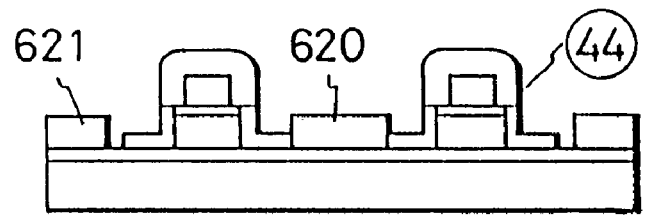
Figure 36G:
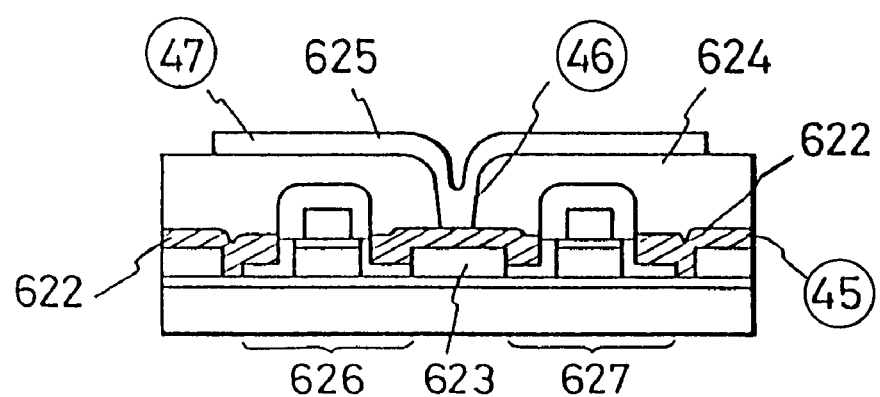

In FIG. 36(F), a silicon oxide film was formed as an inter-layer insulator 620 by the sputtering method mentioned above. This silicon oxide film may be formed by the LPCVD method, photo CVD method, or normal pressure CVD method, instead. The thickness of the insulator was e.g. 0.2 to 0.6 μm. Next, using a photomask 44, openings 621 for the electrodes were formed. Then, a layer of aluminum was formed on the entire structure using the sputtering method, and a lead 622 and a contact 623 were formed using a photomask 45, as shown in FIG. 36(F).

An organic resin film 624 for surface-flattening, e.g. a transparent polyimide resin film was formed, and electrode an opening for an electrode was provided using a photomask 46.

In order to connect the output terminal of the C/TFT to the (transparent) electrode of the pixel of the liquid crystal display device, an ITO film was formed by sputtering.

The electrode 625 was completed by etching through a photomask 47.

This ITO film was formed in the range from room temperature to 150° C. and annealed at 200° C. to 400° C. in oxygen or atmosphere. The NTFT 626, PTFT 627, and the transparent electrode 625 were thus prepared on an identical glass substrate 601.

The electrical characteristics of the TFTs thus obtained are as follows:

| NTFT | Mobility: | 120 cm$^2$/Vs |
|------|-----------|---------------|
|      | Vth:      | 5.0 V         |
| PTFT | Mobility: | 50 cm$^2$/Vs  |
|      | Vth:      | 5.3 V.        |

The substrate 1500 shown in FIG. 29 was obtained by the foregoing process.

A liquid crystal dispersion layer 1501 was formed on the substrate 1500 in the same manner as in Embodiment 9, as shown in FIG. 29. Further an opposed electrode 1502 was formed thereon as in Embodiment 9. Then, a transparent silicon resin of 30 µm thickness was applied on the top surface of the structure by printing method and was baked at 100° C. for 30 min. to thereby obtain a liquid crystal electro-optical device.

The configuration and the function of the driver IC utilized in this embodiment are the same as in Embodiment 11.

When a usual analogue gradated display was carried out with a liquid crystal electro-optical device where 307,200 TFTs in 640×480 dot matrix were formed within 300 mm square, the variation in TFT characteristics was as large as about ±10%, so that a gradated display of up to 16 gradations was its limit. In the case of the TFTs formed in this embodiment, however, since the drive frequency can be increased up to 2.5 MHz, a gradated display of up to 86 gradations is possible, the gradation number being calculated by the following formula:

$$2.5 \text{ MHz}/(480 \times 60) = 86$$

where 2.5 MHz represents the drive frequency, 480 the number of scanning lines, and 60 the number of frames.

With regard to a color display, a colorful, fine display having 262,144 colors can be obtained.

This liquid crystal electro-optical device is applicable not only to a front type projection TV shown in FIG. 27 but also to a rear type projection TV.

Embodiment 14

This embodiment shows the manufacture of an electro-optical device for a portable computer utilizing a liquid crystal dispersion type display device of reflection type as in FIG. 30.

A first substrate 1500 utilized in this embodiment was formed in the same manner as in Embodiment 11.

As shown in FIG. 29, a liquid crystal dispersion layer 1501, a counter electrode 1502 on the layer 1501, and a transparent silicon resin on the electrode 1502 were provided on the substrate 1500 as in Embodiment 10. The silicon resin was subsequently baked at 100° C. for 90 min. to thereby obtain a liquid crystal electro-optical device.

In the present invention, a gradated display is provided using a display drive system with the display timing related to the unit time t for writing-in a picture element and to the time F for writing-in one picture, wherein, by time-sharing the signal during a write-in of time t, without changing the time F, a clear gradated display controlled by digital can be obtained. Compared with the gradated display method using a plurality of frames, a display of high quality is possible without the decrease of display frequency by the digital gradated display method of the present invention.

Instead of a conventional analogue gradated display, the present invention provides a digital gradated display with two kinds of drive frequencies being independent of each other. In the case of utilizing a liquid crystal electro-optical device in 640×400 dot matrix, conventionally it was very difficult to form all the 256,000 TFTs without variations in characteristic, and taking the actual productivity and yields into consideration a gradated display of 16 gradations was its limit. On the other hand, in order to make clear the applied voltage level, a reference voltage value is inputted, instead of an analogue value, as a signal from the controller side in the present invention. By controlling by a digital value the timing to connect the reference signal to TFT, the voltage applied to the TFT is controlled, whereby the variation in TFT characteristics is covered. Hence, a clear digital gradated display is possible in accordance with the present invention.

The use of two kinds of drive frequencies makes it possible to obtain a clear digital gradated display without changing the number of frames for rewriting a picture, whereby the occurrence of flicker and the like due to the decrease of the frame number can be avoided.

What is claimed is:

1. A television set comprising:
    an active matrix type liquid crystal display device comprising a thin film transistor electrically connected to a pixel electrode and a PLL synchronization timing generation circuit; and
    a tuner operationally connected to the active matrix type liquid crystal display device,
    wherein the thin film transistor has a channel region which comprises semi-amorphous silicon, and
    wherein the channel region contains oxygen and a concentration of the oxygen is $5 \times 10^{21}$ cm$^{-3}$ or less.

2. A television set according to claim 1 wherein said television set is to be hanged on a wall.

3. A television set comprising:
    an active matrix type liquid crystal display device comprising a thin film transistor electrically connected to a pixel electrode and a PLL synchronization timing generation circuit;
    a back light device comprising a cathode tube; and
    a tuner operationally connected to the active matrix type liquid crystal display device,
    wherein the thin film transistor has a channel region which comprises semi-amorphous silicon, and
    wherein the channel region contains oxygen and a concentration of the oxygen is $5 \times 10^{21}$ cm$^{-3}$ or less.

4. A television set according to claim 3 wherein said television set is to be hanged on a wall.

5. A television set comprising:
    an active matrix type liquid crystal display device comprising a thin film transistor electrically connected to a pixel electrode and a PLL synchronization timing generation circuit and a comparator circuit; and
    a tuner operationally connected to the active matrix type liquid crystal display device,
    wherein the thin film transistor has a channel region which comprises semi-amorphous silicon, and
    wherein the channel region contains oxygen and a concentration of the oxygen is $5 \times 10^{21}$ cm$^{-3}$ or less.

6. A television set according to claim 5 wherein said television set is to be hanged on a wall.

7. A television set comprising:
    an active matrix type liquid crystal display device comprising a thin film transistor electrically connected to a pixel electrode and a PLL synchronization timing generation circuit and a comparator circuit;
    a back light device comprising a cathode tube; and
    a tuner operationally connected to the active matrix type liquid crystal display device,
    wherein the thin film transistor has a channel region which comprises semi-amorphous silicon, and
    wherein the channel region contains oxygen and a concentration of the oxygen is $5 \times 10^{21}$ cm$^{-3}$ or less.

8. A television set according to claim 7 wherein said television set is to be hanged on a wall.

9. A television set comprising:
   an active matrix type liquid crystal display device comprising a thin film transistor electrically connected to a pixel electrode; and
   a tuner operationally connected to the active matrix type liquid crystal display device,
   wherein the thin film transistor has a channel region which comprises semi-amorphous silicon, and
   wherein the channel region contains oxygen and a concentration of the oxygen is $5\times10^{21}$ cm$^{-3}$ or less.

10. A television set according claim 9 wherein said television set is to be hanged on a wall.

11. A television set comprising:
   an active matrix type liquid crystal display device comprising a thin film transistor electrically connected to a pixel electrode;
   a back light device comprising a cathode tube; and
   a tuner operationally connected to the active matrix type liquid crystal display device,
   wherein the thin film transistor has a channel region which comprises semi-amorphous silicon, and
   wherein the channel region contains oxygen and a concentration of the oxygen is $5\times10^{21}$ cm$^{-3}$ or less.

12. A television set according to claim 11 wherein said television set is to be hanged on a wall.

13. A television set comprising:
   an active matrix type liquid crystal display device comprising a thin film transistor electrically connected to a pixel electrode and a comparator circuit; and
   a tuner operationally connected to the active matrix type liquid crystal display device,
   wherein the thin film transistor has a channel region which comprises semi-amorphous silicon, and
   wherein the channel region contains oxygen and a concentration of the oxygen is $5\times10^{21}$ cm$^{-3}$ or less.

14. A television set according to claim 13 wherein said television set is to be hanged on a wall.

15. A television set comprising:
   an active matrix type liquid crystal display device comprising a thin film transistor electrically connected to a pixel electrode and a comparator circuit;
   a back light device comprising a cathode tube; and
   a tuner operationally connected to the active matrix type liquid crystal display device,
   wherein the thin film transistor has a channel region which comprises semi-amorphous silicon, and
   wherein the channel region contains oxygen and a concentration of the oxygen is $5\times10^{21}$ cm$^{-3}$ or less.

16. A television set according to claim 15 wherein said television set is to be hanged on a wall.

* * * * *

UNITED STATES PATENT AND TRADEMARK OFFICE
CERTIFICATE OF CORRECTION

PATENT NO. : 7,671,827 B2
APPLICATION NO. : 10/844393
DATED : March 2, 2010
INVENTOR(S) : Hiroki et al.

It is certified that error appears in the above-identified patent and that said Letters Patent is hereby corrected as shown below:

At column 3, line 44, "57-0.6 MHz" should be --57.6 MHz--;

At column 14, line 63, "4×10cm$^{-3}$" should be --4×10$^{20}$cm$^{-3}$--;

At column 20, line 16, "frequency; 128 duty," should be --frequency, 128 duty--;

At column 20, line 21, "384×12849,152" should be --384 × 128 = 49,152--;

At column 20, line 22, "about +10%" should be --about ±10%--;

At column 20, line 37, "were-formed" should be --were formed--;

At column 24, line 24, "island region 683" should be --island region 663--.

Signed and Sealed this
Twenty-second Day of February, 2011

David J. Kappos
*Director of the United States Patent and Trademark Office*